United States Patent
Reiherzer et al.

(10) Patent No.: US 9,887,327 B2
(45) Date of Patent: Feb. 6, 2018

(54) LED PACKAGE WITH ENCAPSULANT HAVING CURVED AND PLANAR SURFACES

(71) Applicant: CREE, INC., Durham, NC (US)

(72) Inventors: Jesse Reiherzer, Wake Forest, NC (US); Andrew Signor, Haw River, NC (US); Joseph Gates Clark, Raleigh, NC (US); Michael John Bergmann, Raleigh, NC (US)

(73) Assignee: CREE, INC., Durham, NC (US)

( * ) Notice: Subject to any disclaimer, the term of this patent is extended or adjusted under 35 U.S.C. 154(b) by 131 days.

(21) Appl. No.: 13/957,290

(22) Filed: Aug. 1, 2013

(65) Prior Publication Data

US 2014/0027795 A1    Jan. 30, 2014

Related U.S. Application Data

(63) Continuation-in-part of application No. 13/770,389, filed on Feb. 19, 2013, which is a continuation-in-part (Continued)

(51) Int. Cl.
*H01L 33/00* (2010.01)
*H01L 33/50* (2010.01)
(Continued)

(52) U.S. Cl.
CPC .......... *H01L 33/505* (2013.01); *H01L 33/508* (2013.01); *H01L 33/54* (2013.01);
(Continued)

(58) Field of Classification Search
CPC .......... H01L 33/54; H01L 2924/15313; H01L 33/60; H01L 33/505; H01L 21/00
(Continued)

(56) References Cited

U.S. PATENT DOCUMENTS

| 4,013,916 A | 3/1977 | Brown |
| 4,143,394 A | 3/1979 | Schoberl .............. 257/680 |

(Continued)

FOREIGN PATENT DOCUMENTS

| CN | 1380703 | 11/2002 |
| CN | 1776506 | 5/2006 |

(Continued)

OTHER PUBLICATIONS

Notification of the Third Office Action from Chinese Patent Appl. No. 201210031021.0, dated Jan. 28, 2015.
(Continued)

*Primary Examiner* — Trung Q Dang
*Assistant Examiner* — Frederick B Hargrove
(74) *Attorney, Agent, or Firm* — Koppel, Patrick, Heybl & Philpott

(57) ABSTRACT

LED packages are disclosed that are compact and efficiently emit light, and can comprise encapsulants with curved and planar surfaces. The packages can comprise a submount with a one or a plurality of LEDs, and in those with a plurality of LEDs each of the LEDs can emit the same or different wavelengths of light than the others. A blanket conversion material layer can be included on at least some of the LEDs and the submount. The encapsulant can be on the submount, over at least some of the LEDs, with each of the planar surfaces being vertical and aligned with one of the edges of the submount. The encapsulant can also have a upper curved surface with a relatively large radius of curvature, with the combination of curved and planar surfaces resulting in efficient emission of light with a relatively narrow emission profile.

43 Claims, 43 Drawing Sheets

Related U.S. Application Data of application No. 13/649,067, filed on Oct. 10, 2012, and a continuation-in-part of application No. 13/649,052, filed on Oct. 10, 2012, now Pat. No. 9,048,396.

(60) Provisional application No. 61/658,271, filed on Jun. 11, 2012, provisional application No. 61/660,231, filed on Jun. 15, 2012, provisional application No. 61/696,205, filed on Sep. 2, 2012, provisional application No. 61/658,271, filed on Jun. 11, 2012, provisional application No. 61/660,231, filed on Jun. 15, 2012, provisional application No. 61/696,205, filed on Sep. 2, 2012.

(51) Int. Cl.

| | | |
|---|---|---|
| *H01L 33/58* | (2010.01) | |
| *H01L 33/54* | (2010.01) | |
| H01L 25/075 | (2006.01) | |
| H01L 33/48 | (2010.01) | |

(52) U.S. Cl.
CPC .......... *H01L 33/58* (2013.01); *H01L 25/0753* (2013.01); *H01L 33/486* (2013.01); *H01L 2224/48091* (2013.01); *H01L 2224/48247* (2013.01)

(58) Field of Classification Search
USPC .................................................. 257/79–103
See application file for complete search history.

(56) References Cited

U.S. PATENT DOCUMENTS

| | | | |
|---|---|---|---|
| 6,350,041 B1 | 2/2002 | Tarsa et al. | |
| 6,521,915 B2 | 2/2003 | Odaki et al. | 257/98 |
| 6,686,676 B2 | 2/2004 | McNulty et al. | 313/112 |
| 7,009,343 B2 | 3/2006 | Lim et al. | 315/150 |
| 7,213,940 B1 | 5/2007 | Van de Ven et al. | |
| 7,253,448 B2 | 8/2007 | Roberts et al. | |
| 7,614,759 B2 | 11/2009 | Negley | |
| 7,722,220 B2 | 5/2010 | Van de Ven | |
| 7,762,692 B2 | 7/2010 | Lai et al. | |
| D646,235 S * | 10/2011 | Kuwaharada | D13/180 |
| D650,342 S * | 12/2011 | Kuwaharada et al. | D13/180 |
| 8,450,147 B2 | 5/2013 | Chandra | 438/106 |
| 2002/0163302 A1 | 11/2002 | Nitta et al. | |
| 2003/0008431 A1 | 1/2003 | Matsubara et al. | |
| 2004/0130880 A1 | 7/2004 | Min et al. | |
| 2004/0217364 A1 * | 11/2004 | Tarsa et al. | 257/89 |
| 2004/0218390 A1 | 11/2004 | Holman | 362/245 |
| 2004/0227149 A1 * | 11/2004 | Ibbetson et al. | 257/100 |
| 2005/0073840 A1 | 4/2005 | Chou et al. | |
| 2005/0093005 A1 | 5/2005 | Ruhnau et al. | 257/79 |
| 2005/0173708 A1 | 8/2005 | Suehiro et al. | |
| 2006/0049421 A1 | 3/2006 | Suehiro et al. | |
| 2006/0060882 A1 | 3/2006 | Ohe et al. | |
| 2006/0097245 A1 | 5/2006 | Aanegola et al. | 257/26 |
| 2006/0097385 A1 | 5/2006 | Negley | 257/722 |
| 2006/0124946 A1 | 6/2006 | Fujita | |
| 2006/0138437 A1 * | 6/2006 | Huang | G02B 3/04 257/98 |
| 2006/0186431 A1 * | 8/2006 | Miki | H01L 33/505 257/100 |
| 2006/0273337 A1 | 12/2006 | Han et al. | |
| 2006/0278886 A1 | 12/2006 | Tomoda et al. | |
| 2007/0029569 A1 | 2/2007 | Andrews | 257/99 |
| 2007/0096131 A1 | 5/2007 | Chandra | 257/99 |
| 2007/0102721 A1 | 5/2007 | DenBaars | |
| 2007/0108463 A1 | 5/2007 | Chua et al. | |
| 2007/0145397 A1 | 6/2007 | DenBaars | |
| 2007/0152231 A1 * | 7/2007 | Destain | H01L 33/58 257/99 |
| 2007/0201225 A1 * | 8/2007 | Holder et al. | 362/227 |
| 2007/0262339 A1 | 11/2007 | Hussell | 257/99 |
| 2007/0284589 A1 | 12/2007 | Ng | 257/79 |
| 2008/0006839 A1 | 1/2008 | Lin | 257/98 |
| 2008/0012036 A1 | 1/2008 | Loh | 257/99 |
| 2009/0050907 A1 * | 2/2009 | Yuan | H05B 33/0821 257/88 |
| 2009/0057699 A1 | 3/2009 | Basin | |
| 2009/0091045 A1 | 4/2009 | Tanikawa et al. | 257/791 |
| 2009/0262515 A1 * | 10/2009 | Lee et al. | 362/84 |
| 2009/0272995 A1 | 11/2009 | Ito et al. | |
| 2009/0278147 A1 | 11/2009 | Suzuki | |
| 2010/0121331 A1 | 5/2010 | Sharp et al. | 257/98 |
| 2010/0128191 A1 | 5/2010 | Park et al. | 257/88 |
| 2010/0140633 A1 | 6/2010 | Emerson | |
| 2010/0140634 A1 | 6/2010 | Van de Ven | 257/88 |
| 2010/0155763 A1 | 6/2010 | Donofrio et al. | |
| 2010/0252851 A1 | 10/2010 | Emerson | |
| 2010/0276712 A1 | 11/2010 | Shaikevitch | 257/98 |
| 2010/0291374 A1 | 11/2010 | Akarsu | 428/328 |
| 2011/0001151 A1 | 1/2011 | Le Toquin | 257/98 |
| 2011/0001161 A1 | 1/2011 | Park | |
| 2011/0031527 A1 | 2/2011 | Kotani et al. | |
| 2011/0140289 A1 | 6/2011 | Shiobara et al. | 257/789 |
| 2011/0156061 A1 | 6/2011 | Wang et al. | |
| 2011/0215345 A1 | 9/2011 | Tarsa et al. | 257/88 |
| 2011/0220920 A1 * | 9/2011 | Collins et al. | 257/88 |
| 2011/0221330 A1 | 9/2011 | Negley et al. | |
| 2011/0228514 A1 | 9/2011 | Tong et al. | 362/84 |
| 2011/0279054 A1 | 11/2011 | Katona | 315/291 |
| 2011/0291131 A1 | 12/2011 | Ito | |
| 2011/0316006 A1 | 12/2011 | Xu | |
| 2012/0043563 A1 | 2/2012 | Ibbetson | 257/88 |
| 2012/0061703 A1 | 3/2012 | Kobayashi | |
| 2012/0062821 A1 | 3/2012 | Takeuchi et al. | |
| 2012/0068198 A1 | 3/2012 | Andrews et al. | 257/88 |
| 2012/0087124 A1 | 4/2012 | Ravillisetty | 362/235 |
| 2012/0112220 A1 | 5/2012 | West | |
| 2012/0119234 A1 | 5/2012 | Shioi | |
| 2012/0193651 A1 | 8/2012 | Edmond et al. | 257/88 |
| 2012/0193662 A1 | 8/2012 | Donofrio | 257/98 |
| 2012/0248483 A1 | 10/2012 | Beppu | 257/98 |
| 2013/0020600 A1 | 1/2013 | Yoo | 257/98 |
| 2013/0105835 A1 | 5/2013 | Wu | |
| 2013/0140580 A1 | 6/2013 | Wirth | 257/76 |
| 2013/0300285 A1 | 11/2013 | Ito | |
| 2013/0334559 A1 | 12/2013 | Vdovin et al. | 257/98 |
| 2014/0027795 A1 | 1/2014 | Reiherzer | 257/88 |

FOREIGN PATENT DOCUMENTS

| | | |
|---|---|---|
| CN | 1802756 | 7/2006 |
| EP | 0441622 A1 | 2/1991 |
| EP | 1529807 A2 | 5/2005 |
| EP | 2042528 A1 | 9/2007 |
| EP | 2113949 A2 | 11/2009 |
| EP | 2196501 A1 | 12/2009 |
| EP | 2149920 A1 | 3/2010 |
| EP | 2336230 A1 | 6/2011 |
| JP | 2001301230 | 10/2001 |
| JP | 2006165029 | 6/2006 |
| KR | 100809658 | 3/2008 |
| WO | 2006060141 A2 | 6/2006 |
| WO | WO 2006059828 | 6/2006 |
| WO | WO 061650 A1 | 5/2011 |
| WO | WO 2012016850 A1 | 2/2012 |
| WO | WO 2012/091971 A1 | 7/2012 |
| WO | WO 2012120434 | 9/2012 |
| WO | WO 2012099145 A1 | 6/2014 |

OTHER PUBLICATIONS

Correction of Deficiencies notice from European Patent Appl. No. 13730742.7-1551, dated Feb. 3, 2015.
Office Action from German Patent Appl. No. 10 2007 040 811.2, dated Feb. 12, 2015.
Office Action from U.S. Appl. No. 13/051,894, dated Dec. 12, 2014.
U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.

(56) References Cited

OTHER PUBLICATIONS

U.S. Appl. No. 12/463,709, filed May 11, 2009, Donofrio.
U.S. Appl. No. 13/034,501, filed Feb. 24, 2011, Le, et al.
U.S. Appl. No. 13/028,946, filed Feb. 16, 2011, Le, et al.
U.S. Appl. No. 13/368,217, filed Feb. 7, 2012, Pickard, et al.
U.S. Appl. No. 12/873,303, filed Aug. 31, 2010, Edmond, et al.
Cree® family of LED chips, DA, EZ, GaN, MB, RT, TR, UT, and XT. printout from cree.com, 2 pages.
Bergquist Co., Chanhassen, Minn., "T-Clad" overview product sheet. 3 pages.
Cree® XLampC family product info printout, from cree.com. 20 pages.
Cree® XLampXM product info printout, from cree.com. 13 pages.
Cree® XLampMC product info printout, from cree.com, 14 pges.
Citizen Micro HumanTech, "COB-High-wattage Series & Low-wattage Series", Short Form Lighting LED Catalog 2012, Citizen Electronics Co., Ltd. Japan, 7 pages.
International Search Report for PCT Patent Application No. PCT/US2012/028327, dated Nov. 23, 2012.
U.S. Appl. No. 12/475,261, filed May 2009, Negley, et al.
U.S. Appl. No. 13/770,389, filed Feb. 2013, Lowes, et al.
U.S. Appl. No. 13/804,309, filed Mar. 2013, Castillo, et al.
U.S. Appl. No. 12/002,429, filed Dec. 2007, Loh, et al.
U.S. Appl. No. 13/345,215, filed Jan. 2012, Lu, et al.
U.S. Appl. No. 11/818,818, filed Jun. 2007, Chakraborty, et al.
U.S. Appl. No. 11/895,573, filed Aug. 2007, Chakraborty, et al.
U.S. Appl. No. 12/498,253, filed Jul. 2009, Le Toquin, et al.
U.S. Appl. No. 13/544,662, filed Jul. 2012, Tarsa, et al.
U.S. Appl. No. 13/842,307, filed Mar. 2013, Ibbetson, et al.
U.S. Appl. No. 13/306,589, filed Nov. 2011, Tarsa, et al.
U.S. Appl. No. 13/219,486, filed Aug. 2011, Ibbetson, et al.
Office Action from U.S. Appl. No. 13/040,088, dated May 7, 2013.
Response to OA from U.S. Appl. No. 13/040,088, filed Jun. 20, 2013.
Office Action from U.S. Appl. No. 13/051,894, dated Jan. 14, 2013.
Response to OA from U.S. Appl. No. 13/051,894, filed May 6, 2013.
International Search Report from PCT/US2013/044277, dated Jan. 7, 2014.
First Office Action from Chinese Patent Appl. No. 201210031021.0, dated Dec. 30, 2013.
Office Action from U.S. Appl. No. 13/051,894, dated Aug. 19, 2013.
Response to OA from U.S. Appl. No. 13/051,894, filed Oct. 21, 2013.
Defn. composite. Online Oxford Dictionary. <http://oxforddictionaries.com/us/definition/american_english/composite?q=composite>.
Office Action from U.S. Appl. No. 13/040,086, dated Sep. 13, 2013.
International Preliminary Report on Patentability from PCT/US2012/028327, dated Oct. 3, 2013.
International Preliminary Report on Patentability from Appl. No. PCT/US2013/062640, dated Apr. 23, 2015.
Office Action from U.S. Appl. No. 13/649,067, dated Feb. 16, 2015.
Office Action from U.S. Appl. No. 13/770,389, dated Mar. 12, 2015.
Second Office Action from Chinese Patent Appl. No. 201210031021.0, dated Jun. 4, 2014.
International Search Report and Written Opinion from PCT/US2013/062640, dated May 22, 2014.
Office Action from U.S. Appl. No. 13/051,894, dated Jun. 18, 2014.
Office Action from U.S. Appl. No. 13/649,067, dated Jul. 7, 2014.
Office Action from U.S. Appl. No. 13/649,352, dated Jul. 24, 2014.
International Search Report and Written Opinion from Appl. No. PCT/US2014/045888, dated Sep. 19, 2014.
Notice of Acceptance for Invalidation from Chinese Appl. No. 200710148327.3. dated Jan. 27, 2015 and Chinese version.
International Preliminary Report and Written Opinion from Appl. No. PCT/US2013/044277, dated Dec. 24, 2014.
Office Action from U.S. Appl. No. 14/183,218, dated Aug. 10, 2015.
Office Action from U.S. Appl. No. 13/051,894, dated Sep. 21, 2015.
Office Action from U.S. Appl. No. 13/902,080, dated Sep. 24, 2015.
Office Action from U.S. Appl. No. 13/649,067, dated Oct. 1, 2015.
Office Action from U.S. Appl. No. 13/773,389, dated Oct. 26, 2015.
Office Action from U.S. Appl. No. 13/051,894, dated Mar. 1, 2016.
Office Action from U.S. Appl. No. 13/770,389, dated Mar. 23, 2016.
Office Action from U.S. Appl. No. 14/183,218, dated Mar. 24, 2016.
Office Action from U.S. Appl. No. 13/649,067; dated Apr. 14, 2016.
Notification of Entry into European Phase for Appl. No. 14742722.3; dated Mar. 18, 2016.
Notice of Allowance letter from Chinese Patent Appl. No. ZL201210031021.0, dated Jan. 5, 2016.
Fourth Office Action from Chinese Patent Appl. No. 201210031021.0, dated Jul. 16, 2015.
Decision to Grant from German Patent Appl. No. 10 2007 040 811.2, dated Jul. 3, 2015.
Office Action from U.S. Appl. No. 13/902,080, dated Jun. 2, 2015.
Office Action from U.S. Appl. No. 13/770,389, dated Jul. 1, 2015.
Foreign Office Action for European Patent Appl. No. 13730742.7: dated Oct. 14, 2016.
Office Action for U.S. Appl. No. 14/633,734: dated Nov. 3, 2016.
Foreign Office Action for Taiwan Application No. 04489/10521496400: dated Dec. 5, 2016.
Office Action for U.S. Appl. No. 13/649,067: dated Dec. 15, 2016.
Foreign Office Action for European Application No. 14742722.3: dated Nov. 3, 2016.
Office Action from U.S. Appl. No. 13/770,389, dated Sep. 15, 2014.
Office Action for U.S. Appl. No. 14/575,805; dated Jul. 21, 2016.
Office Action for U.S. Appl. No. 13/902,080; dated Aug. 12, 2016.
Office Action for U.S. Appl. No. 13/770,389; dated Aug. 17, 2016.
Office Action for U.S. Appl. No. 14/183,218; dated Sep. 6, 2016.
Office Action for U.S. Appl. No. 14/575,805; dated Feb. 27, 2017.
Office Action for U.S. Appl. No. 13/770,389; dated Mar. 9, 2017.
Office Action for U.S. Appl. No. 13/051,894; dated Mar. 23, 2017.
Office Action for U.S. Appl. No. 14/183,218; dated Apr. 5, 2017.
Foreign Notice of Allowance for Taiwan Application No. 102120670; dated May 1, 2017.
Chinese Office Action for Application No. 201380030664.6; dated Jul. 17, 2017.
Chinese Office Action for Application No. 201380030664.6; dated Jul. 26, 2017.
Office Action for U.S. Appl. No. 14/575,805; dated Aug. 28, 2017.
Office Action for U.S. Appl. No. 14/183,218; dated Sep. 11, 2017.
Office Action for U.S. Appl. No. 14/633,734; dated Sep. 20, 2017.
Office Action for U.S. Appl. No. 13/770,389; dated Sep. 22, 2017.
Office Action for U.S. Appl. No. 13/051,894; dated Sep. 29, 2017.
Office Action for U.S. Appl. No. 13/902,080; dated Oct. 31, 2017.

* cited by examiner

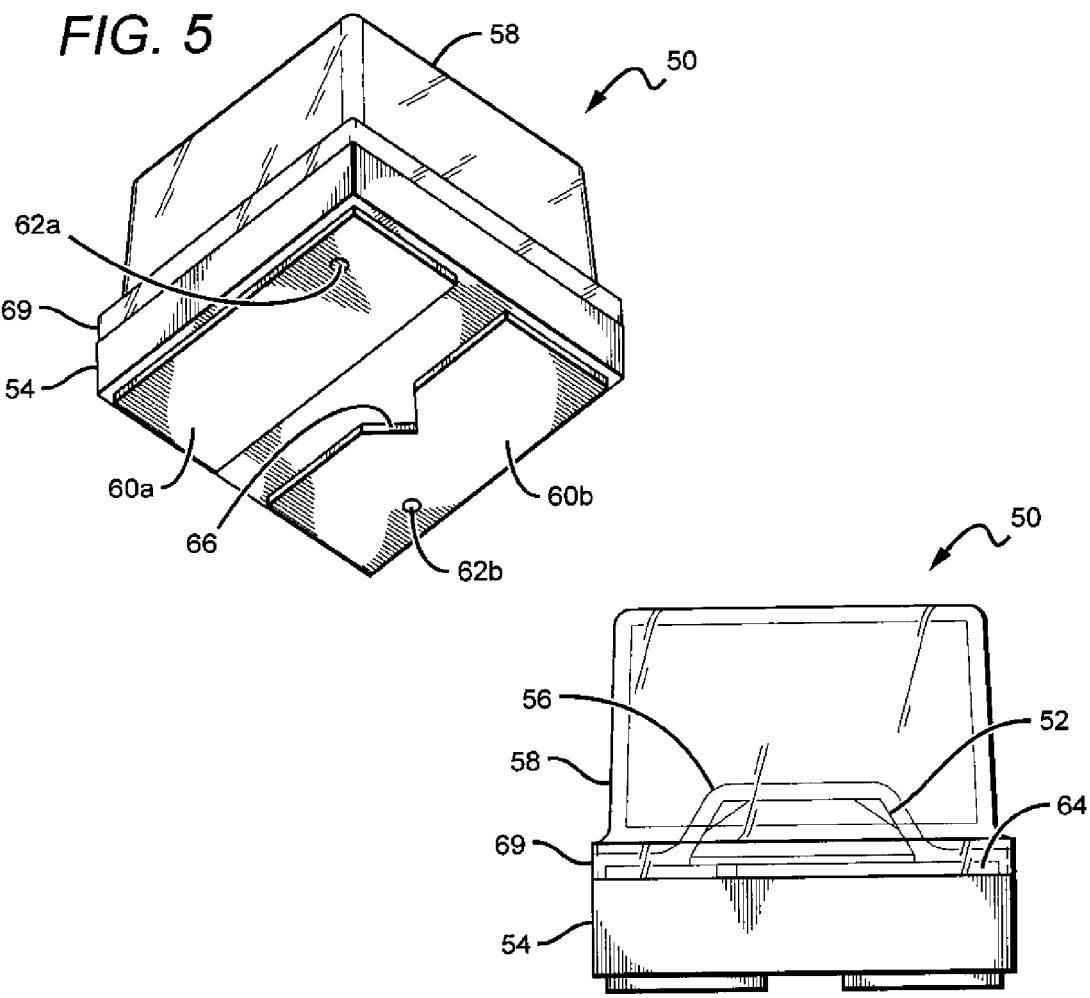
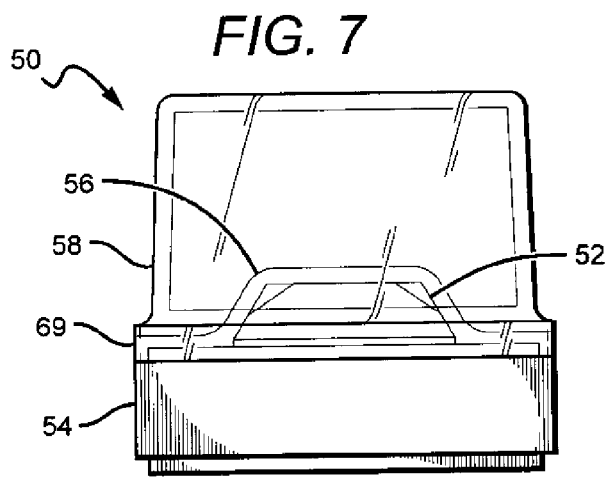

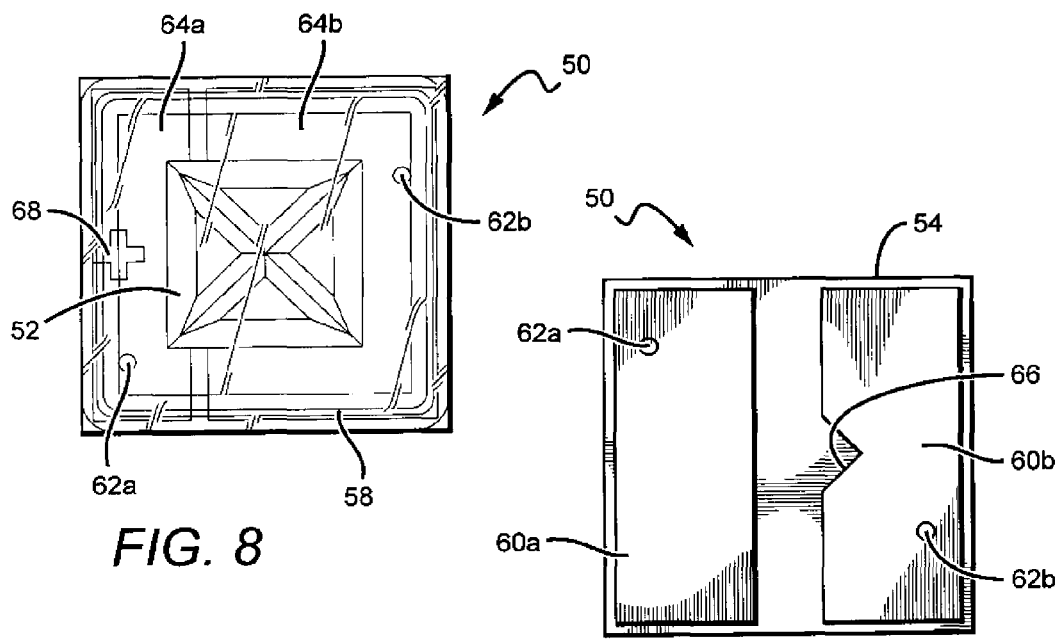
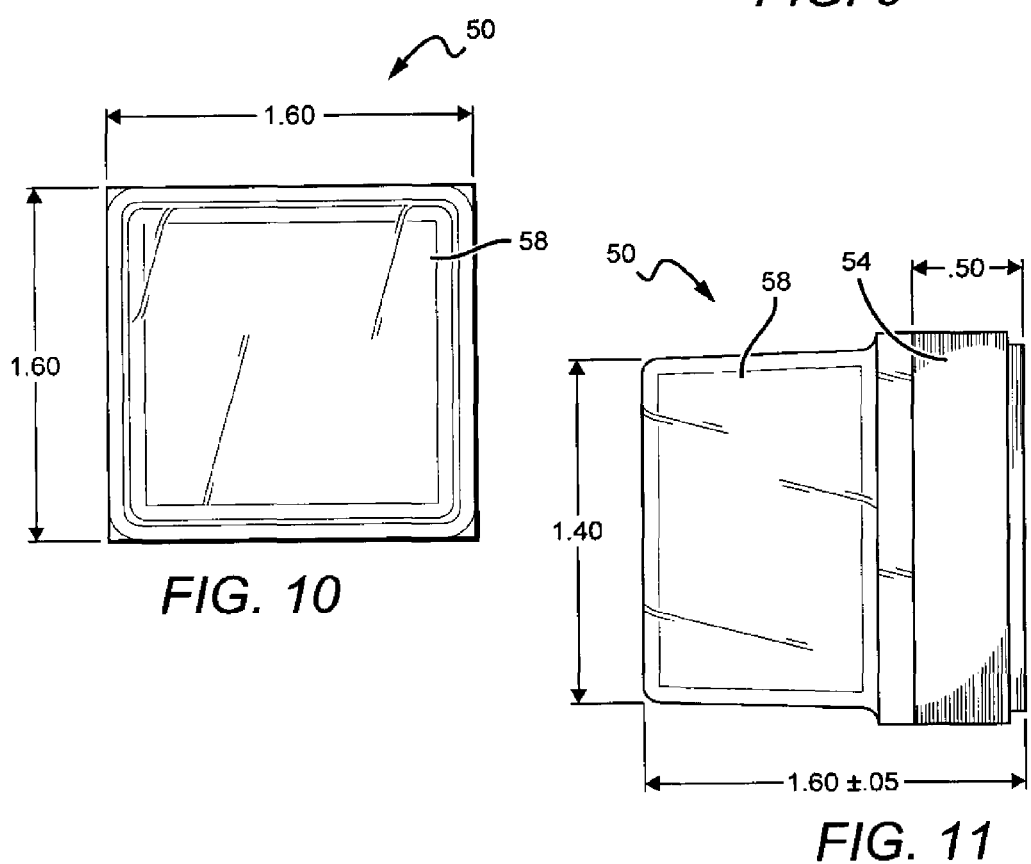

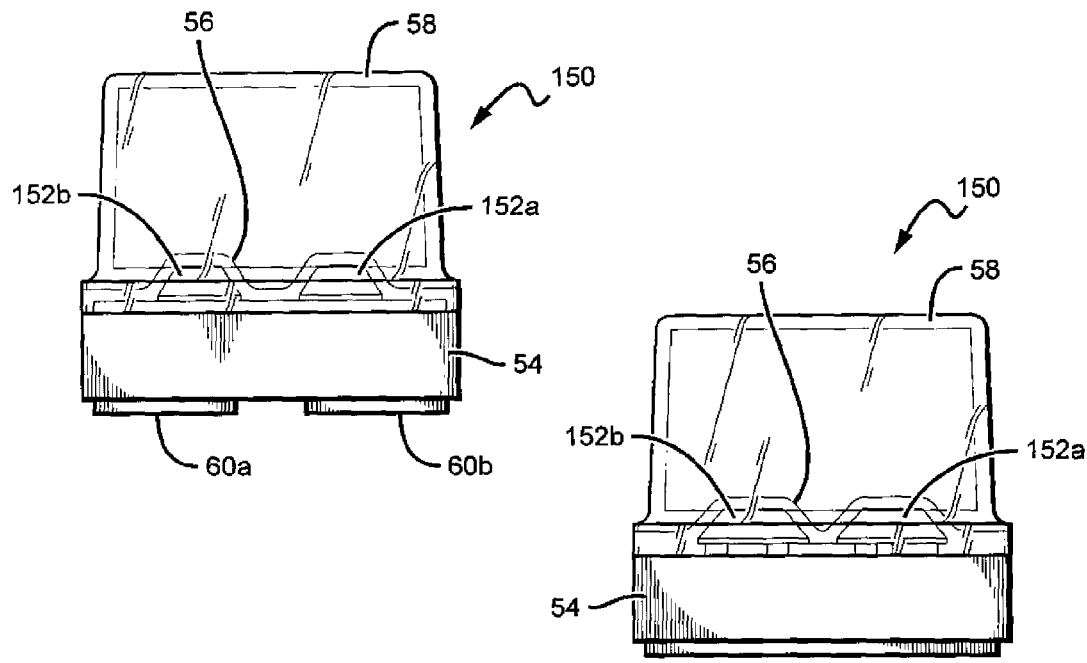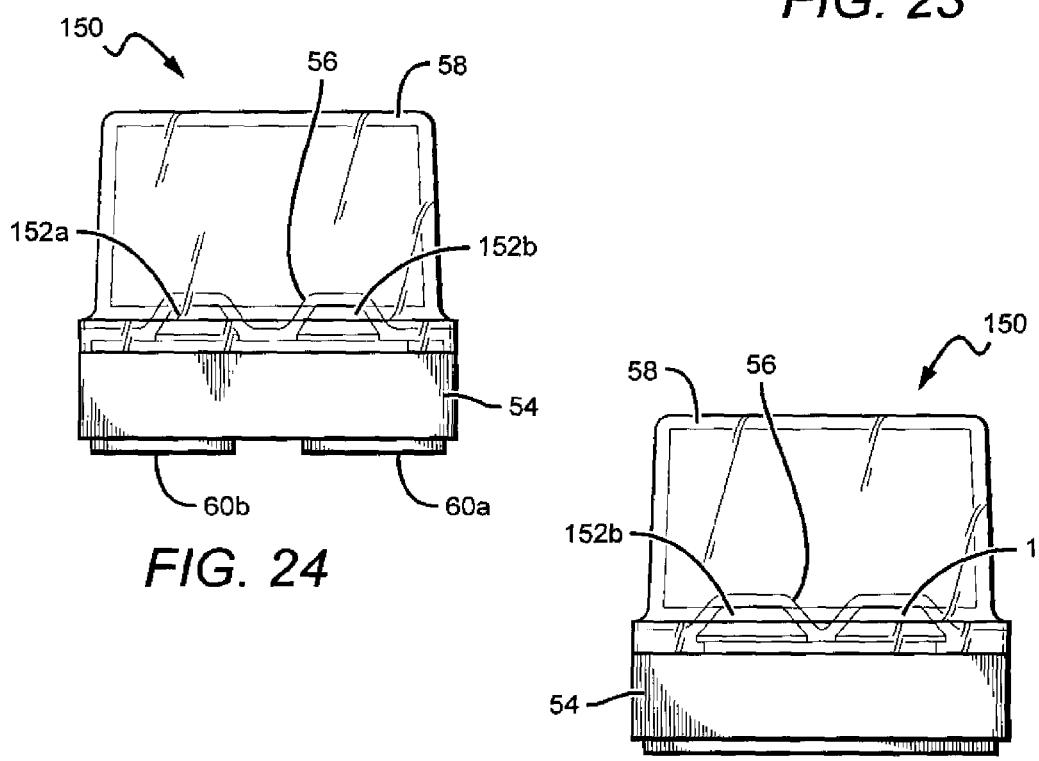

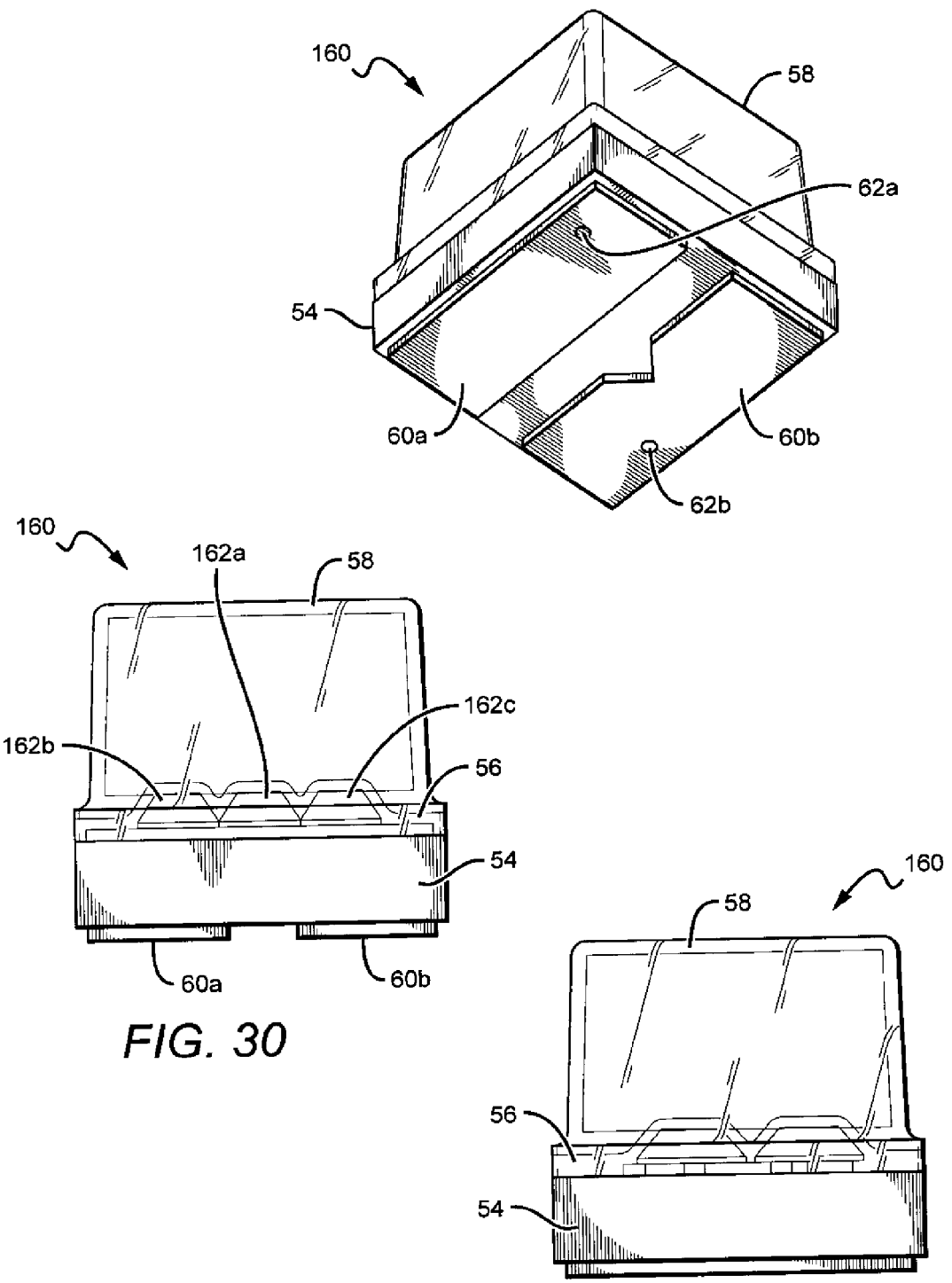

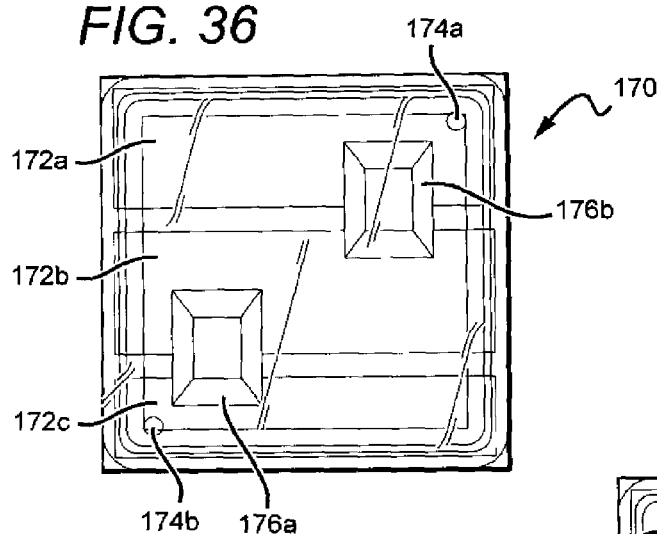
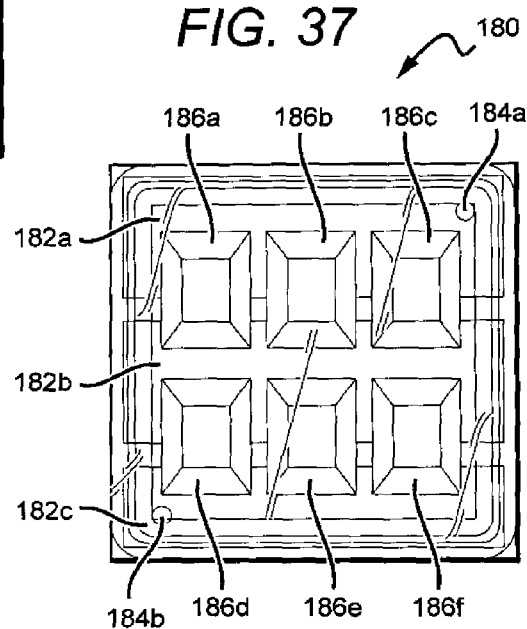
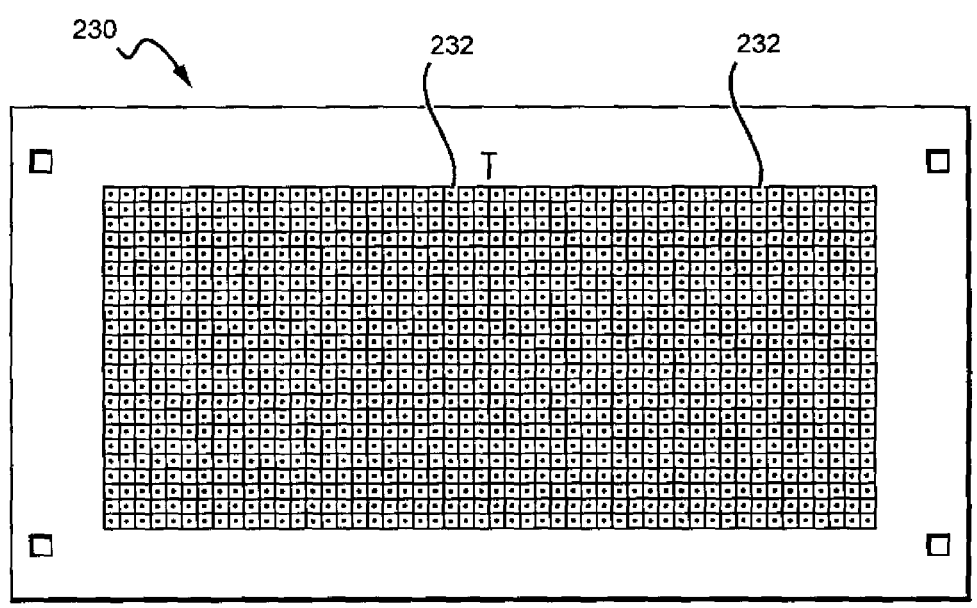

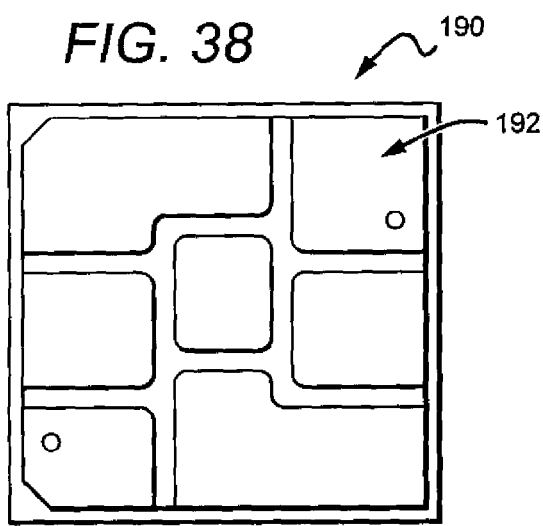
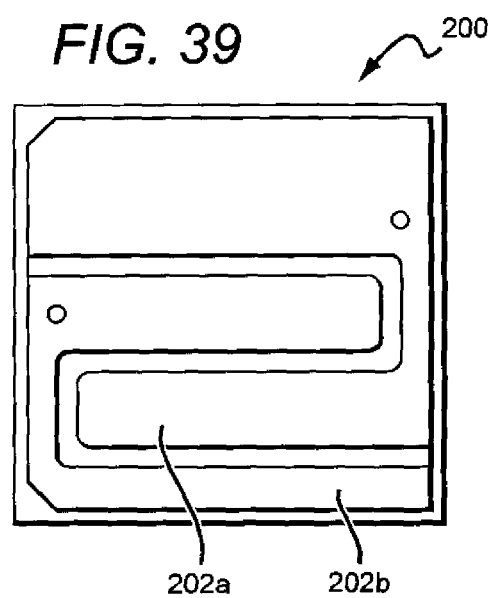
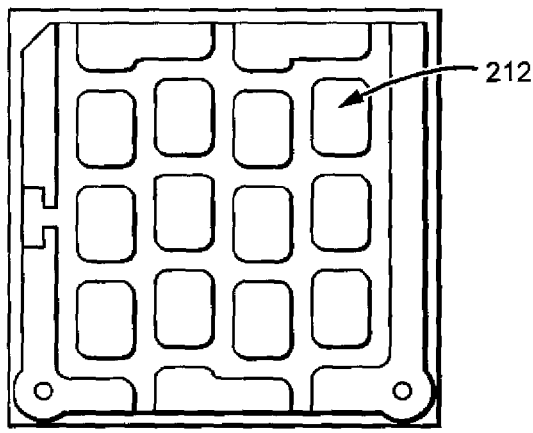
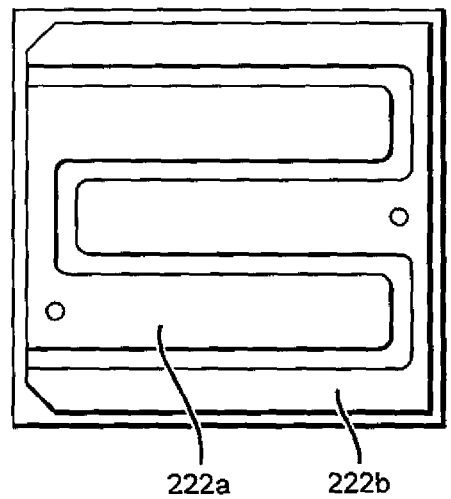

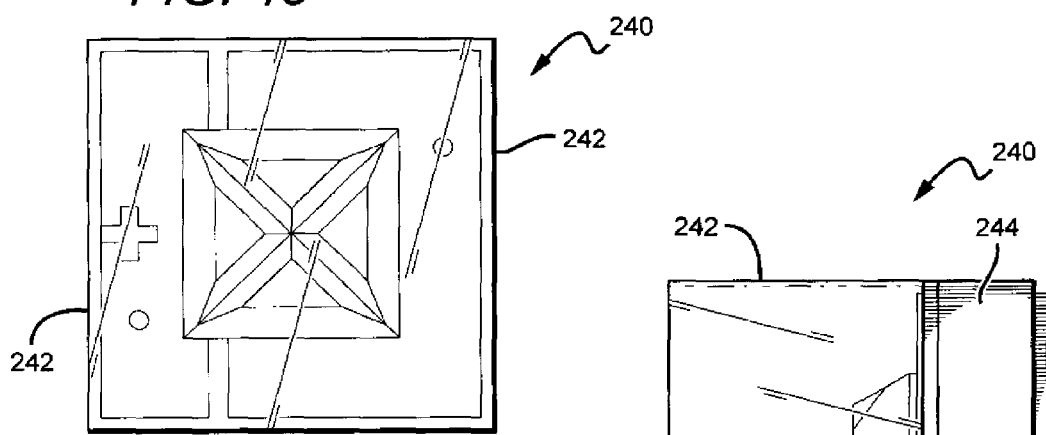
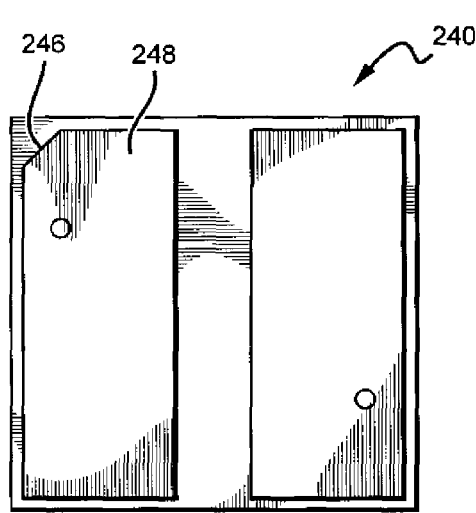
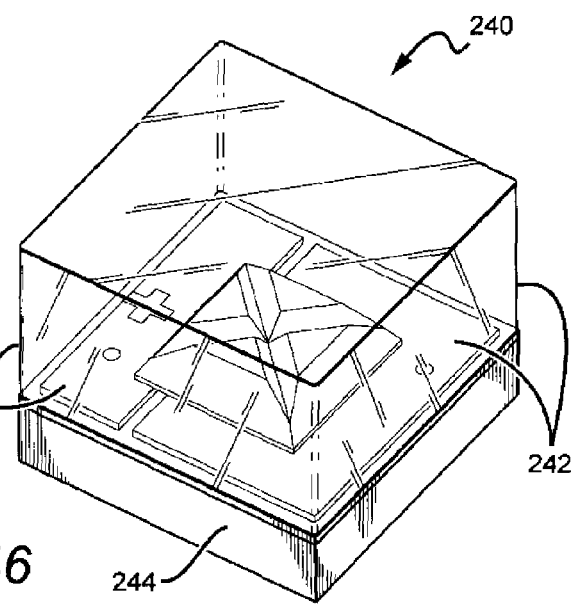
FIG. 43
FIG. 44
FIG. 45
FIG. 46

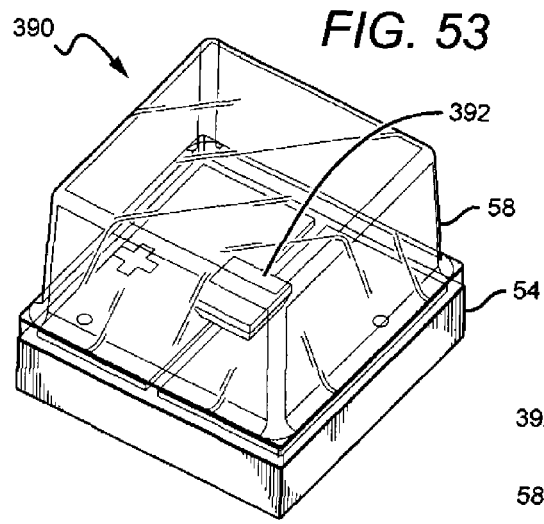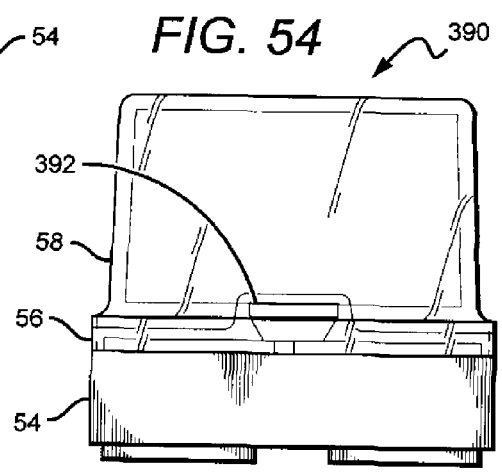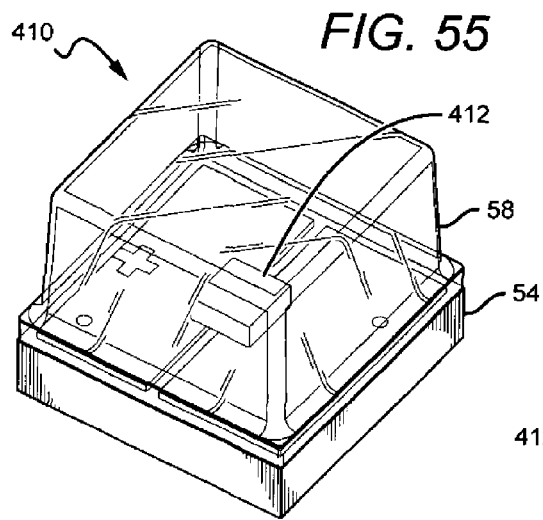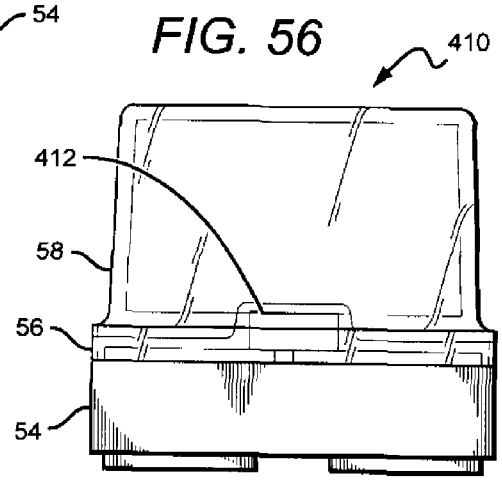

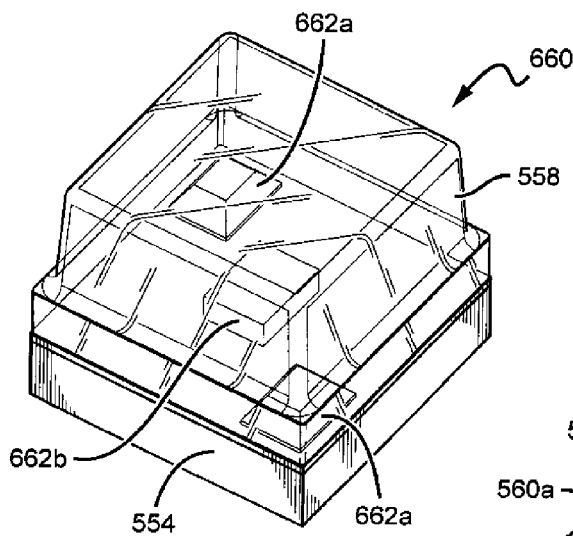
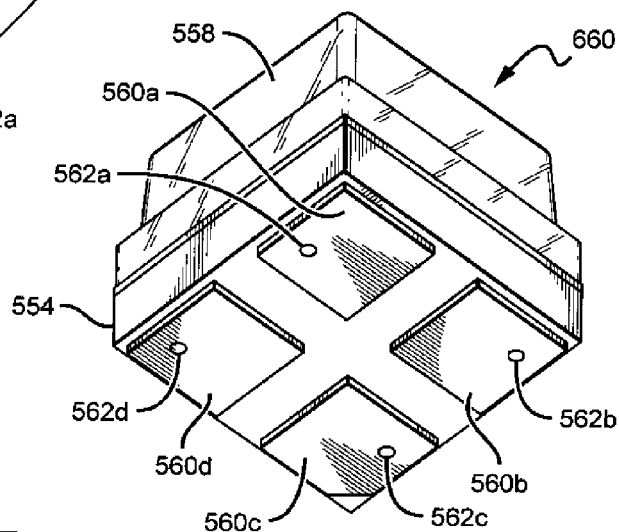
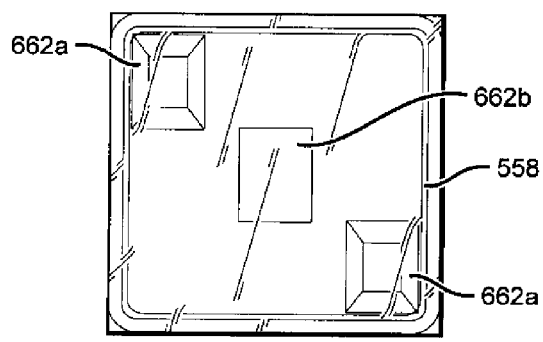
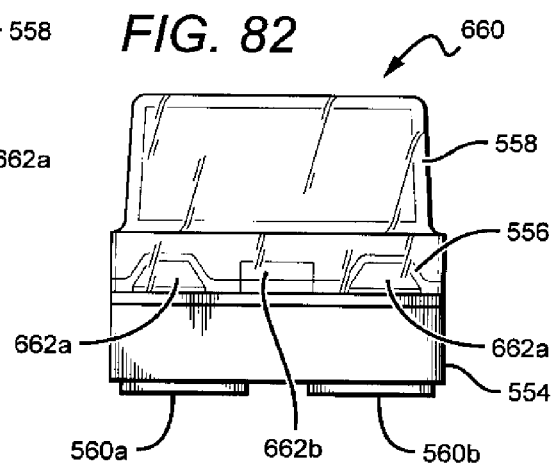

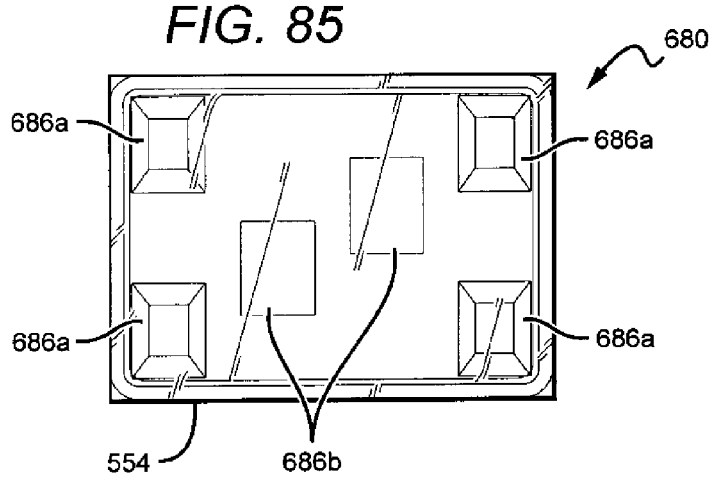
FIG. 85
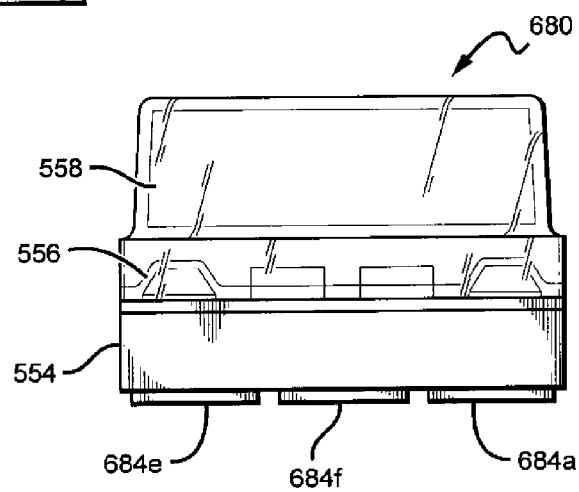
FIG. 86
FIG. 91
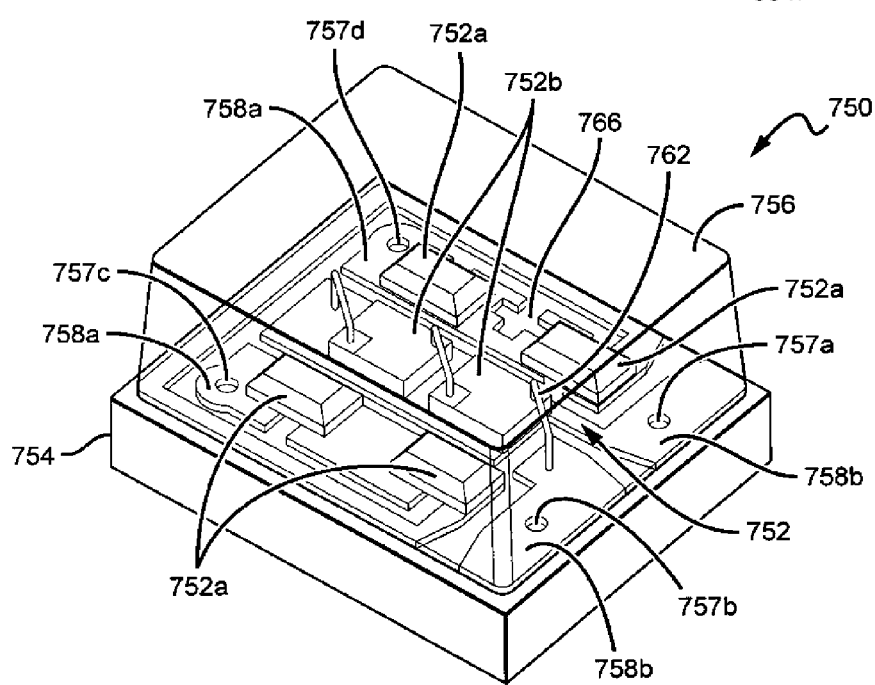

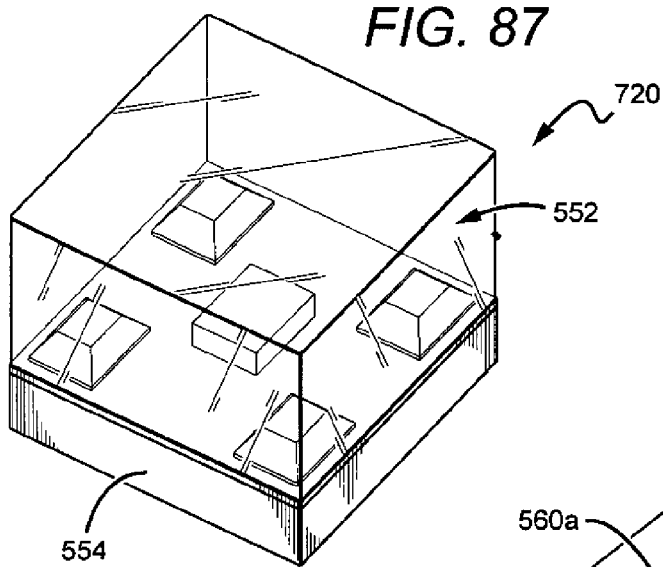
FIG. 87
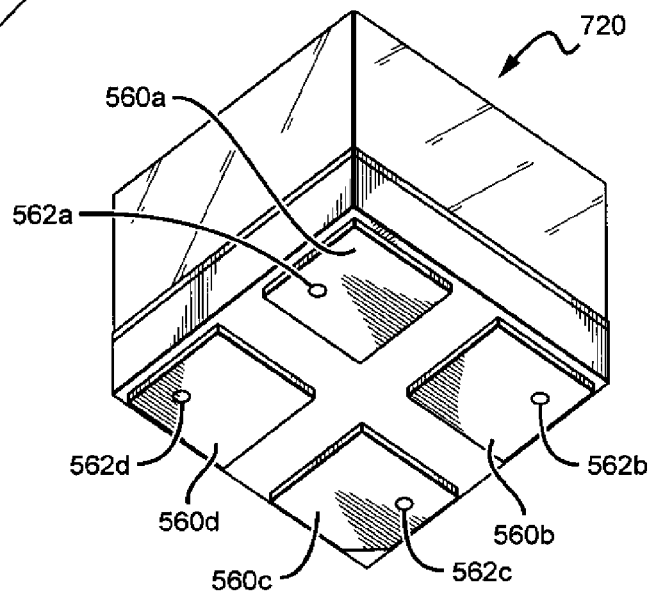
FIG. 88
FIG. 89
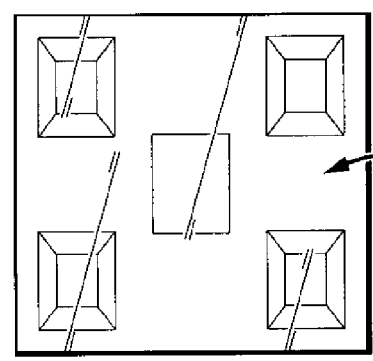
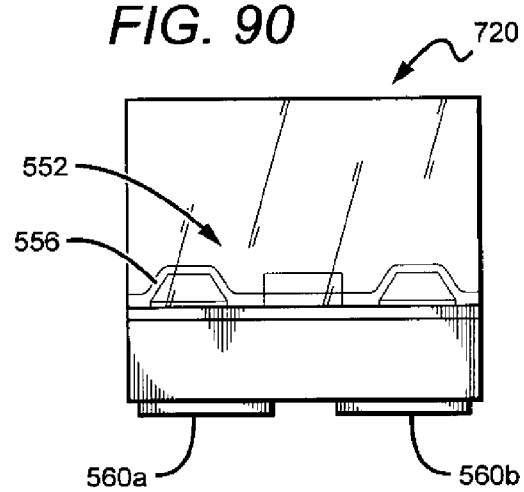
FIG. 90

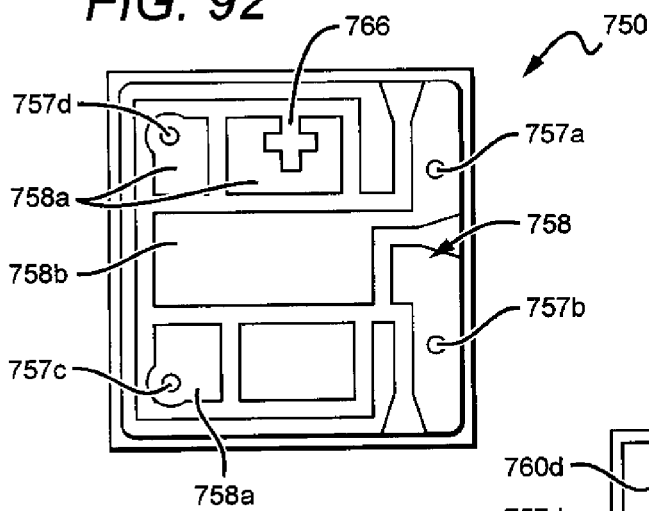
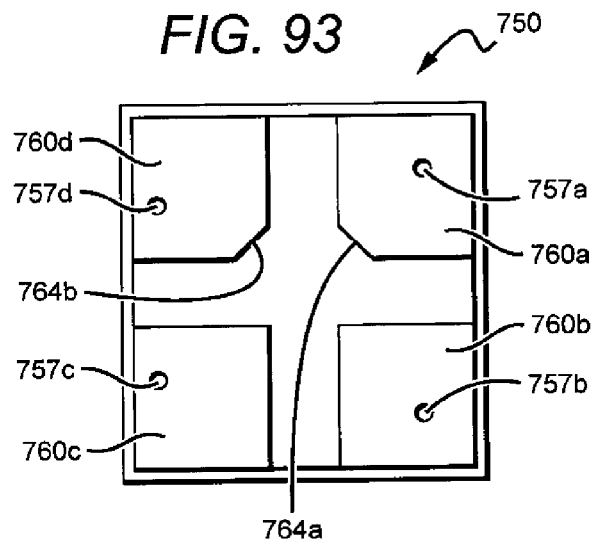
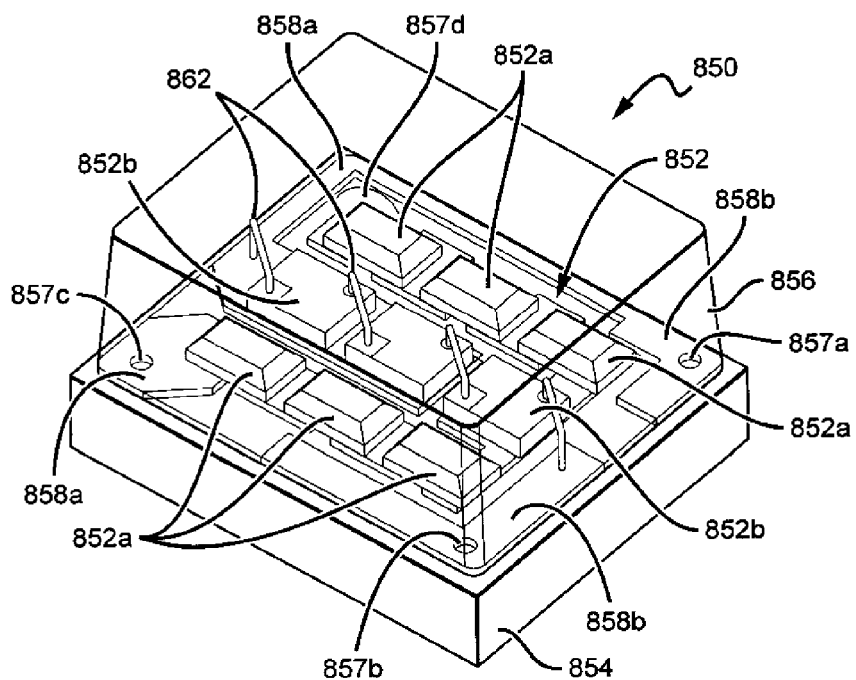

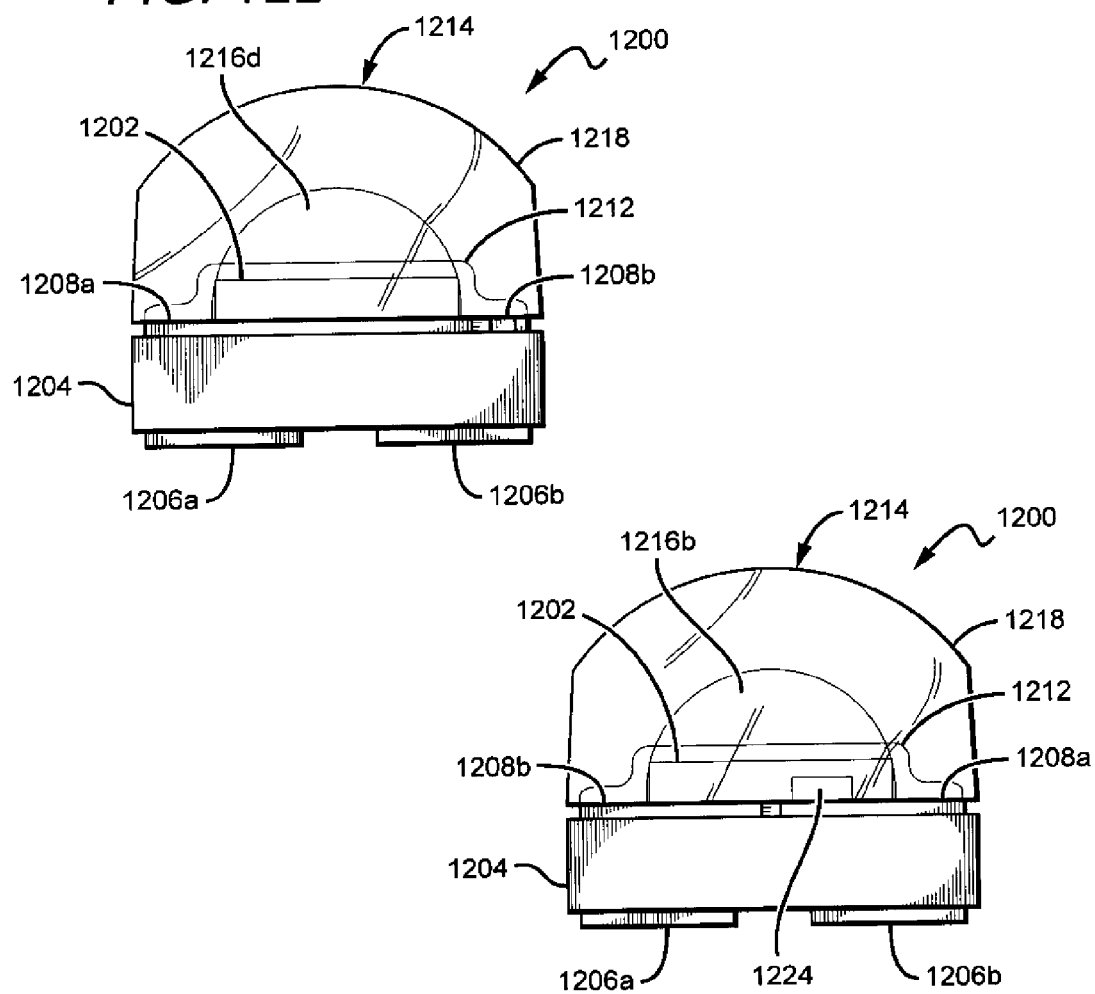
FIG. 122
FIG. 123
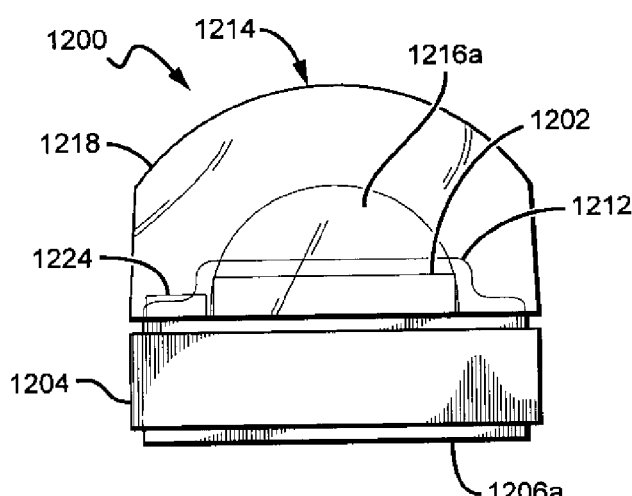
FIG. 124

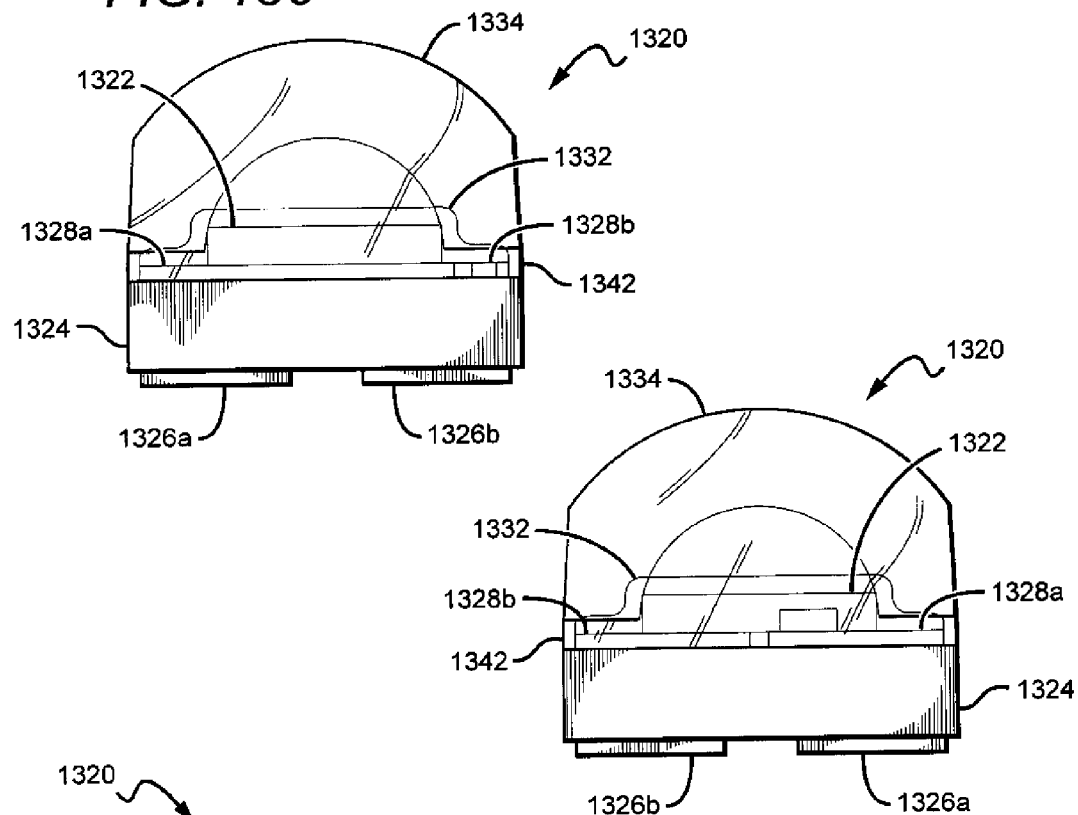
FIG. 136
FIG. 137
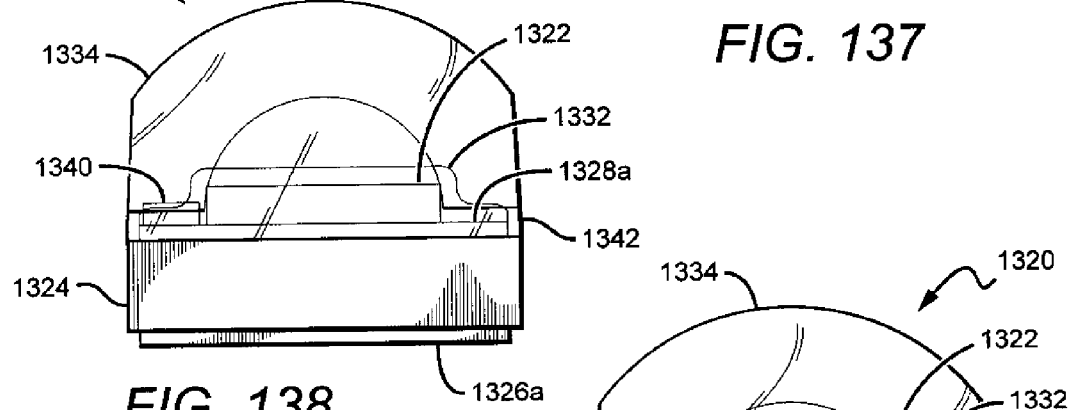
FIG. 138
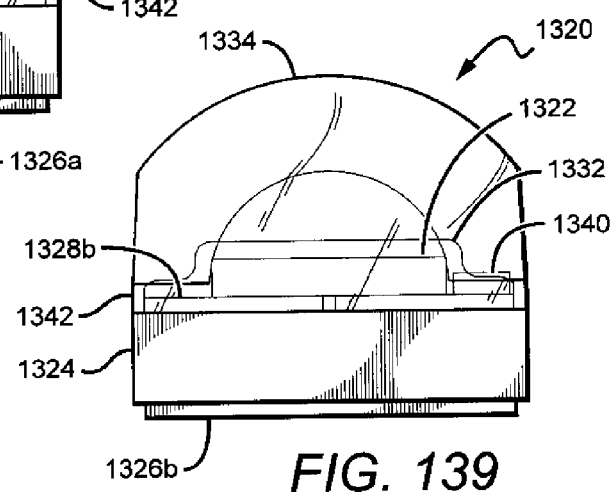
FIG. 139

LED PACKAGE WITH ENCAPSULANT HAVING CURVED AND PLANAR SURFACES

This application is a continuation-in-part of U.S. patent application Ser. No. 13/770,389, filed on Feb. 19, 2013, which is a continuation-in-part of and claims the benefit of U.S. patent application Ser. No. 13/649,067, and U.S. patent application Ser. No. 13/649,052, both of which were filed on Oct. 10, 2012, and both of which claim the benefit of U.S. Provisional Patent Application Ser. No. 61/658,271, filed on Jun. 11, 2012, U.S. Provisional Patent Application Ser. No. 61/660,231, filed on Jun. 15, 2012, and U.S. Provisional Patent Application Ser. No. 61/696,205, filed on Sep. 2, 2012. Each of the applications cited in this paragraph are incorporated by reference as if fully set forth herein.

BACKGROUND OF THE INVENTION

Field of the Invention

This invention pertains to solid state light emitters and in particular to light emitting diode (LED) packages with one or more LEDs and a hybrid encapsulant comprising planar and curved surfaces.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly is then encapsulated in a clear protective resin 14, which may be molded in the shape of a lens to collimate the light emitted from the LED chip 12. While the reflective cup 13 may direct light in an upward direction, optical losses may occur when the light is reflected (i.e. some light may be absorbed by the reflective cup due to the less than 100% reflectivity of practical reflector surfaces). In addition, heat retention may be an issue for a package such as the package 10 shown in FIG. 1, since it may be difficult to extract heat through the leads 15A, 15B.

A conventional LED package 20 illustrated in FIG. 2 may be more suited for high power operations which may generate more heat. In the LED package 20, one or more LED chips 22 are mounted onto a carrier such as a printed circuit board (PCB) carrier, substrate or submount 23. A metal reflector 24 mounted on the submount 23 surrounds the LED chip(s) 22 and reflects light emitted by the LED chips 22 away from the package 20. The reflector 24 also provides mechanical protection to the LED chips 22. One or more wirebond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

LED chips, such as those found in the LED package 20 of FIG. 2 can be coated by conversion material comprising one or more phosphors, with the phosphors absorbing at least some of the LED light. The LED chip can emit a different wavelength of light such that it emits a combination of light from the LED and the phosphor. The LED chip(s) can be coated with a phosphor using many different methods, with one suitable method being described in U.S. patent application Ser. Nos. 11/656,759 and 11/899,790, both to Chitnis et al. and both entitled "Wafer Level Phosphor Coating Method and Devices Fabricated Utilizing Method". Alternatively, the LEDs can be coated using other methods such as electrophoretic deposition (EPD), with a suitable EPD method described in U.S. patent application Ser. No. 11/473,089 to Tarsa et al. entitled "Close Loop Electrophoretic Deposition of Semiconductor Devices".

Another conventional LED package 30 shown in FIG. 3 comprises an LED 32 on a submount 34 with a hemispheric lens 36 formed over it. The LED 32 can be coated by a conversion material that can convert all or most of the light from the LED. The hemispheric lens 36 is arranged to minimize total internal reflection of light. The lens is made relatively large compared to the LED 32 so that the LED 32 approximates a point light source under the lens. As a result, the amount of LED light that reaches the surface of the lens 36 is maximized to maximize the amount of light that emits from the lens 36 on the first pass. This can result in relatively large devices where the distance from the LED to the edge of the lens is maximized, and the edge of the submount can extend out beyond the edge of the encapsulant. Further, these devices generally produce a Lambertian emission pattern that is not always ideal for wide emission area applications. In some conventional packages the emission profile can be approximately 120 degrees full width at half maximum (FWHM).

Lamps have also been developed utilizing solid state light sources, such as LEDs, in combination with a conversion material that is separated from or remote to the LEDs. Such arrangements are disclosed in U.S. Pat. No. 6,350,041 to Tarsa et al., entitled "High Output Radial Dispersing Lamp Using a Solid State Light Source." The lamps described in this patent can comprise a solid state light source that transmits light through a separator to a disperser having a phosphor. The disperser can disperse the light in a desired pattern and/or changes its color by converting at least some of the light to a different wavelength through a phosphor or other conversion material. In some embodiments the separator spaces the light source a sufficient distance from the disperser such that heat from the light source will not transfer to the disperser when the light source is carrying elevated currents necessary for room illumination. Additional remote phosphor techniques are described in U.S. Pat. No. 7,614,759 to Negley et al., entitled "Lighting Device."

SUMMARY OF THE INVENTION

The present invention is generally directed to emitter or LED packages that are compact and efficiently emit light, and can comprise encapsulants with planar surfaces that refract and/or reflect light within the package encapsulant. In some embodiments, the packages can also comprise a submount with one LED, while other embodiments can comprise a plurality of LEDs. In the single LED embodiments, a blanket conversion material layer can cover the LED, and in multiple LED embodiments the blanket conversion material layer can be on one or more of the LEDs. The blanket conversion material may also cover at least part of the submount. The encapsulant can be on the submount, over the LEDs, and over at least part of the blanket conversion material. Some of the light reflected within the encapsulant, due, for example, to total internal reflection from planar or otherwise shaped encapsulant surface, will reach the conversion material, where it may be scattered or absorbed and converted and then emitted omnidirectionally. This allows for reflected light to now escape from the encapsulant. This allows for efficient emission and a broader emission profile, for example when compared to conventional packages with hemispheric encapsulants or lenses.

In other embodiments, the LED packages can be provided with hybrid encapsulants that can result in an LED packages with differing emission profiles, with the hybrid encapsulants having surfaces that are not planar. Some of these embodiments can comprise an encapsulant with one or more planar and curved surfaces, with the resulting package providing or more focused or narrow emission profile useful in certain applications. The different embodiments can provide unique dimensional relationships which can include: curved surface to radius of curvature to submount size, encapsulant height, width and distance to the edge of the LED chip(s), distance between LED chips in a multiple chip embodiment, LED epitaxial area verses package area, emission pattern per package footprint, more light output power per package footprint, improved mixing or blending or uniformity of different colors emitted by the package. The different emitter and LED packages according to the present invention can use different light sources with different sizes, shapes and features.

Some embodiments of emitter packages according to the present invention can comprise an emitter package having one or more of solid state light sources on a submount having a length and width. An encapsulant is included over the solid state light sources and the submount, with the encapsulant having one or more planar surfaces, and a curved surface. The encapsulant's curved surfaces can have a radius of curvature greater than half of the submount length and/or width.

Other embodiments of emitter packages according to the present invention can comprising one or more LEDs mount and a conversion material layer over the LEDs. The package further comprises an encapsulant on the LEDs and the conversion material layer, with the encapsulant having one or more vertical planar side surfaces and a curved upper surface.

Still other embodiments of an emitter package according to the present invention comprise one or more LEDs mounted on a submount. The package further comprises an encapsulant on the submount, wherein the encapsulant comprises a curved upper surface and one or more planar side surfaces having a curved edge.

These and other aspects and advantages of the invention will become apparent from the following detailed description and the accompanying drawings which illustrate by way of example the features of the invention.

BRIEF DESCRIPTION OF THE DRAWINGS

FIG. 5 is bottom perspective view the LED package shown in FIG. 4;

FIG. 6 is a side elevation view of the LED package shown in FIG. 4;

FIG. 7 is another side elevation view of the LED package shown in FIG. 4;

FIG. 8 is a top view of the LED package shown in FIG. 4;

FIG. 9 is a bottom view of the LED package shown in FIG. 4;

FIG. 10 is another top view of the LED package shown in FIG. 4 showing one embodiment of its dimensions;

FIG. 11 is another side view of the LED package shown in FIG. 4 showing one embodiment of its dimensions;

FIGS. 22 through 25 are side elevation views of the LED package shown in FIG. 20;

FIG. 29 is bottom perspective view the LED package shown in FIG. 28;

FIGS. 30 through 33 are side elevation views of the LED package shown in FIG. 28;

FIG. 36 is a top view of one embodiment of a submount according to the present invention;

FIG. 37 is a top view of one embodiment of a submount according to the present invention;

FIG. 38 is a top view of another submount according to the present invention;

FIG. 39 is a top view of another submount according to the present invention;

FIG. 40 is a top view of another submount according to the present invention;

FIG. 41 is a top view of still another submount according to the present invention;

FIG. 42 is a top view of one embodiment of an encapsulant mold according to the present invention;

FIG. 43 is a top view of still another embodiment of an LED package according to the present invention;

FIG. 44 is a side view of the LED package shown in 43;

FIG. 45 is a bottom view of the LED package shown in FIG. 43;

FIG. 46 is a perspective view the LED package shown in FIG. 43;

FIG. 53 is a top perspective view of another embodiment of an LED package according to the present invention;

FIG. 54 is a side view of the LED package shown in FIG. 53;

FIG. 55 is a top perspective view of another embodiment of an LED package according to the present invention;

FIG. 56 is a side view of the LED package shown in FIG. 55;

FIG. 79 is a top perspective view of another embodiment of an LED package according to the present invention;

FIG. 80 is a bottom perspective view of the LED package shown in FIG. 79;

FIG. 81 is a top view of the LED package shown in FIG. 79;

FIG. 82 is a side elevation view of the LED package shown in FIG. 79;

FIG. 85 is a top view of the LED package shown in FIG. 83;

FIG. 86 is a side elevation view of the LED package shown in FIG. 83;

FIG. 87 is a top perspective view of another embodiment of an LED package according to the present invention;

FIG. 88 is a bottom perspective view of the LED package shown in FIG. 87;

FIG. 89 is a top view of the LED package shown in FIG. 87;

FIG. 90 is a side elevation view of the LED package shown in FIG. 87;

FIG. 91 is a top perspective view of another embodiment of an LED package according to the present invention;

FIG. 92 is a top view of die attach pads in the LED package shown in FIG. 91;

FIG. 93 is a top view of the solder pads in the LED package shown in FIG. 91;

FIG. 94 is a top perspective view of another embodiment of an LED package according to the present invention;

FIG. 122 is front elevation view of the LED package shown in FIG. 119;

FIG. 123 is a back elevation view of the LED package shown in FIG. 119;

FIG. 124 is a side elevation view of the LED package shown in FIG. 119;

FIG. 126 shows top and an elevation views for a series of LED packages according to the present invention;

FIG. 127 is a graph showing emission profiles for two LED packages according to the present invention;

FIG. 128 is a graph showing color temperature at different viewing angles for two LED packages according to the present invention;

FIG. 129 is a top perspective view of another embodiment of an LED package according to the present invention;

FIG. 130 is a top view of the LED package shown in FIG. 129;

FIG. 131 is front elevation view of the LED package shown in FIG. 129;

FIG. 132 is a side elevation view of the LED package shown in FIG. 129;

FIG. 133 is a top perspective view of another embodiment of an LED package according to the present invention;

FIG. 134 is a top view of the LED package shown in FIG. 133;

FIG. 135 is a bottom view of the LED package shown in FIG. 133;

FIG. 136 is front elevation view of the LED package shown in FIG. 133;

FIG. 137 is a back elevation view of the LED package shown in FIG. 133;

Figure 133:
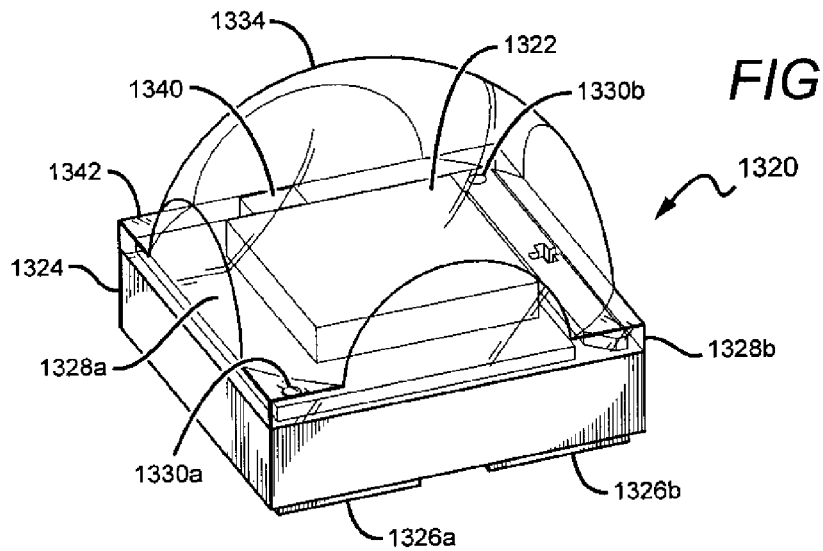
Figure 134:
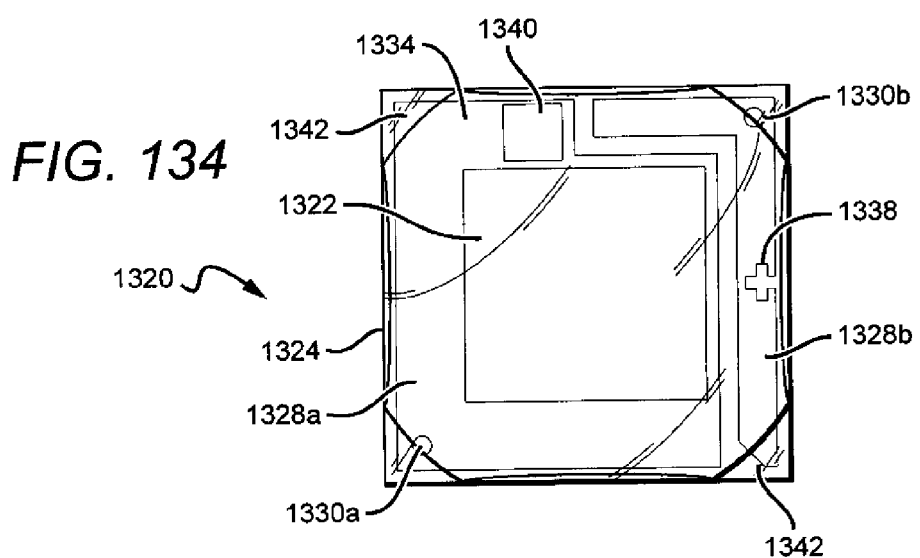
Figure 135:
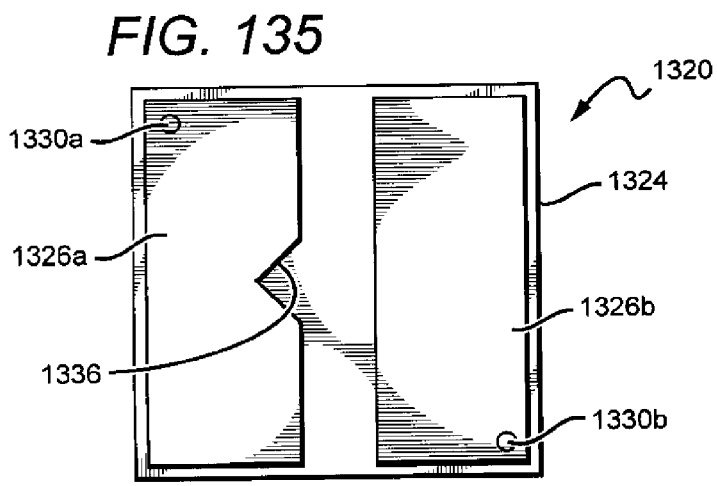
Figure 140:
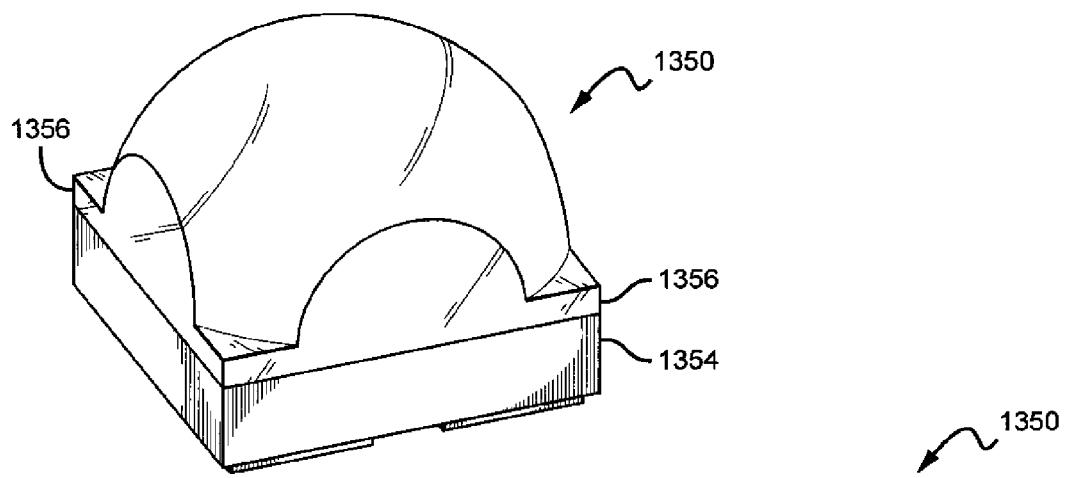
Figure 141:
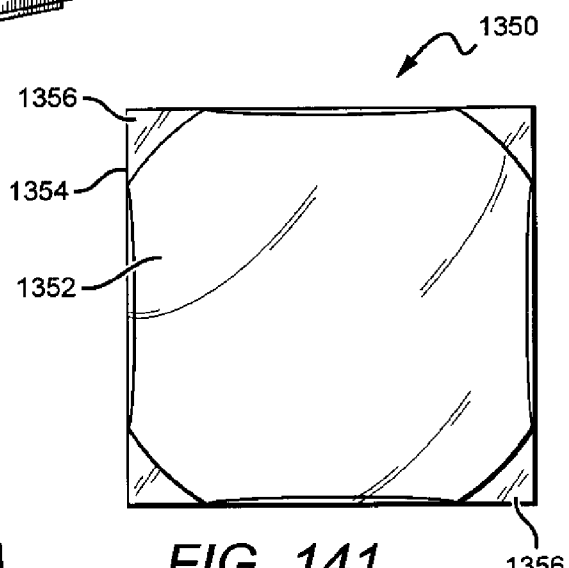
Figure 142:
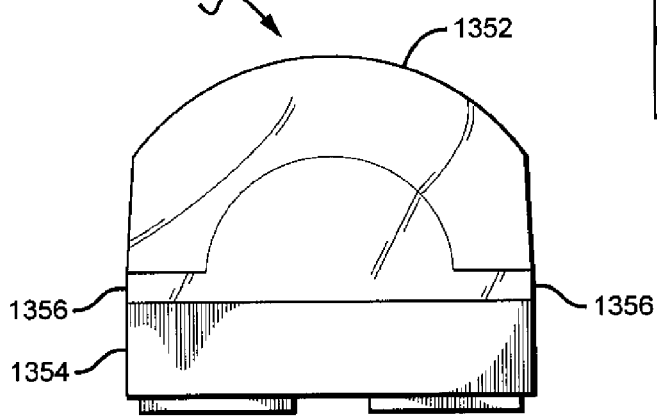

FIG. 138 is a side elevation view of the LED package shown in FIG. 133;

FIG. 139 is the opposite side elevation view of the LED package shown in FIG. 133;

FIG. 140 is a top perspective view of another embodiment of an LED package according to the present invention;

FIG. 141 is a top view of the LED package shown in FIG. 140;

FIG. 142 is front elevation view of the LED package shown in FIG. 140; and

Figure 143:
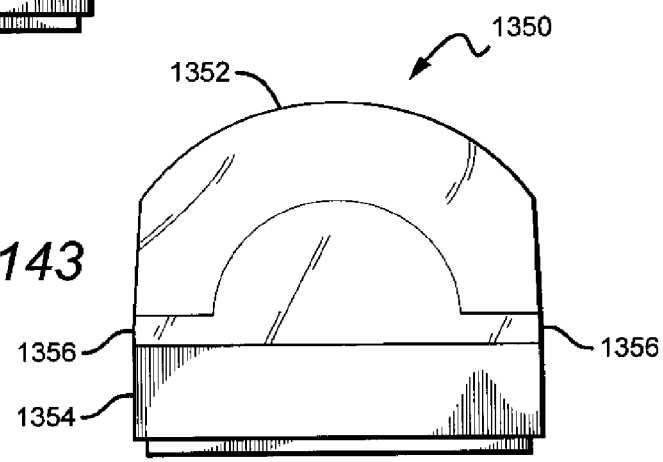

FIG. 143 is a side elevation view of the LED package shown in FIG. 140.

DETAILED DESCRIPTION OF THE INVENTION

The present invention is directed to different embodiments of LED package structures having a light source that comprises a single or plurality of LED chips. The LED packages can be arranged in different ways and are relatively small, while at the same time are efficient, reliable and cost effective. Some embodiments according to the present invention can emit with same or similar efficiency compared to similar LED packages with fully hemispheric encapsulants, but can be smaller and less expensive to manufacture.

The packages according to the present invention can provide these improvements by having conversion material and encapsulants that are arranged and shaped to capitalize on the total internal reflection (TIR) of light within the package. That is, the encapsulant can be shaped such that light incident on the package encapsulant at angles greater than the critical angle for TIR can be reflected back towards a conversion material within the package such that the light is converted or "recycled". This recycled light is scattered or converted and re-emitted from the conversion material omnidirectionally, such that some of the converted light will be redirected and can reach the surface of the encapsulant at an angle less than the critical angle and emit from the package. By arranging the LED packages to provide this photon recycling of reflected light, such as TIR light, the LED packages can be provided with different encapsulant shapes and sizes that are closer to that of the package light source, and the edge of the light source can be closer to the edge of the encapsulant.

In some embodiments, the LED packages can have planar surfaces that result in a certain amount of TIR light within the encapsulant. Using planar surfaces can provide increased flexibility in the different shapes that can be used beyond conventional hemispheric lenses, that are typically arranged to minimize TIR light, and the use of planar surfaces can allow for more compact LED packages. Some embodiments can comprise one or more LEDs ("LED") on a submount with contacts and traces for applying an electrical signal to the one or more LEDs. The LED and the surface around the LED can be blanketed by a layer of conversion material. The encapsulant can comprise a transparent material that is in a cubic shape over the LED and the submount. The conversion material layer can be of the type that converts light from the LED to another color or wavelength of light, and the conversion layer can be of a thickness and concentration such that less than all of the LED light is converted on its first pass through the conversion material.

Some embodiments can comprise LED packages with a blue emitting LED on a submount, with a yellow conversion material layer over the surface of the LED and submount with the conversion material layer converting a portion of the blue light from the LED chip. A cubic encapsulant can be included over the LED and submount, with the layer of conversion material between the encapsulant and the LED/submount. The packages according to the present invention can comprise a thinner phosphor layer or lower phosphor concentration than in conventional LED packages at the same color point, such that more blue light passes through the conversion material layer on the first pass. Since typical conversion layers also scatter as well as convert blue light, this can lead to improved package efficiency since the reduced thickness or concentration of the conversion layer results in less scattering of the first-pass blue light emitted by the LED back into the LED, where it may be absorbed. By achieving a similar color compared to conventional LED packages but with a thinner or lower concentration conversion layer, cost savings may also be realized in the manufacture of the LED packages fabricated according to the present invention. A portion of blue and yellow light from the conversion material reaches the surface of the encapsulant within the critical angle and emits from LED package. Compared to conventional LED packages with hemispheric type encapsulants, a greater percentage of blue and yellow light will experience TIR such that light reflects within the encapsulant. This results in the blue and yellow light eventually reaching the conversion material following TIR; i.e. the light is recycled by TIR. Blue TIR light illuminates that top of the conversion layer, while blue light from the LED illuminates the bottom surface of the conversion layer, such that both sides of the conversion layer are illuminated. The "blanket" effect provided by the conversion material layer limits both blue and yellow light from re-entering the chip or hitting other absorbing regions on the submount. This reduces the amount of light that might be absorbed as the light experiences TIR within the package.

The conversion of blue light at the conversion layer results in omnidirectional re-emission of yellow light from the conversion material layer. Illumination of both sides of the conversion material layer results in conversions of TIR blue light into omnidirectional yellow light. This provides the advantage of allowing for greater opportunities for otherwise TIR light to escape from the package. This recycling can also scatter light, which can result in LED package emissions patterns that are wider than conventional devices that provide a predominantly Lambertian emission pattern. This scattering can also result in reduced variations in color temperature at different viewing angles.

It is understood that in other embodiments, the conversion material layer can coat only the LED, leaving the submount uncovered by the conversion material layer. For multiple LEDs embodiments, different conversion material layers can be included on different ones of the LEDs. It also understood that in other embodiments having different conversion material layer embodiments, the different conversion materials can also coat some or all of the submount, which can result in different conversion materials covering all or some of the submount, or different conversion materials in different areas of the submount. Accordingly, it is understood that in different embodiments, the conversion material can be on the LEDs, on the submount and/or in the encapsulant. These different embodiments can have different combinations of the conversion material locations. Other embodiments can have multiple phosphors on the LEDs, submount and or in the encapsulant. Some of these embodiments can comprise a three phosphor mixture such as yellow (e.g. YAG), green (e.g. LuAg) and red (e.g. nitride). This is only one example of the many phosphor mixtures that can be used in different embodiments.

Some package embodiments according to the present invention can comprise LED packages with encapsulants having multiple planar surfaces, with at least some of the planar surfaces arranged to enhance TIR. Light from the package's LED light source can be less likely to reach the planar surface at angles less than the critical angle and can experience TIR. The planar surfaces can be relatively smooth such that light reaching the surfaces outside the critical angle experience TIR, without being redirected or scattered by features such as texturing or shaping. The LED light source as well as the surrounding substrate and conductive traces can be covered by a blanket layer of conversion material. TIR light can be reflected back toward the LED and substrate, and in conventional packages where the substrate comprises an absorbing surface the light can be absorbed. By blanketing the LED and the surrounding surfaces with a converting material, the TIR light can be scattered or converted and recycled to emit from the LED package before it reaches the absorbing surfaces, thereby improving package efficiency.

Some embodiments of LED packages according to the present invention can comprise a plurality of LEDs or LED chips on a submount, with contacts, attach pads and/or traces for applying an electrical signal to the one or more LEDs. The plurality of LEDs can emit the same color of light or can emit different colors of light such that the LED package emits the desired color combination of the light from the LED chips. The LED packages can be arranged with LED chips in different patterns, and in some embodiments the LED chips can be of the same type that emits the same color of each type could be used, and in other embodiments additional LEDs can be used that produce additional colors of light. In some embodiments, all or some of the LED chips can be covered by the conversion material, with others of the LED chips uncovered. By using one or more LEDs emitting one or more additional colors and/or having some covered by a wavelength conversion material, the color rendering index (CRI) of the lighting unit can be increased. As mentioned above and described in more detail below, the conversion material layer can comprise one or more conversion materials, such as phosphors, to provide the desired LED package emission, such as the white light with the desired temperature and CRI. A further detailed example of using LEDs emitting light of different wavelengths to produce substantially white light can be found in issued U.S. Pat. No. 7,213,940, which is incorporated herein by reference.

Some LED packages according to the present invention can comprise a first group of LED chips coated by the conversion material layer comprising at least one conversion material. The packages also include one or more of a second type of LED chip emitting at a different wavelength of light, with the second LED chips not covered by the conversion material. Each of the first group of LED chips, if illuminated, can emit a blue light having a dominant wavelength in the range of from 430 nm to 480 nm. The conversion material layer can be excited by the blue light, and can absorb at least some of the blue light and can reemit light having a dominant wavelength in the range of from about 555 nm to about 585 nm. This light can be referred to as blue shifted yellow (BSY) light. The second LED chip type can be uncovered by the conversion material layer and if energized with current, can emit red or orange light having a dominant wavelength in the range of from 600 nm to 650 nm.

With both the first and second LED chips emitting light, the LED packages can emit a combination of (1) blue light exiting the package from the first group of LED chips, (2) BSY light exiting the package comprising light from the first LED chips absorbed by the conversion material layer and then reemitted and (3) light exiting the lighting device from the second group of LED chips in the red or orange wavelength regime. In an absence of any additional light, this can produce a LED package emission mixture of light having x, y coordinates on a 1931 CIE Chromaticity Diagram different from the primary emitter wavelengths and within the polygon created by the x, y color coordinates of the emissions of the first, second LED chips and the individual conversion material constituents. The combined light emission coordinates may define a point that is within ten MacAdam ellipses of at least one point on the blackbody locus on a 1931 CIE Chromaticity Diagram. In some embodiments, this combination of light also produces a sub-mixture of light having x, y color coordinates which define a point which is within an area on a 1931 CIE Chromaticity Diagram enclosed by first, second, third, fourth and fifth connected line segments defined by first, second, third, fourth and fifth points. The first point can have x, y coordinates of 0.32, 0.40, the second point can have x, y coordinates of 0.36, 0.48, the third point can have x, y coordinates of 0.43, 0.45, the fourth point can have x, y coordinates of 0.42, 0.42, and the fifth point can have x, y coordinates of 0.36, 0.38.

The different packages according to the present invention can have one or more LEDs with many different shapes, sizes and features. In some package embodiments the LED chips can have surfaces that are textured, while other embodiments can have LEDs and an encapsulant that can be shaped so that they have surfaces that are oblique to one another. In still other embodiments, the LED chips can be made of materials and shaped such that LED chip surfaces are generally parallel to the surfaces of the encapsulant.

As described in more detail below, the encapsulant can comprise many different shapes with planar surfaces, and in some embodiments, the encapsulant can be cube shaped and can be included over the LEDs chips and the submount. The conversion material layer can be included between the encapsulant and the LEDs array and submount. In other embodiments, the conversion material can be included in the encapsulant, but is formed in a layer or region that occupies less than all of the encapsulants. In some embodiments, the conversion material layer can be formed in the encapsulant in the lower portion of the encapsulant, while in other embodiments it can be formed as a layer at or near the bottom of the encapsulant.

The LED packages according to the present invention can comprise a thinner phosphor layer or lower phosphor concentration than in conventional LED packages at the same color point, such that more blue light passes through the conversion material layer on the first pass. Since typical conversion layers also scatter as well as convert blue light, this can lead to improved package efficiency since the reduced thickness or concentration of the conversion layer results in less scattering of the first-pass blue light emitted by the LED back into the LED, where it may be absorbed. By achieving a similar color compared to conventional LED packages but with a thinner or lower concentration conversion layer, cost savings may also be realized in the manufacture of the LED packages fabricated according to the present invention. A portion of blue and yellow light from the conversion material reaches the surface of the encapsulant within the critical angle and emits from LED package. Compared to conventional LED packages with hemispheric type encapsulants, a greater percentage of blue and yellow light will experience TIR such that light reflects within the encapsulant. This results in the blue and yellow light eventually reaching the conversion material following TIR; i.e. the light is recycled by TIR. Blue TIR light illuminates the top of the conversion layer, while blue light from the LED illuminates the bottom surface of the conversion layer, such that both sides of the conversion layer are illuminated. The "blanket" effect provided by the conversion material layer limits both blue and yellow light from re-entering the chip or hitting other absorbing regions on the submount. This reduces the amount of light that might be absorbed as the light experiences TIR within the package.

The conversion of blue light at the conversion layer results in omnidirectional re-emission of yellow light from the conversion material layer. Illumination of both sides of the conversion material layer results in conversions of TIR blue light into omnidirectional yellow light. This provides the advantage of allowing for greater opportunities for otherwise TIR light to escape from the package. This recycling can also scatter light, which can result in LED package emissions patterns that are wider than conventional devices that provide a predominantly Lambertian emission pattern. This scattering can also result in reduced variations in color temperature at different viewing angles.

It is understood that in other embodiments, the conversion material layer can coat only one or more of the LEDs, leaving the submount uncovered by the conversion material layer. For multiple LED embodiments, different conversion material layers can be included on different ones of the LEDs. It also understood that in other embodiments having different conversion material layer embodiments, the different conversion materials can also coat some or all of the submount, which can result in different conversion materials covering all or some of the submount, or different conversion materials in different areas of the submount. Accordingly, it is understood that in different embodiments, the conversion material can be on the LEDs, on the submount and/or in the encapsulant. These different embodiments can have different combinations of the conversion material locations. Other embodiments can have multiple phosphors on the LEDs, submount and/or in the encapsulant. Some of these embodiments can comprise a three phosphor mixture such as yellow (e.g. YAG), green (e.g. LuAg) and red (e.g. nitride). This is only one example of the many phosphor mixtures that can be used in different embodiments. In still other embodiments, the emitters and submount can be provided without a conversion material layer, or a conversion material can be included only on the submount. In these embodiments, the packages can comprise LEDs emitting different colors of light that combine to produce the desired LED package emission. This can include, for example, red, green and blue emitting LEDs whose emission can be combined to produce white light. Like other embodiments discussed herein, these different LEDs can be individually addressable.

Other mechanisms which re-direct light within the encapsulant, such as scattering or refraction, may be used in combination with or in place of TIR. For example, in one embodiment, a scattering material may be added to the encapsulant to further enhance color uniformity in the light emitted by the package, or to produce a broader beam intensity profile while maintaining high package efficiency. The LED packages according to the present invention can be used with many different luminaires, with the LED packages resulting in improved color mixing. This can result luminaires producing the desired emission without the need for mixing chambers, or with the use of reduced height mixing chambers.

The different embodiments can also comprise LED packages with relatively small footprints, with some having a footprint smaller than 3 mm square, while other embodiments can have a footprint smaller than 2 mm square. These embodiments can also provide devices having a footprint that is closer in size to the area covered by the LED. The embodiments can also exhibit height and footprint dimensions that are relatively close to one another as further described below.

For those embodiments with multiple LED light sources, individual ones of the LEDs can be individually addressable or controlled, or different strings or subsets of the multiple LEDs can be individually addressable or controlled. A string can be one LED or multiple LEDs coupled together in different parallel and/or serial connections to achieve the desired operating voltages or to achieve the desired package emission color temperature. This can be applicable to many different package arrangements such as those having LEDs emitting different colors or LEDs with phosphor coating that are from different bins.

Different LED packages according to the present invention can have different shaped encapsulants to produce the desired emission profile and emission efficiency. Some embodiments can comprise encapsulants where not all of the surfaces are planar, with some comprising a hybrid combination of planar and curved surfaces. Some of these embodiments can comprise one or more LEDs mounted on a submount, with the encapsulant having an upper curved surface and planar side surfaces. The upper surface can have a radius of curvature that is greater than half the length or width of the submount, with the planar surfaces comprising truncated sections of the encapsulant so that the encapsulant does not overhang the edge of the submount. This can result in planar surfaces with a curved edge as described below.

Encapsulants with a combination of planar and curved surfaces can provide different emission patterns, with some providing a more narrow emission profile compared to LED packages having encapsulants with all planar surfaces. In some embodiments the emission profile can be less than 120° FWHM. These LED packages can also maintain their relatively small size/footprint, emission efficiency and limited variations in color temperature at a range of viewing angles. The different embodiments according to the present invention can have many different types of encapsulants with many different combinations of planar and curved surfaces.

The present invention is described herein with reference to certain embodiments, but it is understood that the invention can be embodied in many different forms and should not be construed as limited to the embodiments set forth herein. In particular, the present invention is described below in regards to certain LED packages having LEDs in different configurations, but it is understood that the present invention can be used for many other LED packages with other LED configurations. The LED packages can also have many different shapes beyond those described below, such as rectangular, and the solder pads and attach pads can be arranged in many different ways. In other embodiments, the emission intensity of the different types of LED chips can be controlled to vary the overall LED package emission.

The present invention can be described herein with reference to conversion materials, wavelength conversion materials, remote phosphors, phosphors, phosphor layers and related terms. The use of these terms should not be construed as limiting. It is understood that the use of the term remote phosphors, phosphor or phosphor layers is meant to encompass and be equally applicable to all wavelength conversion materials.

The embodiments below are described with reference to an LED or LEDs, but it is understood that this is meant to encompass LED chips, and these terms can be used interchangeably. These components can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

It is also understood that when an feature or element such as a layer, region, encapsulant or submount may be referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4 through 13 show one embodiment of an LED package 50 according to the present invention comprising an LED 52, mounted on a submount 54. The LED package 50, also comprises first and second bottom contact/solder pads 60a and 60b on the bottom of the submount 54, first and second conductive vias 62a, 62b passing through the submount 54, and first and second die attach pads 64a, 64b on the top surface of the submount 54. The LED package further comprises a conversion material layer 56 covering the LED 52, the exposed surfaces of the die attach pads 64a, 64b, and exposed portions of the top surface of the submount 54. An encapsulant 58 is included over the LED 52, the attach pads 64a, 64b, and the submount 54. The above features of the LED package are described in detail below.

The LED 52 is shown as a single LED, but it is understood that in other embodiments (such as those described below) the light source can comprise more than one LED. Many different LEDs can be used such as those commercially available from Cree Inc., under its DA, EZ, GaN, MB, RT, TR, UT and XT families of LED chips, among others. The LED package 50 is particularly arranged for use with the DA family of chips such as the DA850 chip that can be flip chip mounted and allows for wire-free bonding. These types of chips are generally described in U.S. patent application Ser. No. 12/463,709 to Donofrio et al., entitled "Semiconductor Light Emitting Diodes Having Reflective Structures and Methods of Fabricating Same," which is incorporated herein by reference. The LED 52 can emit many different colors of light, with a preferred LED emitting light in the blue wavelength spectrum. It is understood that in some embodiments the LED can be provided following removal of its growth substrate. In other embodiment, the LED's growth substrate can remain on the LED 52, with some of these embodiments having a shaped or textured growth substrate.

In other embodiments, more than one LED can be used as the light source, while in other embodiments solid state lasers can used either alone or in combination with one or more LEDs. In some embodiments, the LEDs can comprise a transparent growth substrate such as silicon carbide, sapphire, GaN, GaP, etc. The LED chips can also comprise a three dimensional structure and in some embodiments, the LEDs can have structure comprising entirely or partially oblique facets on one or more surfaces of the chip.

The LED package 50 further comprises a submount 54, with the LED 52 mounted to the submount 54. The submount 54 can be formed of many different materials with a preferred material being electrically insulating, such as a dielectric material. The submount 54 can comprise a ceramic such as alumina, aluminum nitride, silicon carbide, or a polymeric material such as polymide and polyester. In the preferred embodiment, the submount 54 can comprise a dielectric material having a relatively high thermal conductivity, such as aluminum nitride and alumina. In other embodiments the submount 54 can comprise a printed circuit board (PCB), sapphire or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board.

The top surface of the submount 54 is shown having a planar surface with patterned conductive features that can comprise first and second die attach pads 64a, 64b. A space is provided between the attach pads 64a, 64b, with the LED chip 52 mounted to the pads 64a, 64b such that respective portions of the LED 52 are mounted to a respective one of the pads 64a and 64b and the LED 52 spans the space between the attach pads 64a, 64b. Many different mounting methods can be used, such as methods utilizing conventional solder materials. Other types of LED chips can be electrically connected to the attach pads 64a, 64b or other conductive traces using known surface mount or wire bonding methods depending on the geometry of the LED 52.

The pads 64a, 64b can comprise many different materials, such as metals or other conductive materials, and in one embodiment they can comprise copper deposited using known techniques such as plating. In other embodiments pads 64a, 64b can be sputtered using a mask to form the desired pattern, and in other embodiments they can be formed using known photolithography processes. The pads 64a, 64b can extend beyond the edge of the LED 52 to cover most of the top surface of the submount 54. This helps in thermal management for the LED package 50 by spreading heat from the LED 52 into the pads 64a, 64b so that heat spreads beyond the edge of the LED 52 into more area of the submount 54. This allows the heat to be less localized and allows it to more efficiently dissipate through the surmount 54 into the ambient.

The conversion material layer 56 is included over the LED 52, exposed portions of the pads 64a and 64b, and exposed portions of the submount's top surface. Many different conversion materials can be used to generate the desired LED package light emission, with the present invention being particularly adapted to LED packages emitting white light. In some white emitting embodiments, the LED 52 can emit light in the blue wavelength spectrum. The conversion material can be of the type that absorbs blue light and re-emits yellow light such that the package emits a white light combination of blue and yellow light. In some embodiments, the conversion material can comprise a commercially available YAG:Ce phosphor, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used include but are not limited to:
$Tb_{3-x}RE_xO_{12}$:Ce(TAG); RE=Y, Gd, La, Lu; or
$Sr_{2-x-y}Ba_xCa_ySiO_4$:Eu.

In other embodiments, the conversion material layer can be arranged with more than one phosphor material either mixed or in separate layers. In some embodiments, each of the two phosphors can absorb the LED light and can re-emit different colors of light. In these embodiments, the colors from the two phosphor layers can be combined for higher CRI white of different white hue (warm white). This can include light from yellow phosphors above that can be combined with light from red phosphors. Different red phosphors can be used including:
$Sr_xCa_{1-x}S$:Eu, Y; Y=halide;
$CaSiAlN_3$:Eu; or
$Sr_{2-y}Ca_ySiO_4$:Eu Other phosphors can be used to create color emission by converting substantially all light to a particular color. For example, the following phosphors can be used to generate green light:
$SrGa_2S_4$:Eu;
$Sr_{2-y}Ba_ySiO_4$:Eu; or
$SrSi_2O_2N_2$:Eu.

The following lists some additional suitable phosphors used as conversion particles, although others can be used. Each exhibits excitation in the blue and/or UV emission spectrum, provides a desirable peak emission, has efficient light conversion, and has acceptable Stokes shift:
Yellow/Green
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
$Lu_3Al_5O_{12}:Ce^{3+}$
Red
$Li_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
$CaAlSiN_3:Eu^{2+}$
$Ca_{1-x}Sr_xSiAlN_3:Eu^{2+}$
$Sr_2Si_5N_8:Eu^{2+}$ In still other certain embodiments, the conversion material layer can comprise at least three phosphors, with some embodiments comprising a combination of yellow, red and green phosphors. Other combinations are possible, and other embodiments can comprise more than three phosphors. Many different yellow, red and green phosphors can be used, such as those described above.

The conversion material can comprise different sized phosphor particles including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, the phosphor can be fixed in the conversion material layer in a binder, and the phosphor can also have different concentrations or loading of phosphor materials in the binder. A typical concentration of phosphor in a binder is typically a range of 30-70% by weight. In one embodiment, the phosphor concentration is approximately 65% by weight, and is preferably uniformly dispersed throughout the remote phosphor. The conversion material layer 56 can also have different regions with different concentrations of phosphor particles.

Alternate wavelength conversion materials may also be used to down-convert light to generate white emissions. Such materials may be, but are not limited to organic fluorescent materials or dyes or inorganic quantum dot materials such as CdSe/ZnS, InP/InAs, CdS/CdSe, CdTe/CdSe or others.

The conversion material layer 56 can have many different thicknesses depending at least partially on the concentration of conversion material, the size of the conversion material particles, and the desired amount of light to be converted by the conversion material. Conversion material layer according to the present invention can be in a binder with phosphor concentration levels (phosphor loading) above 30%. Other embodiments can have concentration levels above 50%, while in still others the concentration level can be above 60%. In some embodiments the phosphor binder combination can have thicknesses in the range of 10-100 microns, while in other embodiments it can have thicknesses in the range of 40-50 microns. Thickness may also vary across the layer, with different regions having different thicknesses. As described in more detail below, the different packages according to the present invention can comprise conversion layers with less phosphor material (e.g. thinner or lower concentration) compared to similar packages with hemispheric encapsulants, while still maintaining the desired emission color point. This reduction in thickness depends on many different factors, such as the phosphor type, size of phosphor particles, and concentration of phosphor particles in the layer. In some embodiments, the reduction can be 10% or more compared to a similar LED package with hemispheric lens. In still other embodiments it can be 20% or more, while in other embodiments it can be 30% or more.

The conversion material layer 56 can also comprise a binder, and different materials can be used for the binder, with materials preferably being robust after curing and substantially transparent in the visible wavelength spectrum. Suitable materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. It is understood, however, that the phosphor particles can be applied without a binder.

The conversion material layer can be applied using different processes including but not limited to spraying, dispensing, spin coating, sputtering, printing, powder coating, electrophoretic deposition (EPD), and electrostatic deposition, among others. These processes can also include a solvent in the phosphor-binder mixture that can liquefy and lower the viscosity of the mixture. Many different solvents can be used including but not limited to toluene, benzene, zylene, or OS-20 commercially available from Dow Corning®, and different concentration of the solvent can be used. When the solvent-phosphor-binder mixture is sprayed, poured or dispersed heat from the remote phosphor evaporates the solvent and can also cure the binder in the mixture leaving a fixed phosphor layer. Various deposition methods and systems are described in U.S. Patent Application Publication No. 2010/0155763, to Donofrio et al., entitled "Systems and Methods for Application of Optical Materials to Optical Elements," and also assigned to Cree, Inc.

Encapsulant 58 is included on the conversion material layer 56, and over the LED 52 and submount 54, with the encapsulant 58 providing environmental and mechanical protection, as well as allowing for the recycling of light as described above and described in more detail below. Unlike most conventional encapsulants formed over an LED, the encapsulant 58 has planar surfaces, and in the embodiment shown the encapsulant 58 has a generally cubic shape. The encapsulant includes both vertical and horizontal planar surfaces in the shape of a cube, but it is understood that encapsulant can take many different shapes such as any shape having a flat top and vertical sidewalls with planar surfaces. These can include but are not limited to different prismatic or polygon shapes such as triangles, pentagons, hexagons, octagons, etc. These shapes can include a horizontal planar surface, with vertical surfaces numbering in the range of 3 to 12 or more. In still other embodiments, the encapsulant can be cylindrical with different cross sections such as circular or oval.

It is understood that encapsulant 58 and the LED 52 can be aligned in many different ways, with the LED 52 as shown approximately aligned with the center or longitudinal axis of the encapsulant 58. In other embodiments, the LED 52 can be closer to one of the edges of the encapsulant 58.

Many different materials can be used for the encapsulant 58 such as silicones, plastics, epoxies or glass, with a suitable material being compatible with molding processes. Silicone is suitable for molding and provides suitable optical transmission properties. It can also withstand subsequent reflow processes and does not significantly degrade over time. The encapsulant can also be formed using many different methods, and in some embodiments a molding process (described in more detail below) can be used that simultaneously forms encapsulants 58 over a multitude of LEDs 52 on a submount panel.

In different embodiments, the encapsulant can have many different thicknesses, with some providing just enough encapsulant material to cover the LED and phosphor layer. In these embodiments, the layer can be as thin as 10 μm or more. In still other embodiments, the encapsulant can be as high as three times the submounts edge dimension. These are only some examples of encapsulant height, with other embodiments being thinner or higher.

In some embodiments, the top surface of the encapsulant can have a slightly smaller area than the bottom of the encapsulant and/or the footprint of the LED package. In still other embodiments, the upper portions of the encapsulant can have a larger area than lower portions, or a larger area than the LED package footprint.

The LED chip 50 also comprises first and second solder pads 60a, 60b formed on the bottom surface of the submount 54, which can be used for mounting the LED package 52 in place using known mounting methods. It is understood that in other embodiments (as described below), LED packages according to the present invention can have more than two solder pads. The solder pads 60a, 60b can be made of the same materials and can be formed of the same way as die attach pads 64a, 64b. First and second conductive vias 62a, 62b can be included that pass through the submount 54 with the vias being formed of an electrically conductive material such as those used for the die attach pads and solder pads, and are arranged to provide an electrically conductive path between the solder pads 60a, 60b and the die attach pads 64a, 64b. In the embodiment shown, first via 62a forms an electrically conductive path between the first solder pad 60a and the first die attach pad 64a, while second via 62b provides a conductive path between the second solder pad 60b and the second die attach pad 64b. This allows an electrical signal applied to the solder pads 60a, 60b to be conducted through the submount 54 along the vias 62a, 62b, to the die attach pads 64a, 64b. The signal is then conducted to the LED 52, through the die attach pads. It is understood that in other embodiments the electrical signal can be transmitted to the LED in other ways such as through conductive traces or wire bond pads arranged in different locations in the LED package, and running between the mounting surface or the submount, and the LED.

As mentioned above, the LED packages according to the present invention are relatively small, and as LED packages become smaller less space is available for including indicators showing polarity of an LED package. These indicators can be important when manufacturing the end product utilizing the LED packages. Conventional polarity indicators can comprise marks on the top surface of the LED package or where one solder pad can be larger than the other. With smaller LED packages there can be less room for marking on the top surface, and it can also be undesirable to make on solder pad smaller than the other because of resulting increases in the danger of soldering defects.

Figure 16:
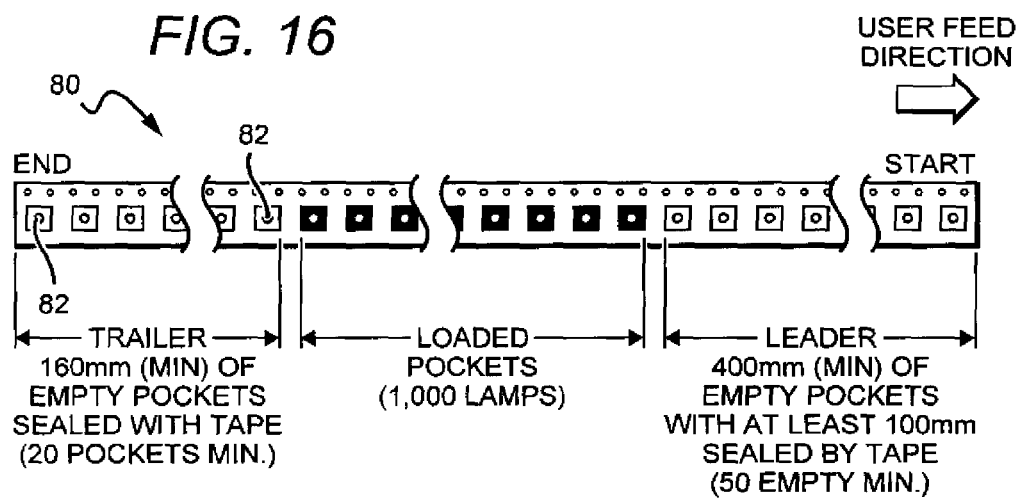
FIG. 16 is top view of a conventional LED carrier tape.

The LED packages according to the present invention provide improved structures and methods of providing polarity indication by forming one or more indication notches 66 in one of the solder pads. As best shown in FIGS. 5 and 9, V-shaped polarity indication notch can be formed along the inner edge of the solder pad 64a. This notch 66 can be detected with up-looking cameras on automated pick-and-place equipment during manufacturing. In the embodiment shown, the notch 66 is near the center of the pad's inner edge placing it near the center of the submount 54. Referring now to FIG. 16, a conventional LED package carrier tape 80 is shown that comprises holes 82 beneath each of the LED packages it carries. The notch 66 in FIGS. 8 and 9 is in the area of the submount 54 near the center that can be visible through hole 82 in the carrier tape 80. This allows for the notch (and the corresponding LED package polarity) to be visible and verified carrier tape hole 82 without removing the LED package from the carrier tape 80.

The notch 66 can have many different shapes beyond V-shaped, such as U-shaped, I-shaped, W-shaped, square shaped, rectangular shaped, star shaped, plus shaped, minus shaped, etc. The notch can also be included in many different locations on the solder pads 60a, 60b as further described below, and can similarly be detected by the camera of conventional pick and place equipment. It is noted that other types of polarity indicators can be used, such as holes of different shapes or other cutouts in the solder pads, and in other embodiments the LED packages can have indicators in other locations, such as on the submount 54.

Referring again to FIGS. 4 through 9, some embodiments according to the present invention can also comprise polarity indicators on the top surfaces of the LED package 50. In the embodiment shown, the second attach pad 64b can have a plus (+) indicator 68 to show polarity when viewing the LED package 50 from the top. These indicators can take many different shapes and sizes such as those described above, and in some embodiments can comprise notches or holes as described above. As also mentioned above, for LED packages of the size shown in the attached figures and described herein, there may be limited space for top polarity indicators, and manufacturing devices may need to rely on the bottom polarity indicators.

Figure 1:
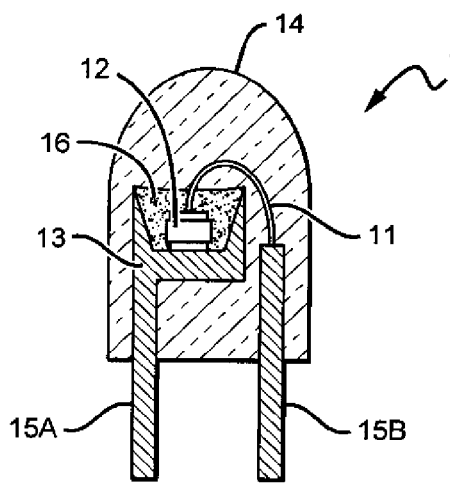
FIG. 1 shows a sectional view of one embodiment of a prior art LED package.
Figure 2:
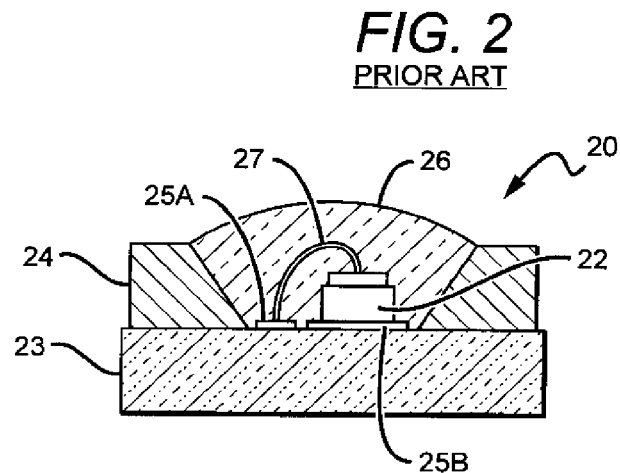
FIG. 2 shows a sectional view of another embodiment of a prior art LED package.
Figure 3:
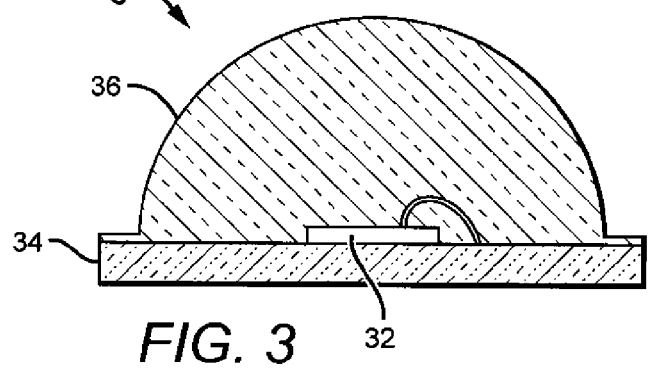
FIG. 3 shows a sectional view of still another embodiment of a prior art LED package.
Figure 4:
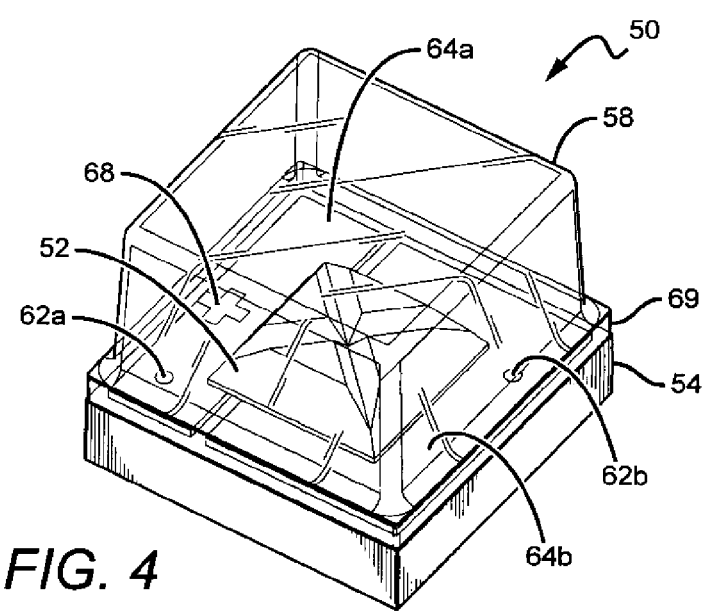
FIG. 4 is a top perspective view of one embodiment of an LED package according to the present invention.
Figure 12:
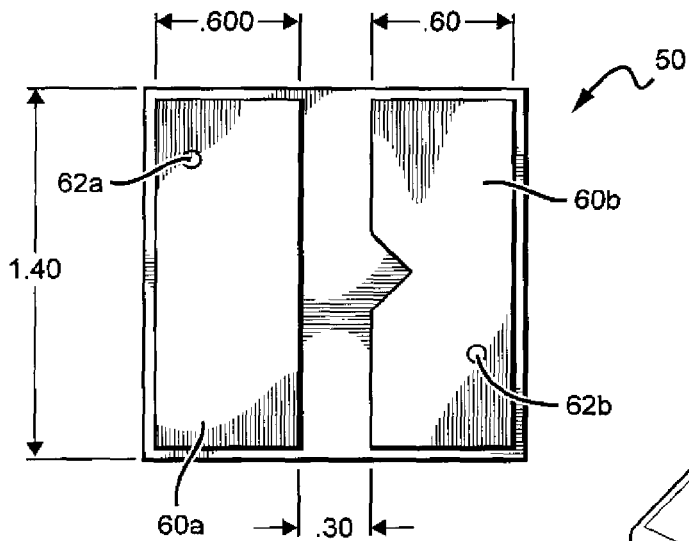
FIG. 12 is another top view of the LED package shown in FIG. 4 showing one embodiment of its dimensions.
Figure 13:
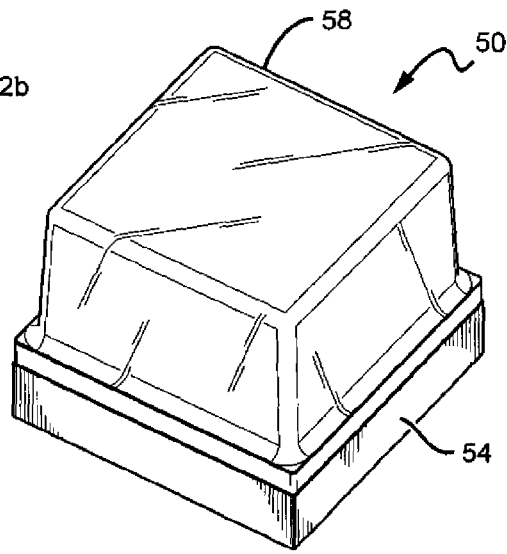
FIG. 13 is another perspective view of the LED package shown in FIG. 4.
Figure 15:
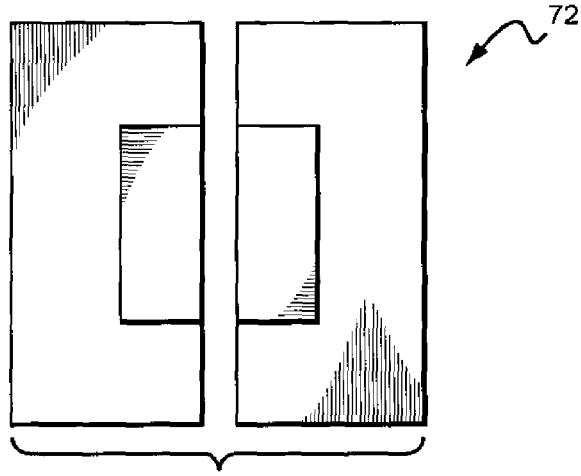
FIG. 15 shows one embodiment of a trace layout that can be used with LED packages according to the present invention.
Figure 14:
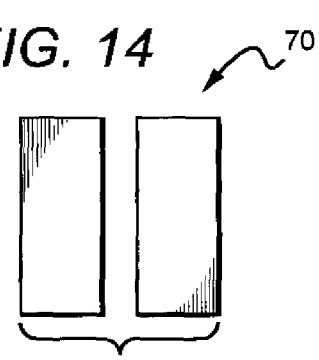
FIG. 14 shows one embodiment of a solder pad that can be used with LED packages according to the present invention.

Referring to FIGS. 10 and 13, the LED package 50 is shown without the submount 54 being visible through the encapsulant 58. This is done for ease of illustration, but it is understood that some embodiments according to the present invention can have an encapsulant that is not transparent for different reasons. In some embodiments the encapsulant can have phosphors and/or scattering particles dispersed throughout or in particular locations in the encapsulant. This can make the encapsulant either partially or fully opaque. FIG. 14 shows one recommended solder pad for the some LED packages according to the present invention, and FIG. 15 shows the recommended trace layout.

As mentioned above, conventional knowledge in art was that TIR of LED light resulting from the planar surfaces of the encapsulant would result in significant reduction in LED package emission efficiency. This is particularly true for LED packages with vertical planar surfaces. It was thought that the TIR light would encounter light absorbing features of the LED package and would result in significant percentage of light being absorbed. This conventional knowledge focused LED packages providing encapsulants that minimize TIR, such as hemispheric encapsulants. The focus was also on providing package light sources near the center of the base of the encapsulant to simulate a point source near the center. However, by providing a blanket conversion material layer over the top surfaces under the encapsulant 58, including on the LED 52, areas of the die attach pads 64a, 64b around the LED 52, and the top surface of the submount 54 exposed around the LED 52 and the attach pads 64a, 64b, this expected efficiency loss can be minimized or eliminated.

Figure 17:
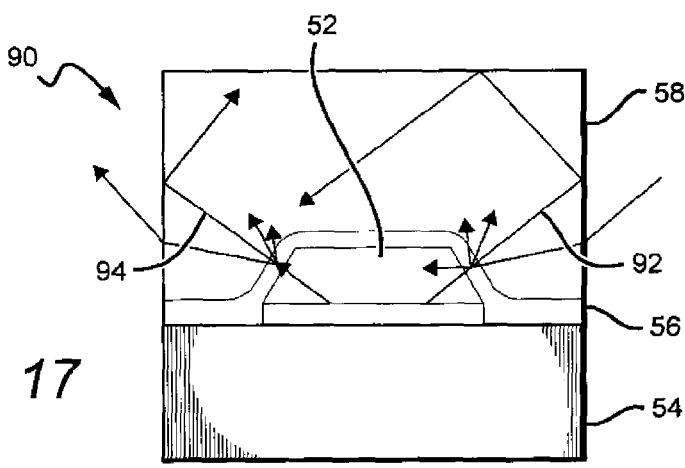
FIG. 17 is a sectional view of one embodiment of and LED package according to the present invention.

Referring now to FIG. 17, an exemplary LED package 90 according to the invention is shown with sample blue and yellow light traces 92, 94. The LED package 90 comprises many of the same or similar features to those in LED package 50, and for those features the same reference numbers will be used herein. The LED package 90 comprises and LED 52, submount 54, conversion material layer 56, and an encapsulant 58. The LED package 90 can be arranged to emit different colors of light, and in the embodiment shown the LED chip 52 emits blue light, and the conversion material layer 56 comprises a conversion material that converts blue light to yellow light. Referring to the blue light trace 92, a portion of the blue light passes through the conversion material layer 56 and experiences TIR when it reaches the surface of the encapsulant 58. Other portions of the blue light 92 pass out of the encapsulant to contribute to emission from the LED package.

The blue TIR light reflects within the encapsulant and is eventually directed back toward the submount 54. Instead of reaching a light absorbing portion of the LED package, the TIR reaches the conversion material layer 56. This blue light has already passed through the conversion layer 56, and following TIR the blue LED light encounters the conversion material layer a second time. This can be referred to as "recycling" of the blue light that results in illumination of the top surface of the conversion material layer 56 such that both sides of the layer are illuminated by blue light during operation. The conversion material layer 56 provides a "blanket" effect that helps limit both blue and yellow light from re-entering the chip or hitting absorbing regions. When the blue light 92 hits the conversion material layer 56 a second time, all or a portion of the light will be scattered or absorbed by the conversion material in the layer and re-emitted as yellow light. The re-emission will be omnidirectional or isotropic such that a portion of the TIR light will be redirected so that it emits from the LED package. This omnidirectional reemission amounts to scattering of otherwise TIR light to allow for the light to reach the encapsulant surface within the critical angle and emit from the encapsulant.

When the blue light passes through the conversion material layer the first time, a portion of the blue light is converted to yellow light as shown in light trace 94. A portion of yellow will emit from the package on its first pass, while the remainder will experience TIR. This light can also experience scattering when it encounters the phosphor material a second time, increasing the likelihood that some of the light will emit from the encapsulant and contribute to overall emission.

The result is that the TIR and recycling allows for emission efficiencies of the LED packages according to the present invention to be similar to conventional hemispheric lensed LEDs. Embodiments of the present invention have reduced concentrations of conversion material in the conversion material layer to achieve the same color point due to the recycling effect. This can allow for more blue light to pass through the phosphor on the first pass. Since typical conversion layers can scatter as well as convert blue light, a reduced thickness or concentration of conversion material on the chip can mean that less of this first-pass blue light is scattered back into the LED where it may be absorbed, thereby improving package efficiency. This first-pass blue light can then be converted and scattered when it reaches the conversion material layer 56 a second time. This scattering allows for more light to escape from the LED package, while maintaining the proper emission balance between blue and yellow light to achieve the desired color point. The different embodiments can comprise 20-30% less conversion material compared to conventional LED packages. Other embodiments can comprise 10-40% less conversion material compared to conventional LEDs. This reduction in conversion material, as well as reduced package size, can result in less costly LED packages with the same or similar emission efficiencies. This arrangement allows for smaller devices, which can also reduce costs.

Figure 18:
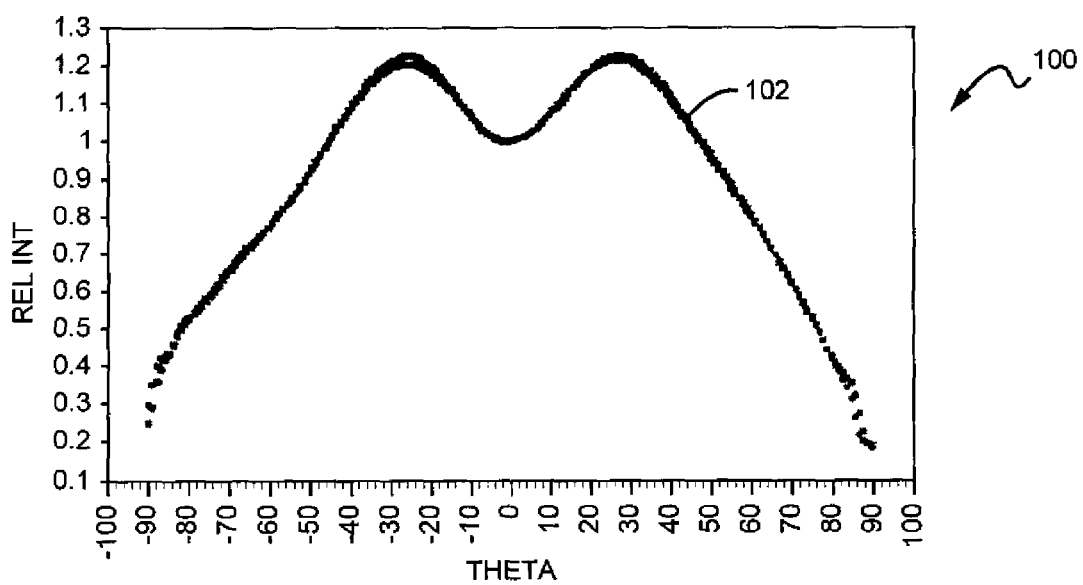
FIG. 18 is an emission profile graph for one embodiment of an LED package according to the present invention.

In some embodiments, the scattering during recycling of the light can also provide additional advantages of a broader emission profile. In most conventional LED packages the emission profile is generally Lambertian with most having an emission profile of approximately 120° FWHM or less. The scattering of light provided in the embodiments of the present invention provide more light emitting from the encapsulant at greater angles than would be experienced in a conventional lambert ion emission profile. In some embodiments, the emission profile can exceed 120 degrees FWHM, while in other embodiments it can exceed 130 degrees FWHM. In still other embodiments the emission profile can be in the range of 130 to 170° FWHM, or 130 to 160° FWHM, or 130 to 150° FWHM in other embodiments. FIG. 18 is a graph 100 showing an emission profile 102 for one embodiment of an LED package according to the present invention having and emission profile of approximately 150° FWHM. In other embodiments the emission profile can be greater than 135° FWHM, with less than 10% color variation of viewing angles of −90° to +90°.

As mentioned above, scattering materials may be added to the encapsulant to further increase the width of the emission profile and improve color uniformity with minimal impact on package efficiency. This wider emission profile allows for the LED packages according to the present invention to be particularly applicable to lighting applications needing wider angles of emission, such as area lighting. For LED lighting that relies on mixing chambers to mix light from the LED packages, the broader emission pattern can result in lighting fixtures with reduced mixing chamber depths.

Figure 19:
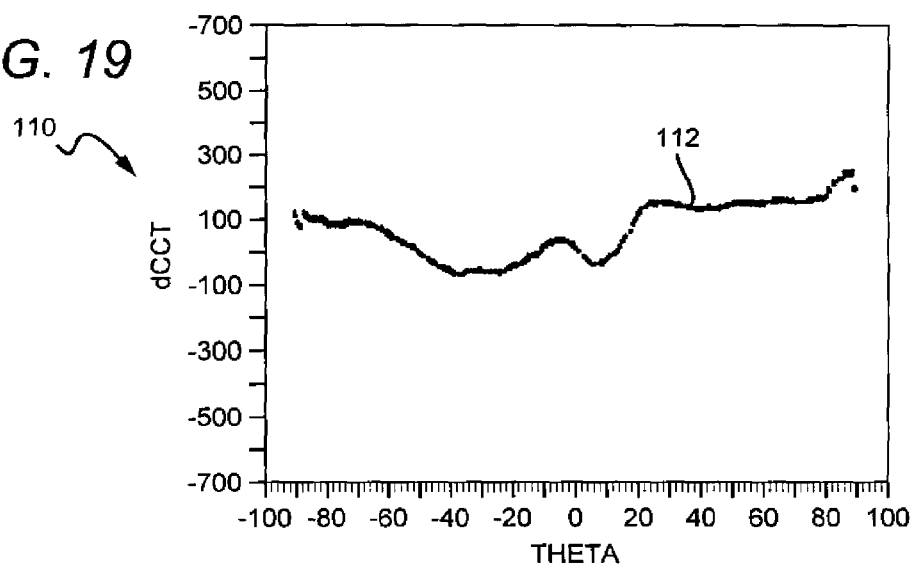
FIG. 19 is a color temperature profile graph for one embodiment of an LED package according to the present invention.
Figure 20:
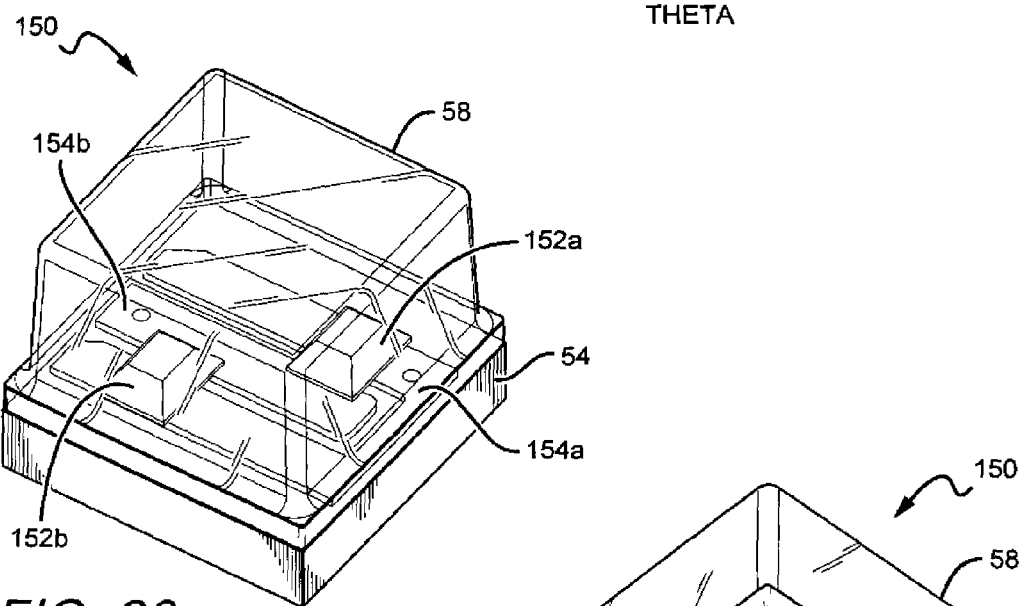
FIG. 20 is a top perspective view of one embodiment of an LED package according to the present invention.
Figure 21:
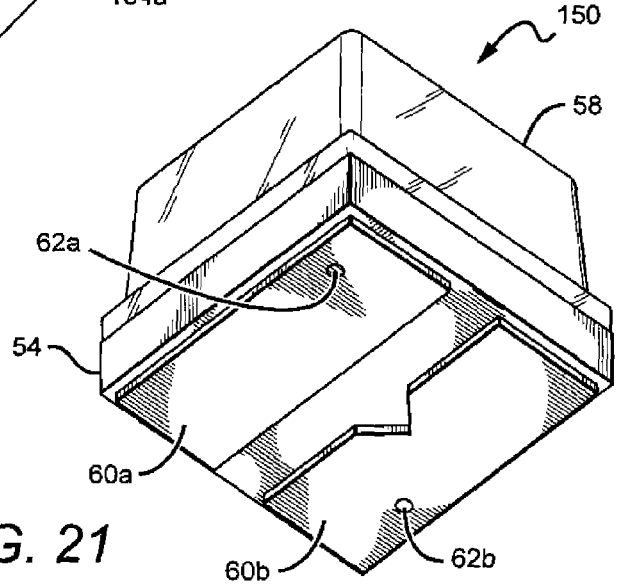
FIG. 21 is bottom perspective view the LED package shown in FIG. 20.
Figure 26:
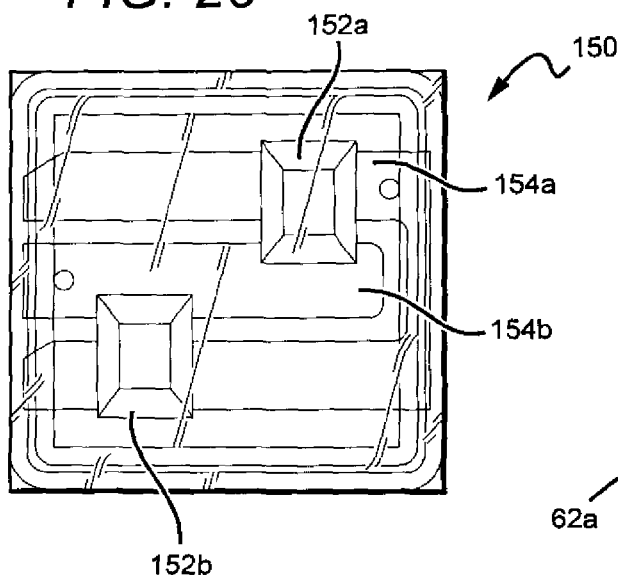
FIG. 26 is a top view of the LED package shown in FIG. 20.
Figure 27:
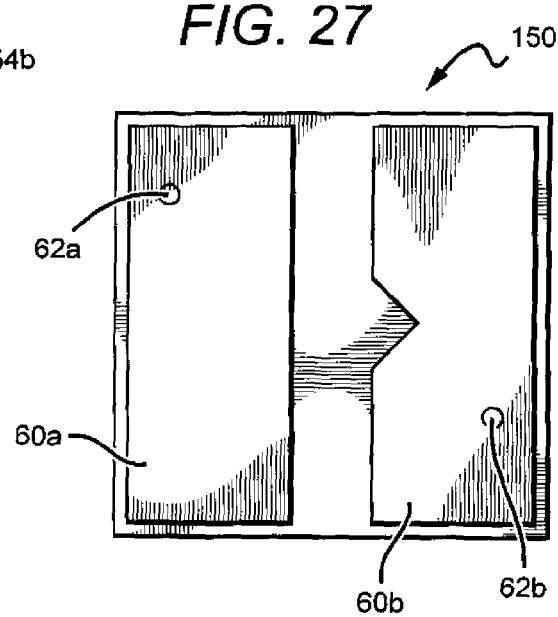
FIG. 27 is a bottom view of the LED package shown in FIG. 20.
Figure 28:
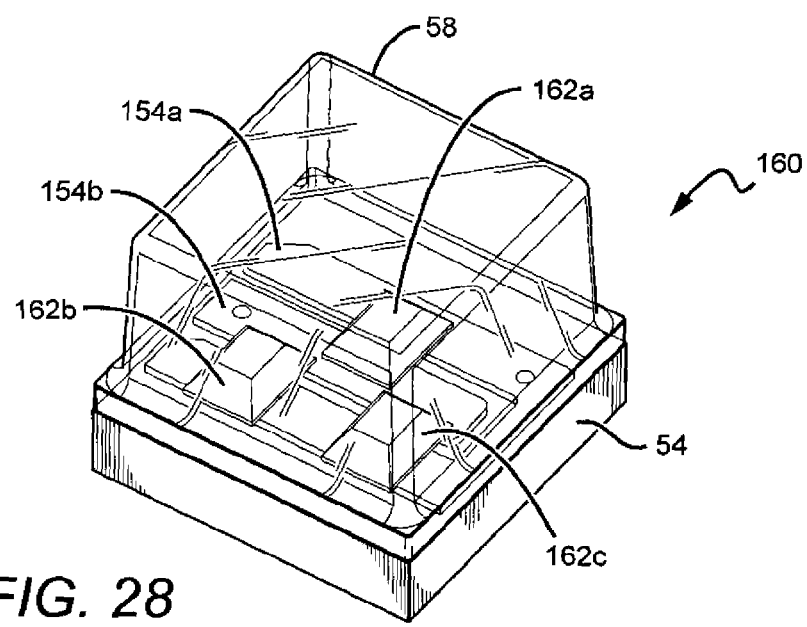
FIG. 28 is a top perspective view of one embodiment of an LED package according to the present invention.
Figure 32:
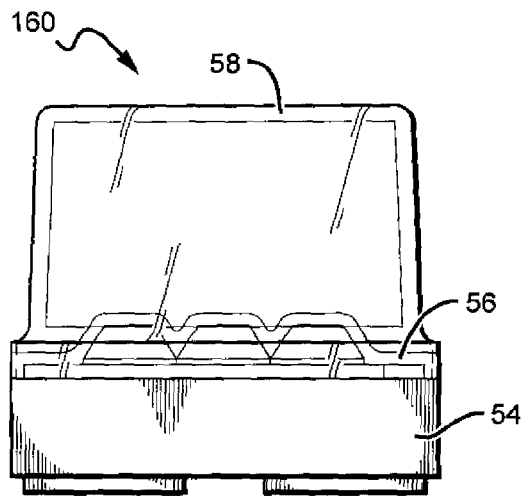
Figure 33:
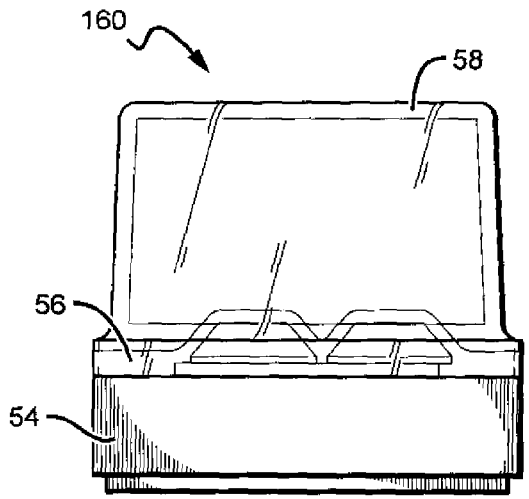
Figure 34:
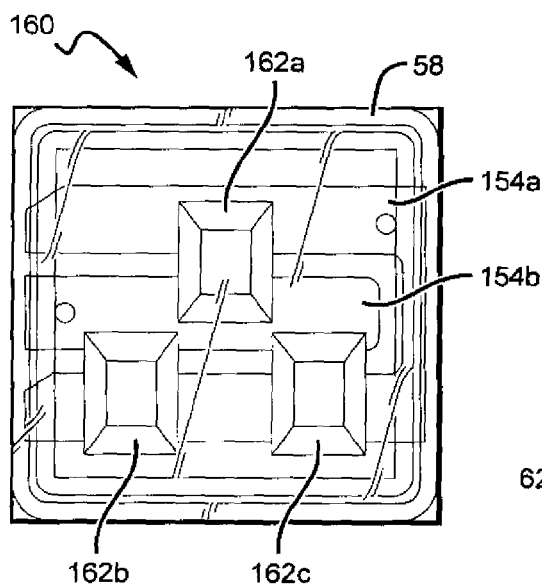
FIG. 34 is a top view of the LED package shown in FIG. 28.
Figure 35:
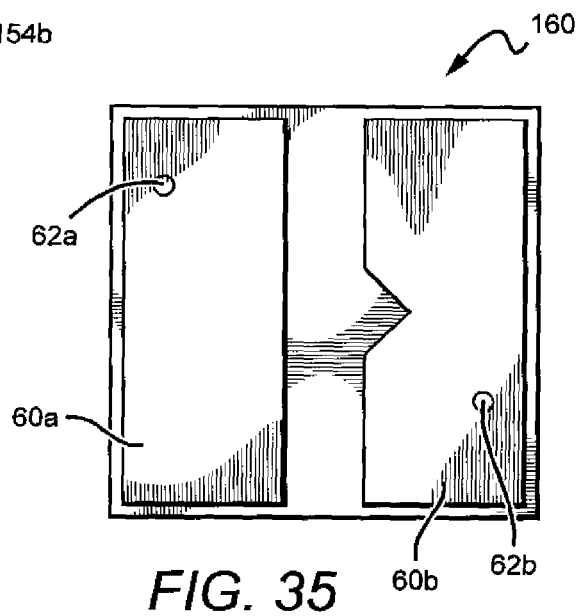
FIG. 35 is a bottom view of the LED package shown in FIG. 28.

The LED packages according to the present invention can also emit light with more uniform color emission at different viewing angles. In some embodiments, the packages and emit light with variations in color temperature of less than −400 to +400 kelvin and viewing angles of approximately −100 to +100 degrees. In still other embodiments, the variations in color temperature can be less than −300 to +300 kelvin and viewing angles of approximately −100 to +100 degrees. FIG. 19 is a graph 110 showing variations in color temperature 112 over viewing angle for one embodiment of an LED package according to the present invention. The variations over viewing angles are from −100 to +100 degrees and are generally in the range of −100 to +200 Kelvin.

The blanketing of the conversion material layer also allows the conversion material layer to act as a remote layer with good thermal spreading. That is, heat generated during the conversion process, or heat from the LED 52 that passes into the conversion material layer 56 can be spread across the conversion material layer 56. The heat can then conduct into the submount 54 and the encapsulant 58 to dissipate into the surrounding ambient. This allows for more efficient dissipation of heat compared to conventional packages having LEDs with conversion material only on the LED.

Some embodiments according to the present invention provide LED packages having smaller footprints compared to conventional LED packages with hemispheric encapsulants, while still emitting with the same or similar efficiency. In some embodiments, the LED package footprint can be less than 3 mm by 3 mm or larger, while in other embodiments it can be 2 mm by 2 mm or larger. In still other embodiments it can be 1 mm by 1 mm or larger with some embodiments according to the present invention be approximately 1.6 mm by 1.6 mm. In some embodiments, the footprint can be less than 12 mm square. In still other embodiments footprint can have an area of less than approximately 9 mm square, less than 6 mm square, or less than 4 mm square. In some embodiments the package can have a footprint area in the range of 1 to 4 mm. In some embodiments the LED package can have an approximately 1.6 mm by 1.6 mm submount, with a footprint area of approximately 2.56 mm square.

The LED packages according to the present invention can be scalable to many different larger or smaller sizes. The encapsulants in LED packages according to the present invention can extend up to the edge of the submount, while LED packages with hemispheric encapsulants can have submounts that extend beyond the edge of the encapsulant, thereby increasing the overall size of the package footprint.

The LED package according to the present invention can also provide for efficient light emission for devices with a smaller ratio of LED chip area to LED package footprint. This allows for the edge of the LED to be closer to the edge of the encapsulant to provide greater LED emission area per LED package footprint. In some embodiments, the edge of the LED chip (or LED chip array) can be approximately at or near the edge of the encapsulant such that the LED package has substantially the same footprint as the LED chips (or LED chip array). In some embodiments, the ratio of LED chip (or array) area to LED package footprint can be less than six, while in other embodiments it can be less than five. In still other embodiments it can be less than four, with some embodiments having a ratio of approximately 3.5. In one embodiment according to the present invention that is the same or similar to the LED package 50 shown in FIGS. 4 through 9 and described above, the LED chip 52 can be approximately 850 μm square, with the LED package footprint being approximately 1.6 mm square. This results in an LED chip area to LED package footprint of approximately 3.54. In some multiple LED embodiments as described below, this ratio can be less than 3.

In still other embodiments, the submount area for LED packages having a single LED as well as those having multiple LED the submount footprint can be as low as the LED area plus 2 times the conversion material layer thickness at the edge of the submount. In embodiment having a single 1 mm LED, the submount area can be as low as 1.21 mm, resulting in a ratio of LED chip area to LED package footprint of 1.21. In multiple LED chip embodiments, such as those with chips placed edge to edge, the same ratios are can be reached. Different ratios can also be achieved with submounts having different shapes. In embodiments having 16 DA240 LEDs mounted on a rectangular submount having one side length 16 time 0.240 mm plus 2 time 0.05 mm, while the other would be 16 times 0.320 mm plus 2 times 0.05 mm. The ratio the ratio of LED chip (or array) area to LED package footprint in these embodiments can be as low as approximate 1.046.

In still other embodiments, the ratio can be as high as 20 or more. In different embodiments, the ratio can fall in the range of 1 to 20, 1 to 15, 1 to 10, 1 to 5, 1 to 3, or 1 to 2. In embodiments having two DA240 LEDs on a 1.6 mm submount the ratio of LED area to submount footprint is approximately 16.67. This same improved ratio is applicable to LED packages with smaller or larger footprints. The present invention also allows for these packages to exhibit the same improved ratio, but having larger or smaller area LED chips as the case may be.

By having greater LED area for package footprint, the LED packages can be used in place of conventional LED packages, and for the same amount of area can provide greater LED emission area. In many applications, this allows for driving the same area of LED packages with a lower drive signal to achieve the same emission intensity. Similarly, the same drive current can be used, and the LED packages according to the present invention can be used to generate higher emission intensity.

The embodiments according to the present invention can also have different combinations of footprint ratio dimensions to height dimensions. In some embodiments, the ratio of footprint dimensions can be 1 by 1, with a corresponding height ratio of less than one. In some embodiments, the LED packages can have a footprint measuring 1.6 by 1.6, with a height of approximately 1.3 mm, giving dimension ratios of 1 by 1 by approximately 0.8125. In still other embodiments, the ratio of footprint to height can be approximately 1 by 1 by 1 with some embodiments having footprint measuring 1.6 mm by 1.6 mm, and having a height of approximately 1.6 mm. Other embodiments can comprise a ratio of 1 by 1 by greater than 1, and other embodiments can have a dimension of 1 by 1 by greater than 1.5. Still other embodiments can have dimensions of 1 by 1 by greater than 1.5 or greater, or 1 by 1 by 2 or greater, or 1 by 1 by 3 or greater.

Other embodiments according to the present invention can have different encapsulant heights, with this height being measured from the bottom or top surface of the submount. In some embodiments, the height of the encapsulant can be as low as 0.3 mm to as high as 5 mm or more. In still other embodiments, the encapsulant can be 2 mm high or more. In still other embodiments, it can be 1 mm high or more. It is noted that in some embodiments, the emission pattern of the packages can change with the height of the encapsulant, with some embodiments having a wider emission pattern for higher encapsulants. For example, the in embodiments having a single LED and cubic encapsulants, emission pattern for a package having a 0.625 mm high encapsulant (measured from the top surface of the submount) can have an emission pattern that is approximately 8% wider than the same package with a 0.525 mm encapsulant. For a package with a 0.725 mm encapsulant, the emission pattern width can be increased further, up to approximately 5% wide. This increased emission pattern can be realized with higher encapsulants, without significant variations in emission efficiency.

The different LED package embodiments can operate from different drive signals, with some operating from signals as low as 50 mWatts to several tens of Watts. In some embodiments, the drive signal can be in the range of 500 mWatts to approximately 2 Watts. The different embodiments can also provide different luminous flux output, with some embodiments emitting 100 lumens or more. Other embodiments can emit 110 lumens or more, while other embodiments can emit 150 lumens or more. Different embodiments can also emit different color temperatures in the range of 2000 to 6000K, with some embodiments emitting approximately 3000K and others approximately 5000K. By way of example, an LED package according to the present invention having a package footprint of 1.6 by 1.6 mm, can emit approximately 120 lumens at a temperature of 3000K. Other embodiments having the same size can emit 140 lumens at 5000K. The area for the package footprint is 2.56 mm² resulting in emission of 47 lumens/mm² at 3000K, and 55 lumens/mm² at 5000K. Different packages according to the present invention can generally emit in the range of 35 to lumens/mm². Packages that are approximately 1.6 mm tall can have a volume of approximately 4.096 mm³, resulting in operation at approximately 29.27 lumens/mm³ at 3000K and 34.18 lumens/mm³ at 5000K. Different packages according to the present invention can generally emit in the range of 20 to 45 lumens/mm³. This can vary depending on the drive signal (or drive current) but does, however, result in an operation of 115 lumens per Watt (LPW) at 3000K, and 135 LPW at 5000K. Other embodiments having different drive signals can also exhibit similar LPW operation at the same color temperature. The range of LPW for the different embodiments can generally be in the range of 100 to 150 LPW.

As discussed above, different packages according to the present invention can have more than one LED as their light source. FIGS. 20 through 27 show another embodiment of an LED package 150 according to the present invention comprising a submount 54, conversion material layer 56, encapsulant 58, solder pads 60a, 60b and conductive vias 62a, 62b. In this embodiment, the light source comprises first and second LEDs 152a, 152b mounted to first and second die attach pads 154a, 154b on the submount. The LEDs 152a, 152b can comprise many different commercially available LEDs such as those described above, with some embodiments utilizing DA350 LEDs commercially available from Cree, Inc. The LEDs 152a, 152b can have different dimensions, with some embodiments being approximately 350 μm by 470 μm.

The die attach pads 154a, 154b can be made of the same materials as described above and can be deposited using the same methods. In this embodiment the first die attach pad 154a is U-shaped and the second die attach pad 154b is elongated and is arranged between the legs of the first die attach pad 154a. A space is provided between the first and second attach pads 154a, 154b with each of the LEDs 152a, 152b mounted to the first and second attach pads 154a, 154b and each spanning the space between two. The LEDs 152a, 152b can be mounted in different locations on attach pads 154a, 154b, with the first LED 152a mounted generally in one corner of the submount 54, and the second LED mounted at the opposite corner of the submount 54. During operation, an electrical signal is applied to the solder pads 60a, 60b that is transmitted to the attach pads 154a, 154b through the vias 62a, 62b. The signal is then transmitted to the LEDs 152a, 152b causing them to emit light. The LED package operates in much the same way as LED package 50, and can have the same sizes and ratios described above.

FIGS. 28 through 35 show another embodiment of an LED package 160 according to the present invention comprising a submount 54, conversion material layer 56, encapsulant 58, solder pads 60a, 60b, conductive vias 62a, 62b, and die attach pads 154a, 154b similar to those in LED package 150 described above. In this embodiment, the LED package light source comprises first, second and third LEDs 162a, 162b, 162c with each of the LEDs mounted to the attach pads 154a, 154b across the space between the two. The LEDs can be mounted in many different locations, with first and second LEDs 162a, 162b mounted along one leg of attach pad 154a, and third LED 162c mounted along the other leg. The third LED 162c is generally aligned with the space between the first and second LEDs 162a, 162b, but it is understood that the LEDs can be mounted in relation to each other in many different ways. The LED package 160 operates in much the same way as the LEDs packages described above, and can have the same size and dimension ratios.

The LED packages 150 and 160 have multiple LEDs electrically connected in parallel, but it is understood that the LEDs can also be connected in series. For packages having a plurality of LEDs, the LEDs can be connected in different parallel and series combination. Different series connected LEDs can be separately controlled (i.e. independently addressable) and in these embodiments the submount can comprise more than two solder pads so that multiple signals can be applied to the LED chip.

As mentioned above, these LED packages can be arranged operate from different voltages including but not limited to 3V, 6V, 12V or 24 v. The packages may also have chips connected in series or parallel, and emit different colors of light beyond white, such as blue, green, red, red-orange, etc. Each of these can be multiple chip embodiments coupled together in different ways. Some embodiments can emit one of these colors of light and can comprise 2 or 3 LEDs coupled together in parallel and operating from a 3V signal. Other embodiments can comprise 2 LED coupled in series such that the LED package operated from a 6V signal. Both these can be formed on different submounts, such as those made of alumina. Other embodiments can comprise 4 LED chips in series that are arranged to operate from 12V. These embodiments can be on submounts made of different material such as aluminum nitride (AlN) or sapphire (Al₂O₃). Still other embodiments can comprise four LEDs emitting the same color (e.g. red) and coupled two parallel strings of two LEDs in series. These embodiments can be arranged to operate from a 6 v signal and can be on submounts such as alumina.

FIG. 36 shows one embodiment of a submount 170 according to the present invention with first, second and third die attach pads 172a, 172b, 172c, first and second conductive vias 174a, 174b, and first and second LEDs 176a, 176b. Many different commercially available LEDs can be used such as the DA350 LED chip described above. In this embodiment, the first attach pad 172a is connected to the first conductive via 174a, and the third die attach pad 172c is connected to the second conductive vias 174b. The second die attach pad 172b is not connected to a vias. The first LED 176a is mounted across the first and second attach pads 172a, 172b, and the second LED 176b is connected across the second and third die attach pads 172b, 172c. This results in a series connection of the first and second LEDs 176a, 176b, with an electrical signal on the first vias 174a conducting into the first die attach pad 172a, then through the first LED 176a, then into the second die attach pad 172b, then through the second LED 176b, and finally into the third die attach pad 172c. Using 3 volt LEDs, this embodiment can utilize a 6 volt drive signal, but the drive voltage can be different depending on the LED voltage.

FIG. 37 shows another embodiment a submount 180 that is similar to the submount 170 shown in FIG. 36 and comprises first, second and third die attach pads 182a, 182b, 182c, first and second conductive vias 184a, 184b, and first through sixth LEDs 186a, 186b, 186c, 186d, 186e, 186f. The first through third LEDs 186a, 186b, 186c are mounted across the first and second attach pads 182a, 182b, and the fourth through sixth LEDs 186d, 186e, 186f are mounted across the second and third die attach pads 182b, 182c. This results in a series/parallel connection of the LEDs with the first group of first through third LEDs 186a, 186b, 186c connected in parallel the second group of fourth through sixth LEDs 186d, 186e, 186f also mounted in parallel. The first and second groups are connected in series. An electrical signal on the first vias 184*a* conducting into the first die attach pad 182*a*, then through the first group, then into the second die attach pad 182*b*, then through the second group, and finally into the third die attach pad 172*c*. Using 3 volt LEDs, this embodiment can utilize a 6 volt drive signal, but this can be different as mentioned above.

FIG. 38 shows still another embodiment of and submount 190 having a die attach pattern 192 that can be used to connect up to six LEDs (not shown) in series, with each of the LEDs being mounted across the space between adjacent elements of the pattern 192. This embodiment can have a drive signal of up to approximately 18 volts for 3 volt LEDs. This drive signal can be less for LED packages having fewer than six LEDs or when using lower voltage LEDs, and can be more if using higher voltage LEDs. FIG. 39 shows another embodiment of an submount 200 having first and second interdigitated U shaped die attach pads 202*a*, 202*b* that are arranged for the mounting of up to 6 LEDs, although the submount can also hold fewer LEDs. Each of the LEDs is mounted across the space between the first and second attach pads 202*a*, 202*b* so that the LEDs are connected in parallel such that a drive signal of 3 volts can be used. Like above, this drive signal can be higher or lower depending on voltage for the particular LED being used. The embodiments in FIGS. 38 and 39 can use different LEDs such as DA350 LEDs described above. In this arrangement on a LED package with a footprint of 1.6 mm by 1.6 mm, the chip area to footprint ratio can be below 3 and in some embodiments approximately 2.59.

Other embodiments can be arranged to hold even more LEDs. FIG. 40 shows still another embodiment of and submount 210 having a die attach pattern 212 that can be used to connect up to sixteen LEDs (not shown) in series, with each of the LEDs being mounted across the space between adjacent elements of the pattern 192. In embodiments utilizing 3 volt LEDs, a 48 volt drive signal can be used. Like above, this driver signal can be higher or lower, depending on the voltage and number of LEDs mounted to the submount. FIG. 41 shows still another embodiment of an submount 220 comprising a first U-shaped attach pad 222*a*, interdigitated with a second W-shaped attach pad 222*b* such that up to 16 LEDs can be connected in parallel. As with the embodiment above, each of the LEDs can be mounted across the space between the first and second attach pads 222*a*, 222*b*. Using 3 volt devices, this package can utilize a 3 volt drive signal, with this signal being higher or lower as discussed above. The embodiments in FIGS. 40 and 41 can use different LEDs as described above. The embodiment shown is particularly arranged for using DA240 LEDs commercially available from Cree that have an area of 240 μm by 320 μm. In a package with a 1.6 mm by 1.6 mm footprint, the chip area to package footprint ratio can be approximately 2.13, but it is understood that the ratios mentioned herein could be different depending on a number of factors, such as the size of the LEDs, the number of LEDs, size of the submount, etc.

It is noted that the LED in multiple LED package embodiments, it may be advantageous to place the LEDs as close as possible to the edge of the submount. This may be particularly true when using the LED packages in a linear arrangement such as in a LED based fluorescent lighting tube arrangement. For example, for the two LED embodiments described herein, it may be advantageous to place the LEDs at opposing corners on the submount.

As mentioned above, the encapsulant can be formed in the LED packages according to the present invention using different methods, with some embodiments using different molding processes. One such molding process is referred to as compression molding wherein a mold is provided having a plurality of cavities each of which has an inverted shape of the lens. FIG. 42 shows one embodiment of a mold 230 with a plurality of cavities 232. During molding of the lenses, a submount panel is provided that can have an area approximately the same as that covered by the cavities 232. It is understood that submounts covering less than all the cavities can also be used. The submount panel can comprise a plurality of LEDs (or sets of multiple LEDs) and each of the cavities 232 is arranged to align with a respective one of the LEDs (or a set of LEDs) on the submount panel. The mold is loaded with an encapsulant material in liquid form filling the cavities, with some embodiments utilizing a liquid curable silicone. The submount panel can be moved toward the cavity with each of the LEDs (or set of LEDs) being embedded in the liquid silicone within one of the respective cavities. The liquid silicone can then be cured using known curing processes. The panel can then be removed from the mold and the panel can comprise a plurality of encapsulants in the shape of the cavities, each of which is over a respective one of the LEDs. The individual LED packages can then be separated or singulated from the submount panel, using known techniques.

Referring again to the embodiment described above, and in particular the LED package 150 shown in FIGS. 4 through 13, a small encapsulant connection section 69 is provided at the base of the encapsulant 58. This is a byproduct of the molding process. The cavities in the molding process may not extend to the top surface of the submount 54, thereby leaving the encapsulant section between adjacent ones of the LED packages. The singulation process cuts through the connection section 69 and the submount 54 when separating the LED packages.

It is understood that other fabrication processes can be used with one such process comprising covering of a submount panel and its LEDs with a layer of encapsulant material. The individual LED packages can then be separated by different methods such as dicing or cutting through the encapsulant and submount. The resulting packages can have encapsulant side surfaces that are approximately vertical and aligned with the edges of the submount. In still other embodiments, the encapsulants can be separately molded and then attached to the submount over phosphor conversion material layer. It is understood that the surfaces of the encapsulants can be smoothed or further shaped using different methods, such a cutting, grinding, sanding or etching.

As mentioned above, embodiments according to the present invention can have relatively smooth planar surfaces to enhance TIR. The surfaces should be smooth enough such that the LED is clearly visible through the encapsulant. Stated differently, there is little or no roughness on the surface of the encapsulant to obscure or redirect the light rays passing through the encapsulant. In some embodiments where there is some texturing, roughness or imperfections on the surfaces of the encapsulant, either intentionally included or the result of manufacturing processes. For these embodiments, it can be preferable that these surface features be of the size that does not significantly scatter light. In some embodiments, surface features of sizes having a root mean square (RMS) close to or greater than the wavelength of light encountering the surface. Feature sizes having an RMS greater than the wavelength of light tend to scatter less light, while feature sizes having an RMS less than the wavelength of light tend to scatter more of the light. For embodiments where blue light encounters the surface, the surface features can have an RMS of or greater than approximately 500 nanometers, to minimize scattering. This RMS value can change depending on the wavelength of light encountering the encapsulant surface.

FIGS. 43 through 46 show another embodiment of an LED package 240 according to the present invention having approximately vertical side surfaces 242 that are approximately aligned with the edges of the submount 244. This embodiment also has a polarity indicator that comprises a notch 246 in the corner of the solder pad 248. Again, this is only one of the many different types of polarity indicators that can be included in the embodiments of the present invention.

Figure 47:
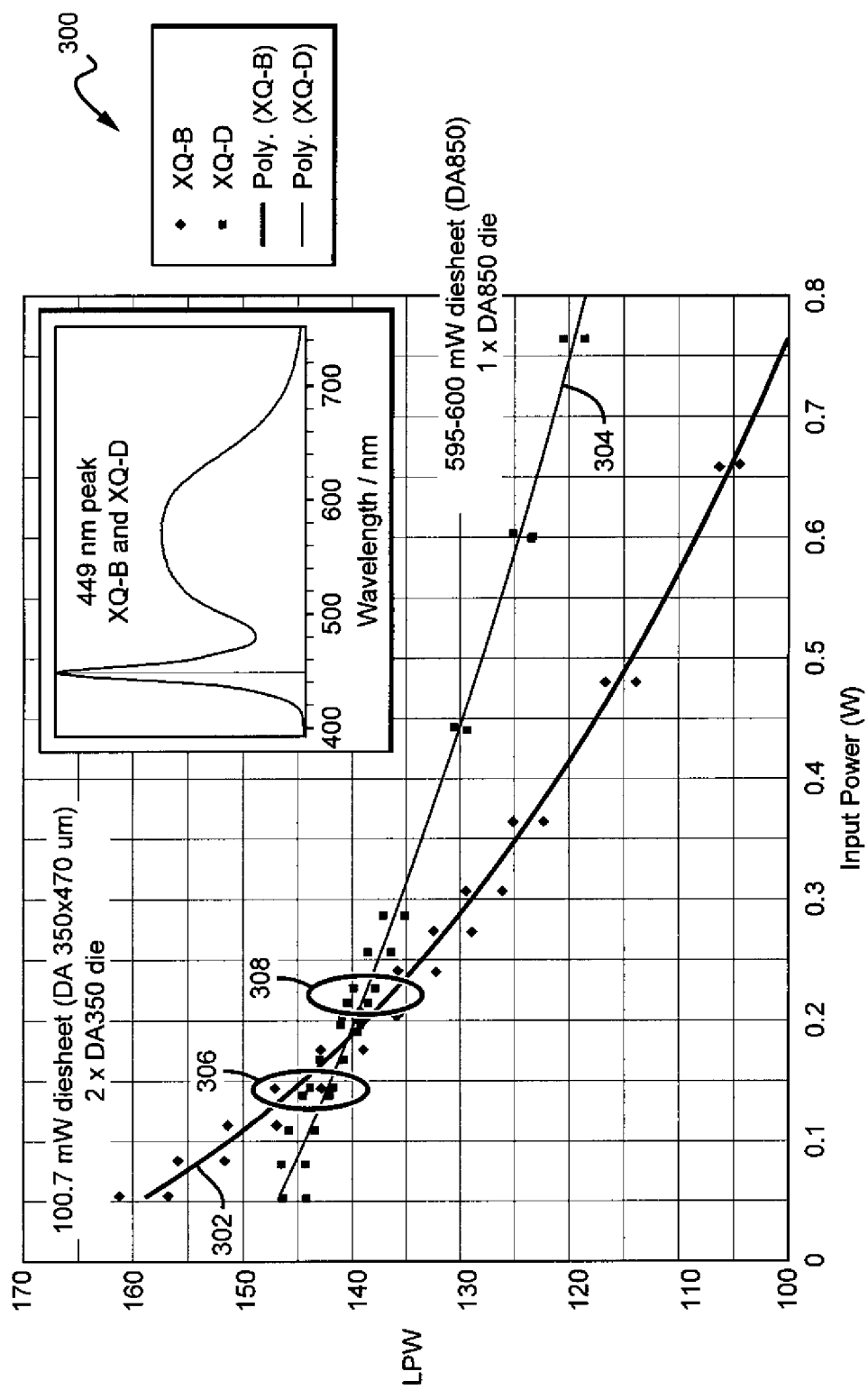
FIG. 47 is a graph showing performance characteristics for LED based fluorescent replacement tubes according to the present invention.
Figure 48:
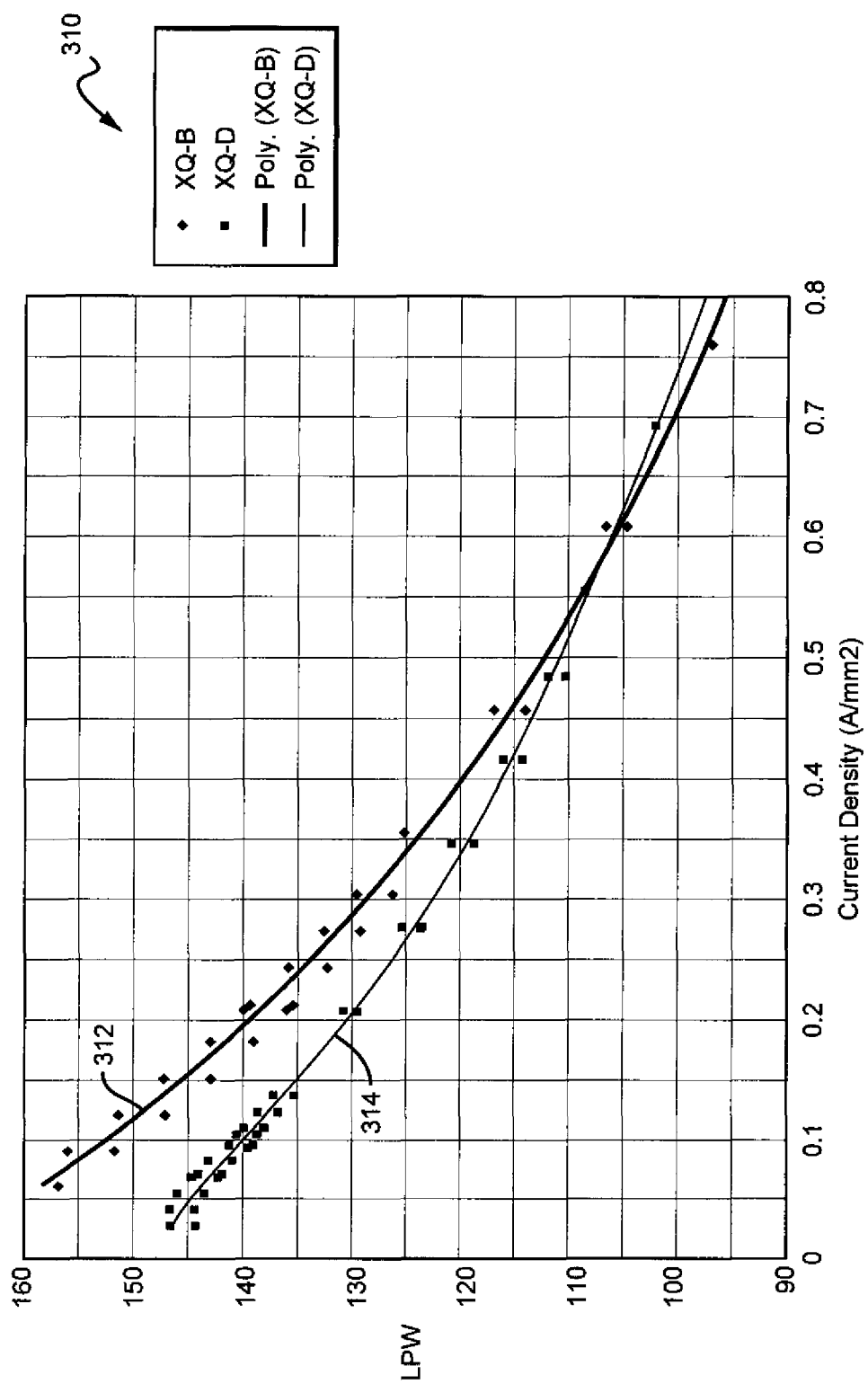
FIG. 48 is another graph showing performance characteristics for LED based fluorescent replacement tubes according to the present invention.

The LED packages can also be used in many other lighting applications such as LED displays, LED street lighting, residential LED downlighting, etc. Some LED package embodiments of the present invention are particularly applicable to fluorescent tube replacement LED lighting with the emission pattern of the LED packages being desirable for linear arrays such as those used in fluorescent tube replacements. FIG. 47 is graph 300 showing the first and second plots 302, 304 with the first plot 302 showing performance (lumens per watt verses input power) of LED package embodiments according to the present invention that have 2 LEDs and whose emission pattern can be desirable for fluorescent replacement tubes. The LED package can include many different LEDs with some embodiments comprising two DA350 LEDs as described above. The second plot 304 shows performance (lumens per watt verses input power) of a second LED package according to the present invention that have a single LED and whose emission pattern may also be desirable. Many different single LEDs can be used, such as one DA850 as described above. The first and second highlighted portions 306, 308 show operating performance for these devices as might be found in 21 watt and a 31 watt fluorescent replacement tube operation, respectively. FIG. 48 is a graph 310 also showing first and second plots 312, 314, with plot 312 showing additional performance (lumens per watt verses current density) data for a the first LED package, and plot 314 showing the performance data for the second LED package.

The LED packages can be arranged with many different features beyond those described above. Some embodiments can comprise electrostatic discharge (ESD) protection elements or devices. Others of the LED packages can be arranged with secondary optics to further shape the package beam profile.

Figure 49:
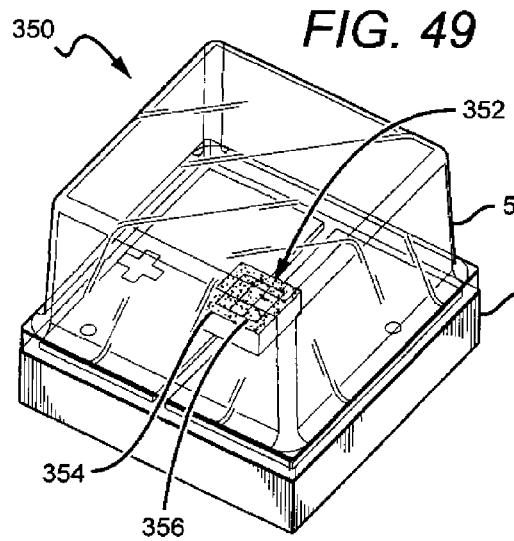
FIG. 49 is a top perspective view of another embodiment of an LED package according to the present invention.
Figure 50:
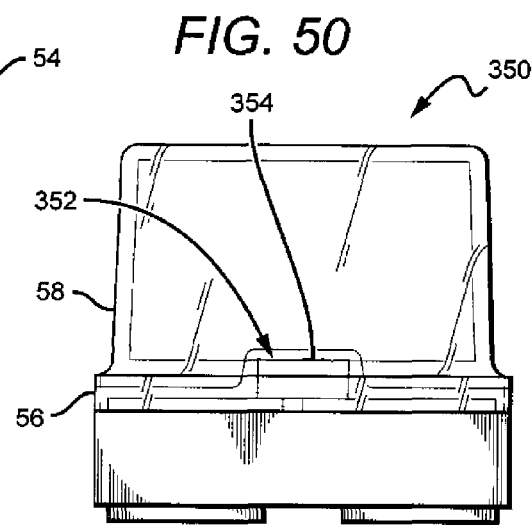
FIG. 50 is a side view of the LED package shown in FIG. 49.

LED packages according to the present invention can comprise one or more LEDs that can have many different shapes and sizes beyond those described above, and can have many different features. FIGS. 49 and 50 show another embodiment of an LED package 350 according to the present invention that is similar to the LED package 50 shown in FIGS. 4-9 and described above. The LED package 350 comprises a submount 54, encapsulant 58 and conversion material layer 58. These elements are similar to corresponding elements described above and can comprise the same materials arranged as described above. In this embodiment, however, comprises an LED 352 can comprise features to enhance light extraction such as a textured top surface 354. Each of LEDs 352 can also comprise a current spreading structure 356 to spread current into the top surface of the LED 352. In some embodiments, wire bonds (not shown) can be included for conducting an electrical signal from the die attach pads or conductive traces on the submount, to the current spreading structure.

Many different LEDs can be used for the first LED 352, with some embodiments utilizing commercially available LEDS such as those in the EZ family of LEDs from Cree, Inc. These LEDs 352 provide a textured top surface that is generally parallel to the top surface of the encapsulant 58, and side surfaces that are generally parallel to the side surface of the encapsulant 58, although in other embodiments these surfaces can be oblique to their corresponding surfaces. It is understood that other surfaces of the LEDs 352 can be textured and that for all surfaces different features can be included that enhance light extraction. It is understood that LEDs 352 can be included in many different LED packages arranged in different ways, with some embodiments having horizontal and vertical planar surfaces as described above.

Figure 51:
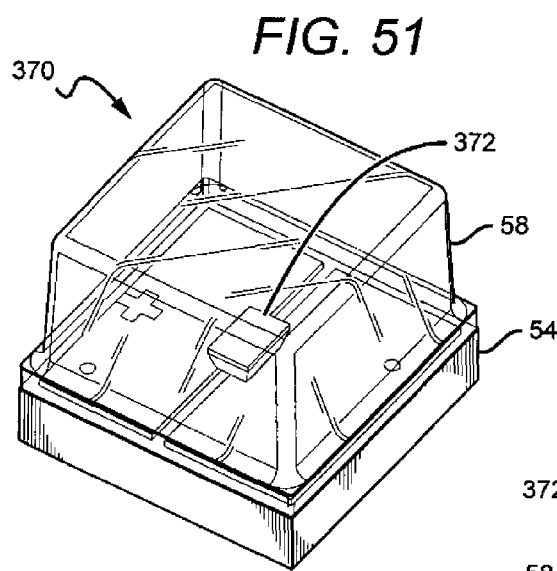
FIG. 51 is a top perspective view of another embodiment of an LED package according to the present invention.
Figure 52:
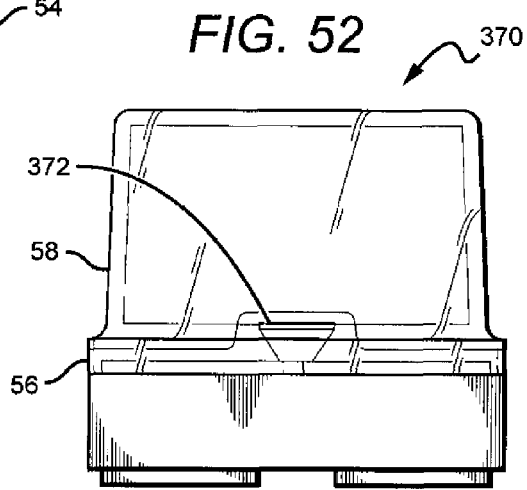
FIG. 52 is a side view of the LED package shown in FIG. 51.

FIGS. 51 and 52 show another embodiment of an LED package 370 according to the present invention comprising a submount 54, with a conversion material layer 56 and an encapsulant 58. This embodiment comprises an LED 372 having can be rectangular shaped footprint with side surfaces that are at least partially angled such that the at least part of the side surfaces are oblique to the side surface of the encapsulant 58. In this embodiment the LED side surfaces are angled such that the lower portion of the LEDs 372 is smaller than the upper portion. This results in the distance from the side surface of the encapsulant 58 increasing moving down the side surface of the LEDs 372. Many different LEDs can be used with a rectangular footprint, such as those commercially available from Cree, Inc., under its TR family of LEDs. These LEDs 372 can be used in many different LED packages shapes and arranged as described above, including those with encapsulants having horizontal and vertical sidewalls.

FIGS. 53 and 54 show an LED package 390 according to the present invention having a submount 54, conversion material layer 56 and an encapsulant 58. Further comprises an LED 392 having a square shaped footprint with side surfaces that are at least partially angled such that the at least part of the side surfaces are oblique to the side surface of the encapsulant 58. Like the embodiment above, the LED side surfaces are angled such that the lower portion of the LEDs 392 is smaller than the upper portion. This results in the distance from the side surface of the encapsulant 58 increasing moving down the side surface of the LEDs 392. Many different LEDs can be used for the LEDs 392, such as those commercially available from Cree, Inc., under its Ultra Thin family of LED chips.

FIGS. 55 and 56 show another embodiment of an LED package 410 according to the present invention also comprising a submount 54, a conversion material layer 56 and an encapsulant 58. The LED package 410 further comprises LED 412 that has a generally square footprint and side and top surfaces that are generally parallel to the side and top surface of the encapsulant 58. Many different types of LEDs can be used with this footprint and shape, such as those having a substrates made out of insulating materials such sapphire. The LEDs 412 can also comprise other features, such as wire bonds or light extraction features (not shown). These LEDs can also be used in different types of LED packages such as those with planar side and top surfaces.

Figure 57:
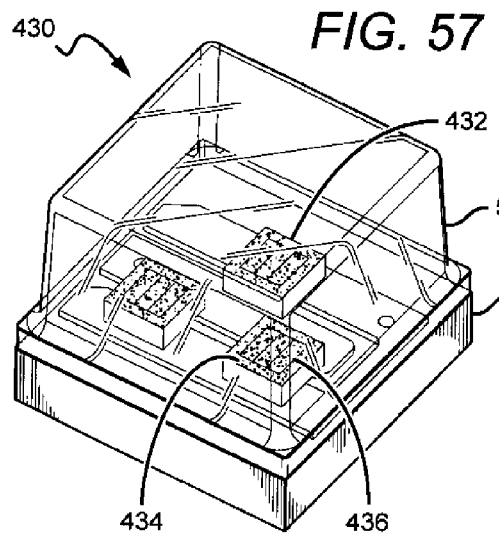
FIG. 57 is a top perspective view of another embodiment of an LED package according to the present invention.
Figure 58:
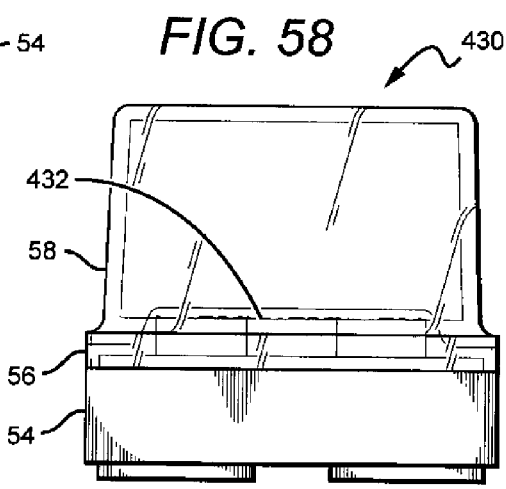
FIG. 58 is a side view of the LED package shown in FIG. 57.
Figure 59:
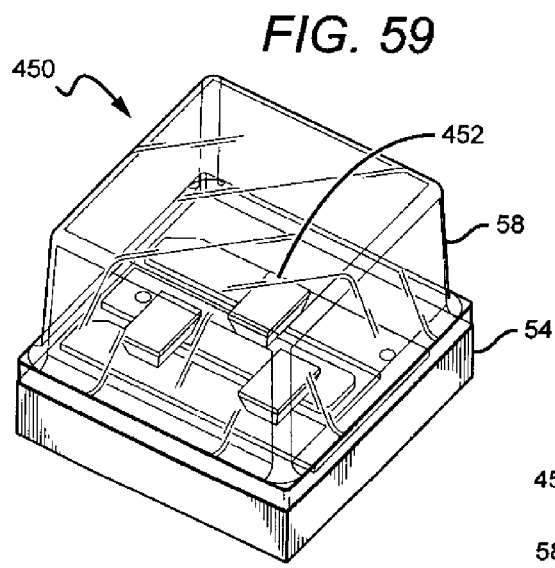
FIG. 59 is a top perspective view of another embodiment of an LED package according to the present invention.
Figure 60:
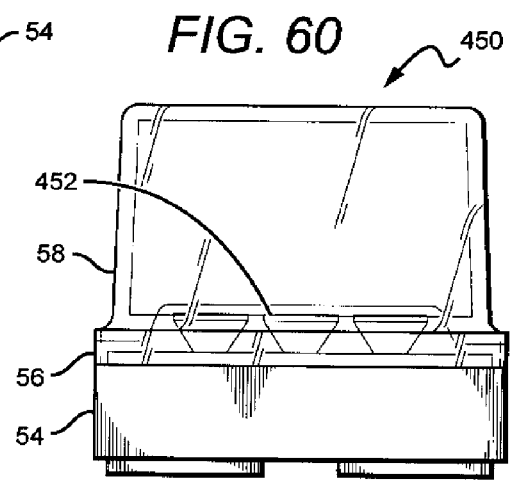
FIG. 60 is a side view of the LED package shown in FIG. 59.
Figure 61:
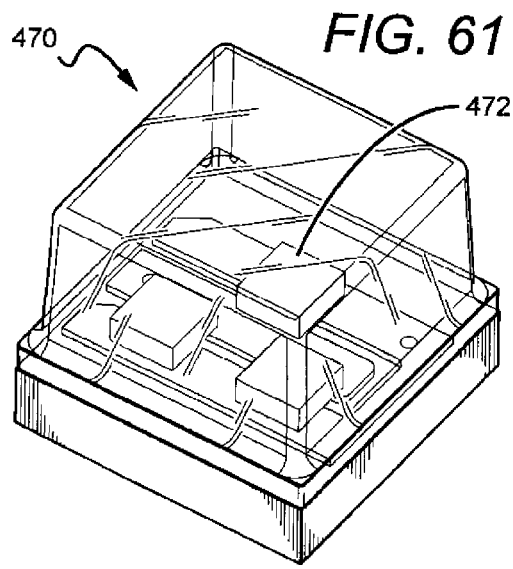
FIG. 61 is a top perspective view of another embodiment of an LED package according to the present invention.
Figure 62:
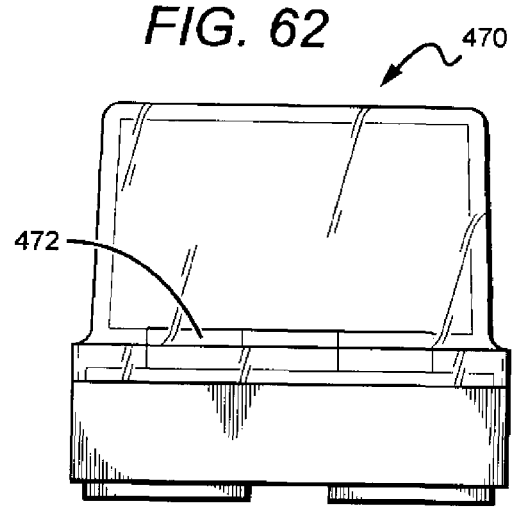
FIG. 62 is a side view of the LED package shown in FIG. 61.

It is further understood that different types of LEDs can be used in different package embodiments having multiple LEDs, and the packages can have different numbers of LEDs arranged in different ways. FIGS. 57 and 58 show another embodiment of an LED package 430 according to the present invention that is similar to the LED package 160 shown in FIGS. 28-33 and described above. The LED package comprises a submount 54, an conversion material layer 56 and an encapsulant 58. LED package 430 comprises three LEDs 432, each of which can be similar to the LED 325 shown in FIG. 49 and described above. Each of the LEDs can comprise a textured top surface 434 and a current spreading structure 436, and each can emit the same or different wavelengths of light. FIGS. 59 and 60 show another embodiment of an LED package 450 with three LEDs 452 that are similar to the LED 392 shown in FIGS. 53 and 54, and FIGS. 61 and 62 show still another embodiment of an LED package 470 according to the present invention having three LEDs 472 that are similar to LED 412 shown in FIGS. 55 and 56.

Figure 63:
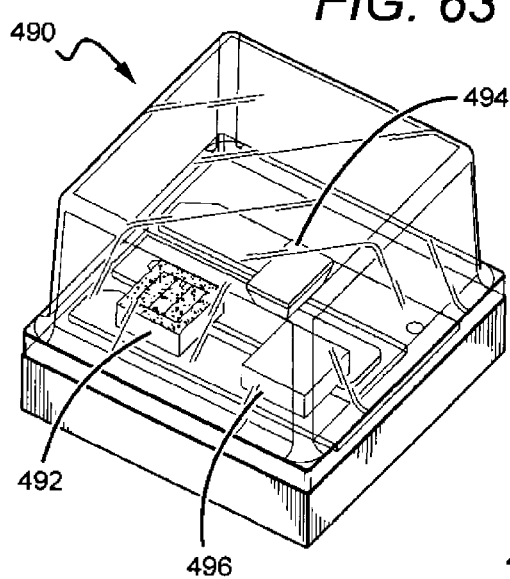
FIG. 63 is a top perspective view of another embodiment of an LED package according to the present invention.
Figure 64:
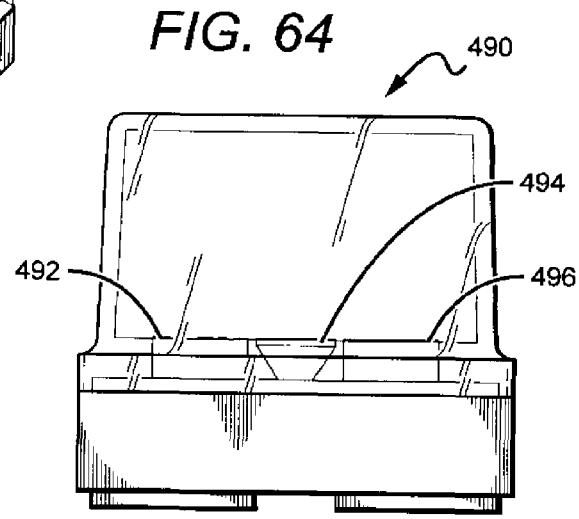
FIG. 64 is a side view of the LED package shown in FIG. 63.
Figure 65:
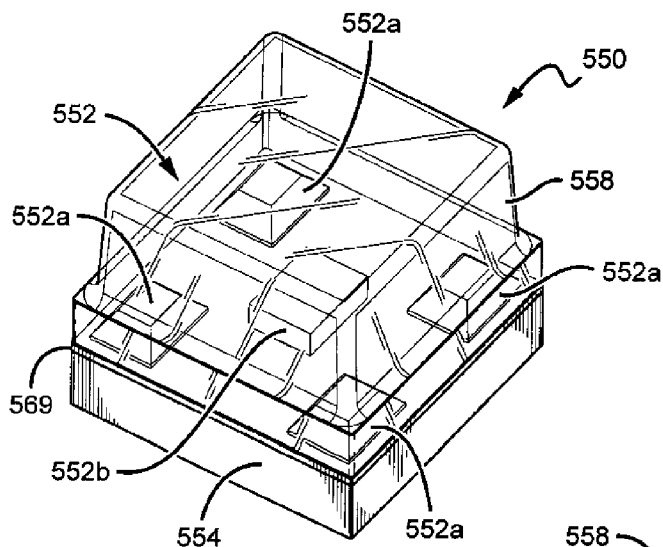
FIG. 65 is a top perspective view of one embodiment of an LED package according to the present invention.
Figure 66:
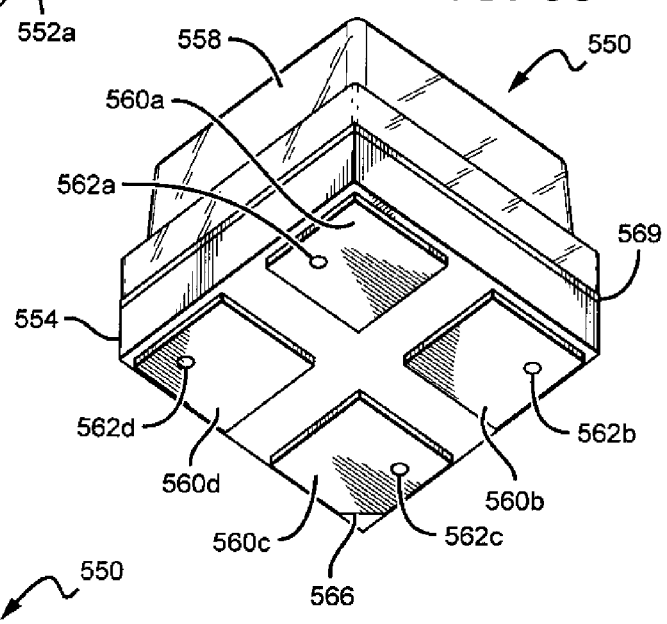
FIG. 66 is a bottom perspective view of the LED package shown in FIG. 65.
Figure 67:
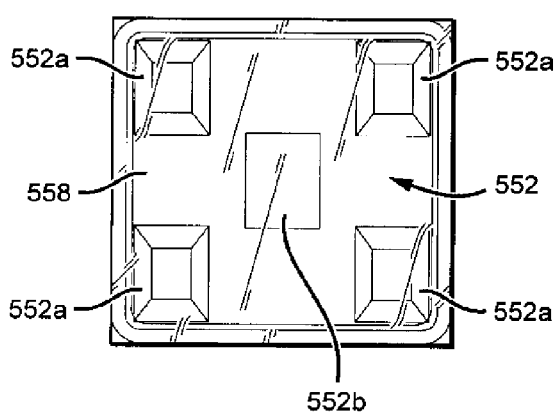
FIG. 67 is a top view of the LED package shown in FIG. 65.
Figure 68:
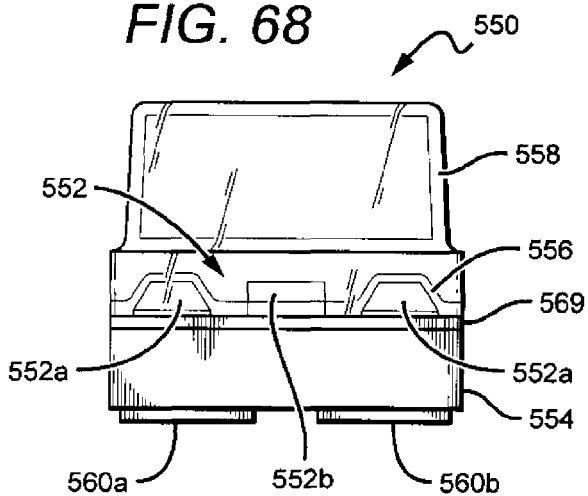
FIG. 68 is another side elevation view of the LED package shown in FIG. 65.
Figure 69:
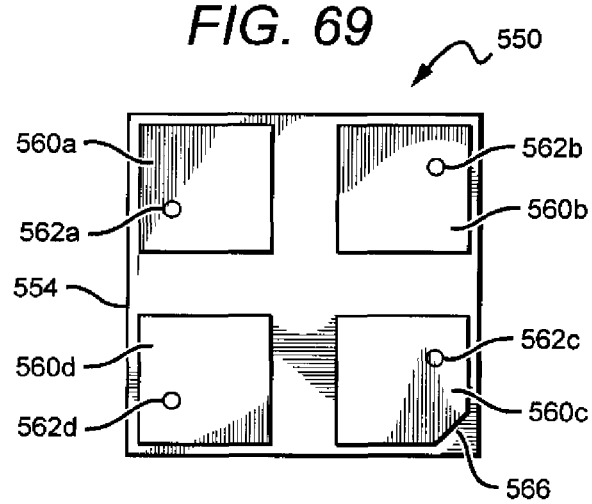
FIG. 69 is a bottom view of the LED package shown in FIG. 65.

Different LED package embodiments can also have different types of LEDs in the same package to achieve the desired emission profile with some having different combinations of LEDs with parallel surfaces, oblique surfaces and/or textured surfaces. FIGS. 63 and 64 show a further embodiment of an LED package 490 according to the present invention having first, second and third LEDs 492, 494, 496 each of which is a different from the others. This is only one of the many different LED combinations that can be utilized in LED packages according to the present invention, and it is understood that different packages can have different numbers of LEDs having different shapes and sizes. Each of the LEDs 492, 494, 496 can have many different features such as wire bonds, current spreading structures and light extraction features (not shown). This is only one of the many different combinations that can be used according to the present invention. These different combinations can also be used in any of the different types and shapes of LED packages described above, and with packages having planar surfaces such as side and top surfaces.

It is understood that different multichip embodiments according to the present invention can be arranged in many different ways, with many different types of LEDs that can emit different or same colors of light. For LED packages with LEDs emitting different colors of light, the packages can emit the desired combination of light from the LEDs.

FIGS. 65 through 69 show one embodiment of an LED package 550 according to the present invention comprising LEDs 552, mounted on a submount 554. The LED package 550, can also comprises first, second, third and fourth contact/solder pads 560a-d on the bottom of the submount 554, first, second, third and fourth conductive vias 562a-d passing through the submount 554. The vias are arranged to conduct an electrical signal to die attach pads (not shown herein but described in more detail below) on the top surface of the submount 554. The LED package further comprises a conversion material layer 556 (best shown in FIG. 68) covering at least some of the LEDs 552, the exposed surfaces of the die attach pads, and exposed portions of the top surface of the submount 554. An encapsulant 558 is included over the submount 554 with the LEDs 552 and the die attach pads between the submount 554 and the encapsulant 558. The above features of the LED package are described in detail below.

The LEDs 552 can comprise different LEDs emitting at different wavelengths of light, and in the embodiment shown the LEDs 552 can comprise four blue emitting LEDs 552a and red emitting LEDs 552b. It is understood that different numbers of the LEDs can be used and in other embodiments different types of LEDs can be used. Many different LEDs can be used such as those described above, including LEDs commercially available from Cree Inc., under its DA, EZ, GaN, MB, RT, TR, UT and XT families of LED chips. LED substrate materials may be silicon carbide (SiC), sapphire, gallium nitride (GaN) or others. The LED package 550 is particularly arranged for use of blue emitting LEDs from the DA family of chips described above that can be flip chip mounted to the submount with wire-free bonding. Commercially available red LEDs 552b can be used with these blue emitting LEDs. It is understood that in some embodiments the LEDs 552a, 552b can be provided following removal of its growth substrate. In other embodiments, the LED's growth substrate can remain on the LEDs 552a, 552b with some of these embodiments having a shaped or textured growth substrate.

In other embodiments, more or fewer LEDs can be used as the light source, while in other embodiments solid state lasers can be used in combination with one or more LEDs. In some embodiments, the LEDs can comprise a transparent growth substrate such as silicon carbide, sapphire, GaN, GaP, etc. The LED chips can also comprise a three dimensional structure or geometry, and in some embodiments the LEDs can have structure comprising entirely or partially oblique facets on one or more surfaces of the chip.

The LEDs 552a, 552b are mounted to die attach pads on the submount 554. The submount 554 can be formed of many different materials as described above and can be arranged in many different ways. The top surface of the submount 554 has a top planar surface with the die attach pads comprising patterned conductive features that can also include conductive traces. The die attach pads can be arranged in many conventional ways and can be arranged in the same way as the die attach pads and conductive traces described above. In the embodiment shown, the LEDs can be mounted to the attach pads such that each spans a space between adjacent ones of the attach pads. Different die attach pad patterns or arrangements can be used and in some embodiments the same electrical signal can be applied to all the LED chips. In other embodiments the attach pads can be arranged to allow for different signals to be applied to different ones of the LED chips. Many different mounting methods can be used for mounting the LED chips 552a, 552b to the die attach pads, such as methods utilizing conventional solder materials. The LED chips can also be electrically connected to the attach pads or other conductive traces using known surface mount or wire bonding methods, depending on the geometry of the LED chips 552. The solder pads 560a-d, conductive vias 562a-d, and attach pads can comprise many different materials, such as those described above.

A space or gap is provided between the solder pads 560a-d to minimize the chance of electrical shorting between the pads. In the embodiment shown, the space between the pads can be in the range of 400 to 600 µm, with the embodiment shown having a space of approximately 500 µm. In other embodiments, the solder pads can be thinner, which can allow for a smaller space between the pads 560a-d. In other embodiments, the space can be less than 400 µm, while in other embodiments it can be less than 300 µm. In still other embodiments is can be less than 200 µm, with some having solder pads thin enough to provide for a spacing of approximately 50 µm.

In the embodiment shown, the solder pads 560a-d are substantially square shaped and are arranged in the corners of the submount 554. It is understood, however, that in other embodiments the solder pads can have different shapes and can be arranged in different locations. For example, in some embodiments the solder pads can have a rectangular shape and can be arranged in different locations around the edge of the submount to maximize the spacing between the electrodes. In other embodiments, the solder pads can be triangular shaped and can be located in the corners of the submount to again maximize the space between the electrodes. The solder pads can also have different shapes on the same submount, with some combining different shapes to most effectively space the solder pads. In these different embodiments, vias can still be provided to conduct an electrical signal to the die attach pads.

In some embodiments, the attach pads can extend beyond the edge of the LEDs 552, as described above, to cover most of the top surface of the submount 554. This can help in thermal management for the LED package 550 by spreading heat from the LEDs 552 into the pads so that heat spreads beyond the edge of the LEDs 552 into more area of the submount 554. This allows the heat to be less localized and allows it to more efficiently dissipate through the submount 554 into the ambient.

The conversion material layer 556 is included over the blue emitting LEDs 552a, exposed portions of the attach pads, and exposed portions of the submount's top surface. The conversion material layer 556 can be applied using different processes discussed above. In the embodiment shown, the red emitting LED 552b may not be covered by the conversion material layer, but it is understood that in other embodiments it could be covered by one or more conversion materials. The uncovered red LED chips may present a surface that can absorb light instead of recycling light, but in the embodiments shown this absorbing surface can be relatively small compared to the overall area of the submount's top surface such that it presents an acceptable amount of light absorption.

Many different conversion materials can be used in the conversion material layer 556 to generate the desired LED package light emission such as any of the conversion materials described above or combinations thereof. The present invention can be particularly adapted to LED packages emitting white light. In some white emitting embodiments, the LED 552 can emit light in the blue wavelength spectrum. In other embodiments the LED can emit light in the violet to UV part of the spectrum for example in the wavelength range between 360 nm and 440 nm. The conversion material can be of the type that absorbs blue light or other wavelength light and re-emits for instance yellow light such that the package emits a white light combination of blue and yellow light. In different embodiments, the conversion material can comprise many different types, including but not limited to the conversion materials mentioned above.

It is understood that more than one conversion material can be used in different LED packages having different types of emitter. In some embodiments, the number and type of conversion materials can be dependent on the emission wavelength of the solid state light source. For example, the conversion material layer can comprise at least three phosphors covering parts or all of the visible wavelength range, with some embodiments comprising a combination of yellow, red and green phosphors. For violet and UV emitting solid state light sources a blue phosphor may be added. Other combinations are possible, and other embodiments can comprise more than three phosphors. Many different yellow, red and green phosphors can be used, such as those described above.

The conversion material can comprise different sized phosphor particles in the ranges discussed above and the conversion material can be fixed in the conversion material layer in a binder. The binder can comprise the materials listed above, among others, and the phosphor can be provided in different concentrations in the binder as also discussed above. The conversion material layer 556 can also have different regions with different concentrations of phosphor particles. Alternate wavelength conversion materials may also be used to down-convert light to generate white emissions. Such materials may be, but are not limited to organic fluorescent materials or dyes or inorganic quantum dot materials such as CdSe/ZnS, InP/InAs, CdS/CdSe, CdTe/CdSe or others. Like above, the conversion material layer 556 can also have many different thicknesses depending at least partially on the concentration of the conversion material, the size of the conversion material particles, and the desired amount of light to be converted by the conversion material. Thickness may also vary across the layer, with different regions having different thicknesses.

Like the embodiment discussed above, the different packages according to the present invention can comprise conversion layers with less phosphor material (e.g. thinner or lower concentration) compared to similar packages with hemispheric encapsulants, while still maintaining the desired emission color point. This reduction in thickness depends on many different factors, such as the phosphor type, size of phosphor particles, and concentration of phosphor particles in the layer. In some embodiments, the reduction can be 10% or more compared to a similar LED package with hemispheric lens. In still other embodiments it can be 20% or more, while in other embodiments it can be 30% or more.

Referring to FIGS. 65 through 69, encapsulant 558 is included on the conversion material layer 556, and over the LEDs 552 and submount 554, with the encapsulant 558 providing environmental and mechanical protection, as well as allowing for the recycling of light as described above and described in more detail below. Like the embodiments above, the encapsulant 558 has planar surfaces, and in the embodiment shown the encapsulant 558 has a generally cubic shape. It is understood that encapsulant can take many different shapes, such as those described above, including triangle, pentagon, hexagon, octagon, etc., and shapes that comprise vertical surfaces numbering in the range of 3 to 12 or more. In still other embodiments, the encapsulant can be cylindrical with different cross sections such as circular or oval.

It is understood that encapsulant 558 and the LEDs 552 can be aligned in many different ways, with the embodiment shown having its red LED 552b as shown approximately aligned with the center or longitudinal axis of the encapsulant 558. The blue (or BSY) LED chips 552a can be at the corners of the submount 554 and the encapsulant 558. It is understood that this is only one of the many different patterns for the LED chips, with some having random placement of different emitting LED chips and others can have an organized pattern of different emitting LED chips.

Many different materials can be used for the encapsulant 558 such as those described above, and the encapsulant can have properties similar to the encapsulants described above. In different embodiments, the encapsulant can have many different thicknesses as described above, and in some embodiments, the top surface of the encapsulant can have a slightly smaller area than the bottom of the encapsulant and/or the footprint of the LED package. In still other embodiments, the upper portions of the encapsulant can have a larger area than lower portions, or a larger area than the LED package footprint.

The solder pads 560a-d are formed on the bottom surface of the submount 554, and can be used for mounting the LED package 552 in place using known mounting methods, and for applying one or more electrical signals to the LED package. The embodiment shown comprises four contact pads 560*a-d*, that allow for different electrical signals to be applied to the LED package 550 to control the emission intensity of different ones of the blue and red LED chips 552*a*, 552*b*. In some embodiments, two of the solder pads can be used to apply an electrical signal to the blue emitting LEDs 552*a*, and the other two can be used to apply an electrical signal to the red emitting LED 552*b*. This allows for respective control of the emission intensity for the blue and red emitting LEDs 552*a*, 552*b*. It is understood that in other embodiments (as described below), LED packages according to the present invention can have two solder pads so that all the LED chips are responsive to the same electrical signal, or can have more than two solder pads to allow for more control over the emission of respective ones of the LEDs 552*a*, 552*b*.

The solder pads 560 can be made of the same materials and can be formed in the same way as die attach pads. Like the embodiments above, conductive vias 562*a-d* can pass through the submount 554 with the vias being formed of a conductive material such as those used for the die attach pads and solder pads 560*a-d*. Like the embodiments above, the vias are arranged to provide an electrically conductive path between the solder pads 560*a-d* and the die attach pads. The embodiment shown comprises four vias, with each providing a conductive path between a respective one of the solder pads 560*a-d*, and a respective one of the attach pads. This allows for an electrical signal applied to the solder pads 560*a-d* to be conducted through the submount 554 along the vias 562*a-d*, to the die attach pads. The signal is then conducted to the desired one of the LEDs 552*a*, 552*b*, causing it to emit light. It is understood that in other embodiments the electrical signal can be transmitted to the LED in other ways such as through conductive traces or wire bond pads arranged in different locations in the LED package, and running between the mounting surface or the submount, and the LED.

Like the embodiments above, the LED package 550 provides improved structures for providing polarity indication by forming one or more indication notches 566 in one of the solder pads. A notch 566 can be formed in the corner of the solder pad 560*c* that can be detected with up-looking cameras in automated pick-and-place equipment during manufacturing. Like above, the polarity indicators can be in many different locations, can have many different shapes, and can be arranged in many different ways. Some embodiments according to the present invention can also comprise polarity indicators on the top surfaces of the LED package 550, similar to those discussed above, to show polarity when viewing the LED packages 50 from the top.

Like the embodiments above, the LED package 550 can be arranged to utilize TIR light within the encapsulant to increase light emission efficiency. The encapsulant can be arranged to promote at least some TIR light within the encapsulant compared to conventional LED packages having encapsulants to minimize TIR light. It is believed that by providing a blanket conversion material layer over the top surfaces under the encapsulant 558, including the blue LED 552*a*, areas of the die attach pads around the LED 552, and the top surface of the submount 554 exposed around the LED 552, this expected any efficiency loss from TIR can be minimized or eliminated. The blanket conversion material layer can also scatter light to allow the TIR to escape from the encapsulant on a subsequent pass, and can also provide an improved LED emission pattern.

Figure 70:
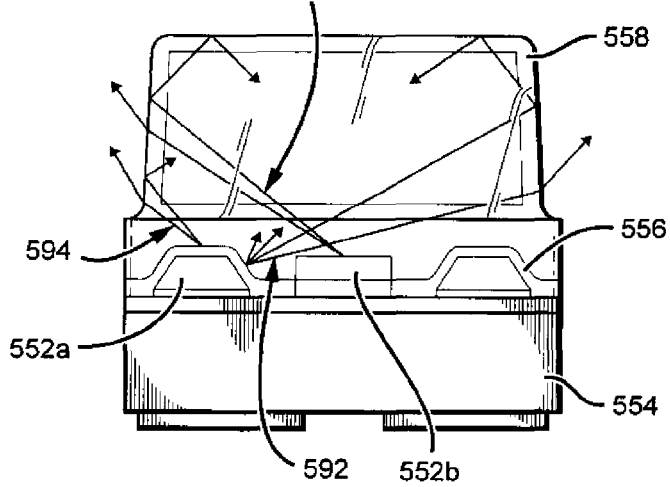
FIG. 70 is a side view of the LED package shown in FIG. 65.

Referring now to FIG. 70, an exemplary LED package 590 according to the invention is shown with sample blue, yellow and red light traces 592, 594, 596. The LED package 590 comprises many of the same or similar features to those in LED package 550, and for those features the same reference numbers will be used herein. The LED package 590 comprises and blue emitting LEDs 552*a*, red emitting LEDS 552*b*, submount 554, conversion material layer 556, and an encapsulant 558. The LED package 590 can be arranged to emit different colors of light, and in the embodiment shown the LED chips 552*a*, 552*b* emits blue and red light, and the conversion material layer 556 comprises a conversion material that converts some of the blue light to yellow light. This results in blue, yellow and red light passing through the encapsulant and reaching its surface. Referring to the blue light trace 592, a portion of the blue light passes through the conversion material layer 556 and experiences TIR when it reaches the surface of the encapsulant 558. Other portions of the blue light 592 pass out of the encapsulant to contribute to emission from the LED package.

The blue TIR light reflects within the encapsulant and is eventually directed back toward the submount 554. Instead of reaching a light absorbing portion of the LED package, the TIR reaches the conversion material layer 556. This blue light has already passed through the conversion layer 556, and following TIR the blue LED light encounters the conversion material layer a second time. As discussed above, this can be referred to as "recycling" of the blue light that results in illumination of the top surface of the conversion material layer 556 such that both sides of the layer are illuminated by blue light during operation. The conversion material layer 556 provides a "blanket" effect that helps limit both blue and yellow light from re-entering the chip or hitting absorbing regions. When the blue light 592 hits the conversion material layer 556 a second time, all or a portion of the light will be scattered or absorbed by the conversion material in the layer and re-emitted as yellow light. The re-emission will be omnidirectional or isotropic such that a portion of the TIR light will be redirected so that it emits from the LED package. This omnidirectional reemission amounts to scattering of otherwise TIR light to allow for the light to reach the encapsulant surface within the critical angle and emit from the encapsulant.

When the blue light passes through the conversion material layer the first time, a portion of the blue light is converted to yellow light as shown in light trace 594. Red light also emits directly from the red LED as shown in light trace 596. A portion of blue, yellow and red light will emit from the package on its first pass, while the remainder will experience TIR. This light can also experience scattering when it encounters the conversion material layer a second time, increasing the likelihood that some of the light will emit from the encapsulant and contribute to overall emission. In the embodiment shown, the LED package emits the desired white light combination of blue, yellow and red light.

Like the embodiments above, the result is that the TIR and recycling allows for emission efficiencies of the LED packages according to the present invention to be similar to conventional hemispheric lensed LEDs. Embodiments of the present invention have reduced concentrations of conversion material in the conversion material layer to achieve the same color point due to the recycling effect. This can allow for more blue light to pass through the phosphor on the first pass. Since typical conversion layers can scatter as well as convert blue light, a reduced thickness or concentration of conversion material on the chip can mean that less of this first-pass blue light is scattered back into the LED where it may be absorbed, thereby improving package efficiency. This first-pass blue light can then be converted and scattered when it reaches the conversion material layer 556 a second time. This scattering allows for more light to escape from the LED package, while maintaining the proper emission balance between blue and yellow (and red) light to achieve the desired color point. The different embodiments can comprise 20-30% less conversion material and can be smaller compared to conventional LED packages, which can result in less costly LED packages with the same or similar emission efficiencies.

In some embodiments, the scattering during recycling of the light can also provide additional advantages of a broader emission profile as discussed above. This can result in the above mentioned increases in the emission pattern FWHM, with some of these embodiments also exhibiting less than 10% color variation at viewing angles of different ranges such as −90 to +90 degrees.

Figure 71:
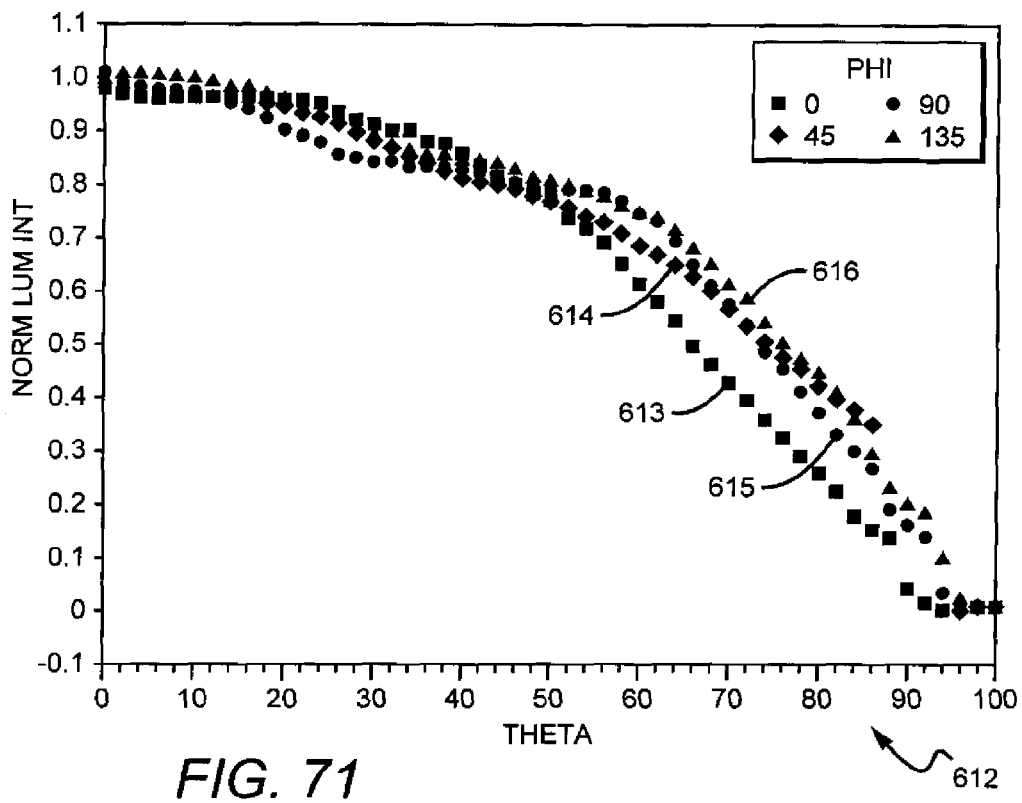
FIG. 71 is another emission profile graph for an LED package according to the present invention.
Figure 72:
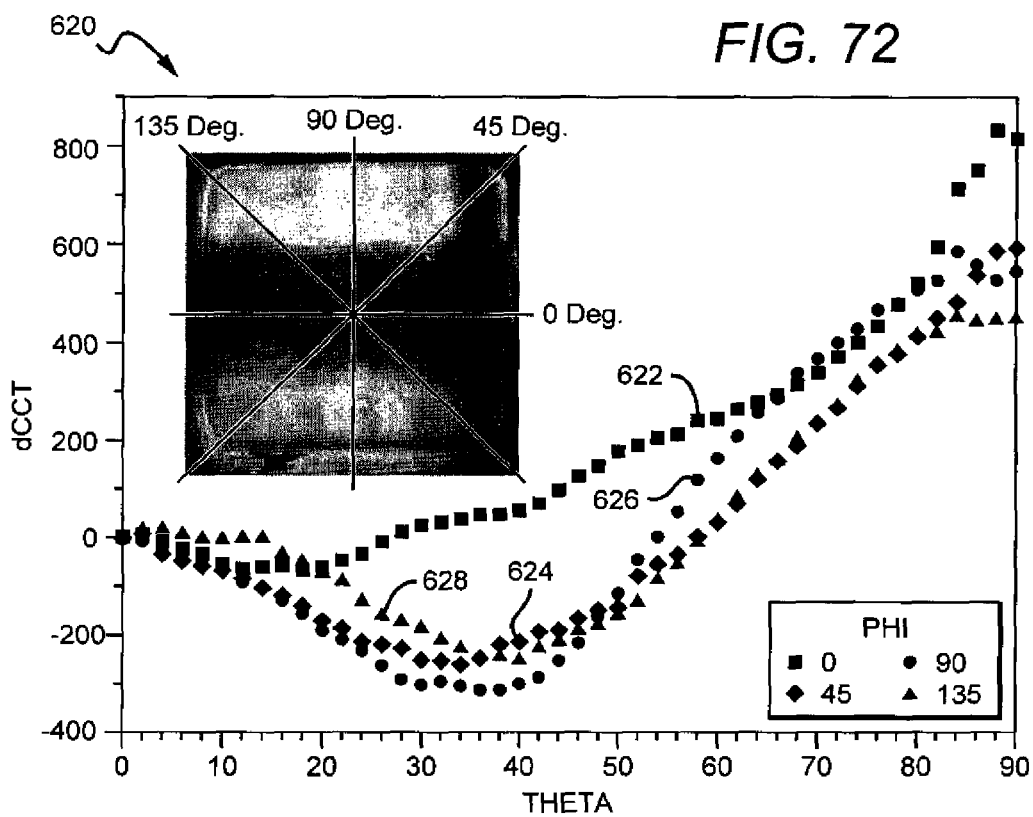
FIG. 72 is a color temperature profile graph for one embodiment of an LED package according to the present invention.

Some embodiments of the present invention can have emission profiles similar to those shown in FIG. 18 and discussed above. FIG. 71 is a graph 612 showing the first emission profile 613 for a LED package according to the present invention when viewing the package from directly above (i.e. 0 degrees) and moving the viewing angle through to approximately 100 degrees. Profiles 614, 615 and 616 show emission profiles starting from 45, 90 and 135 degrees. As mentioned above, scattering materials may be added to the encapsulant to further increase the width of the emission profile and improve color uniformity with minimal impact on package efficiency. The LED packages according to the present invention can also emit light with more uniform color emission at different viewing angles as discussed above. FIG. 72 is a graph 620 showing variations in color temperature over viewing angle for one embodiment of an LED package according to the present invention. The variations over viewing angles are from −100 to +100 degrees and are generally in the range of −100 to +200 Kelvin. The first emission profile 622 for an LED package according to the present invention when viewing the package from directly above (i.e. 0 degrees) and moving the viewing angle through to approximately 100 degrees. Profiles 624, 626 and 628 show emission profiles starting from 45, 90 and 135 degrees. The blanketing of the conversion material layer can also allow for the conversion material layer to act as a remote layer with good thermal spreading as discussed above.

Some embodiments according to the present invention provide LED packages that have smaller footprints compared to conventional LED packages with hemispheric encapsulants, while still emitting with the same or similar efficiency. These can include footprint sizes and areas mentioned above, among others. The LED package 550 according to the present invention can also provide for efficient light emission for devices with a smaller ratio of LED chip area to LED package footprint. This allows for the edge of the LED chips in the LED arrays to be closer to the edge of the encapsulant to provide greater LED emission area per combined LED package footprint for the array. Like above, in some embodiments, the ratio of LED chip array area to LED package footprint can be less than six, while in other embodiments it can be less than five. In still other embodiments it can be less than four, with some embodiments having a ratio of approximately 3.5. In still other embodiments, the ratio can be less than three. The embodiments according to the present invention can also have different combinations of footprint ratio dimensions to height dimensions as discussed above. In packages having non-square submounts, the height of the encapsulant can be greater than the largest submount footprint dimension, and for rectangular submounts the height can be greater than the length and/or width of the submount. Other embodiments according to the present invention can have different encapsulant heights as discussed above and in some embodiments, the emission pattern of the packages can change with the height of the encapsulant, with some embodiments having a wider emission pattern for higher encapsulants.

Like the embodiments above, the submount area for LED packages having multiple LEDs can be as low as the LED area of all the LED chips combined plus 2 times the conversion material layer thickness at the edge of the submount. Different ratios can also be achieved with submounts having different shapes. In other embodiments having multiple LED chips, the ratio of LED chip area to LED package footprint in these embodiments can be as low as approximate 1.046. In still other embodiments, the ratio can be as high as 20 or more. In different embodiments, the ratio can fall in the range of 1 to 20, 1 to 15, 1 to 10, 1 to 5, 1 to 3, or 1 to 2.

Having greater LED area for package footprint can allow for higher packing density. The LED packages can be used in place of conventional LED packages, and for the same amount of area can provide greater LED emission area. In many applications, this allows for driving the same area of LED packages with a lower drive signal to achieve the same emission intensity. This can result in greater emission efficiency. In other embodiments, the same drive current can be used, and the LED packages according to the present invention can be used to generate higher emission intensity. The embodiments according to the present invention provide the flexibility of providing LED package emission with high luminous flux, or with lower luminous flux at greater efficiency.

The present invention provides for various combinations of LED shapes and encapsulant surface arrangements. The blue emitting LED chips 552*a* can comprise angled surfaces to enhance light emission, that are now provided in combination with an encapsulant having vertical and/or horizontal planar surfaces. The red LED chip 552*b* is provided with horizontal and vertical surfaces used in combination with horizontal and planar surfaces of the encapsulant. As described in more detail below, these are only a few of the surface combinations that are provided in different embodiments according to the present invention.

The encapsulant 558 is described above as being included on the conversion material layer 556, and over the LEDs 552 and submount 554. The conversion material layer 556 is also described as comprising a conversion material in a binder, with the encapsulant provided over the conversion material layer. It is understood that in other embodiments, the conversion material can be included in the encapsulant, with some embodiments having a conversion material that occupies less than all of the encapsulant. Some embodiments can be provided with a conversion material that occupies less than 80% of the encapsulant. In still other embodiments the conversion material layer can occupy less than 50% of the encapsulant, while in other embodiments it can occupy less than 25% of the encapsulant. In still other embodiments the conversion material can occupy less than 10% of the encapsulant.

In different embodiments, the conversion material can occupy encapsulant regions of different shapes and sizes and in some embodiments the conversion material can comprise a layer in different locations so that at least some light from the package LEDs passes through the conversion material.

The conversion material layer can be arranged in many different ways and can have different shapes, thicknesses and concentrations. In different embodiments, the conversion material can occupy different areas of the encapsulant. That is, some areas of the encapsulant can have a conversion material while in others the remaining area will have none. In some encapsulant embodiments the conversion material can be in a lower portion of the encapsulant and the upper portion of the encapsulant may not having a conversion material. Is some embodiments, the conversion material can be in the lower three fourths of the encapsulant, while in other embodiments it can be in the lower half of the encapsulant. In still other embodiments it can be in the lower one fourth of the encapsulant, while other embodiments it can be in lower tenth of the encapsulant.

Referring again to FIGS. 68 and 70, the conversion material layer 556 can be included in the encapsulant 558 and can occupy the lower portion of the encapsulant 558. In the embodiment shown, the conversion material layer can comprise a conversion material layer within the encapsulant at the bottom of the encapsulant 558. Like the conversion material layer described above, the conversion materials included in the encapsulant can comprise many different types of conversion materials. In some embodiments the different materials can be mixed, while in other embodiments that conversion material can be divided into different areas having different conversion materials.

Figure 73:
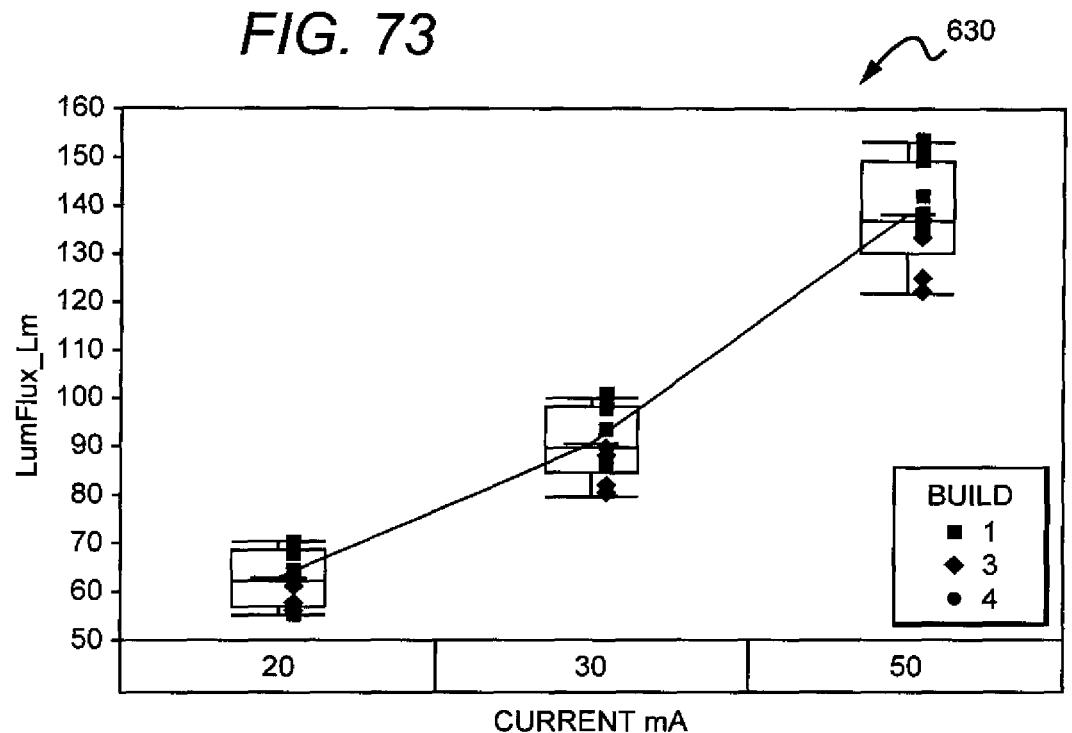
FIG. 73 is a graph showing luminous flux of different LED packages according to the present invention at different input current.
Figure 74:
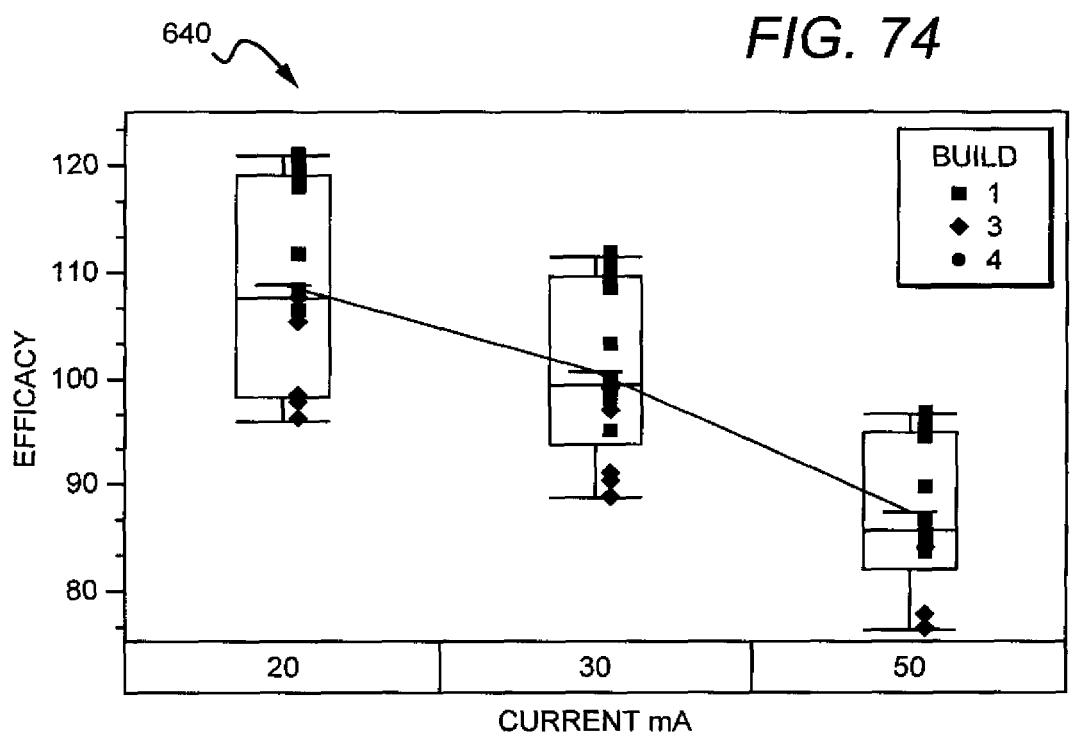
FIG. 74 is a graph showing efficacy of different LED packages according to the present invention at different input current.
Figure 75:
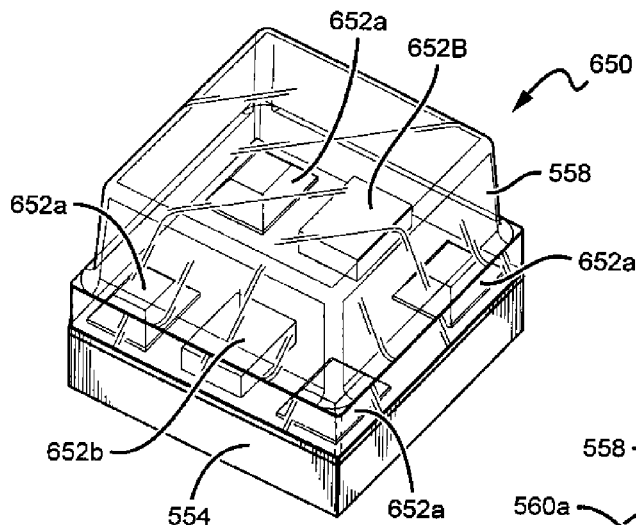
FIG. 75 is a top perspective view of another embodiment of an LED package according to the present invention.
Figure 76:
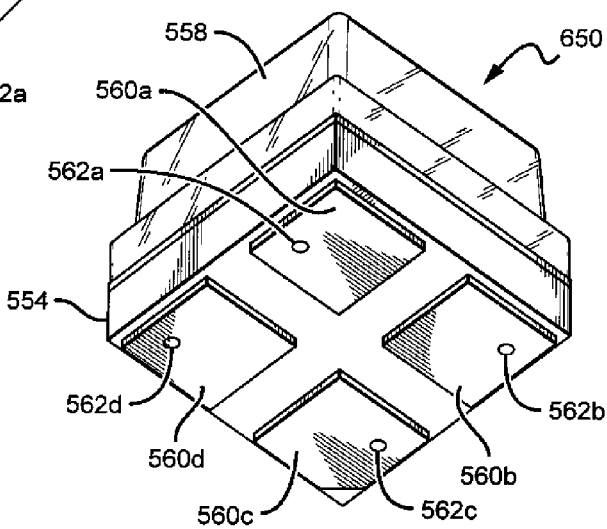
FIG. 76 is a bottom perspective view of the LED package shown in FIG. 75.
Figure 77:
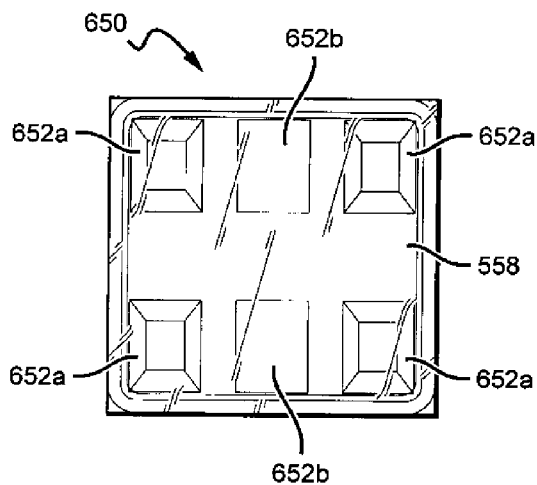
FIG. 77 is a top view of the LED package shown in FIG. 75.
Figure 78:
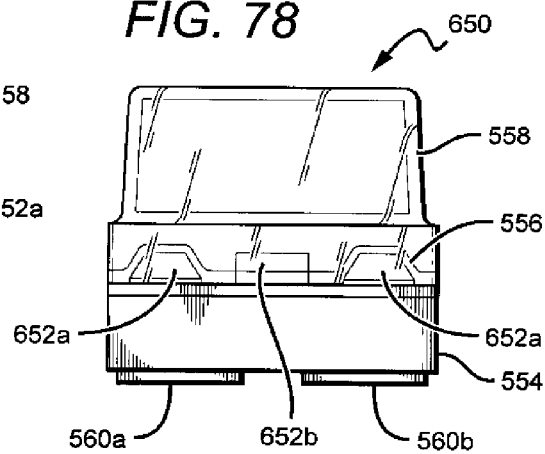
FIG. 78 is another side elevation view of the LED package shown in FIG. 75.
Figure 83:
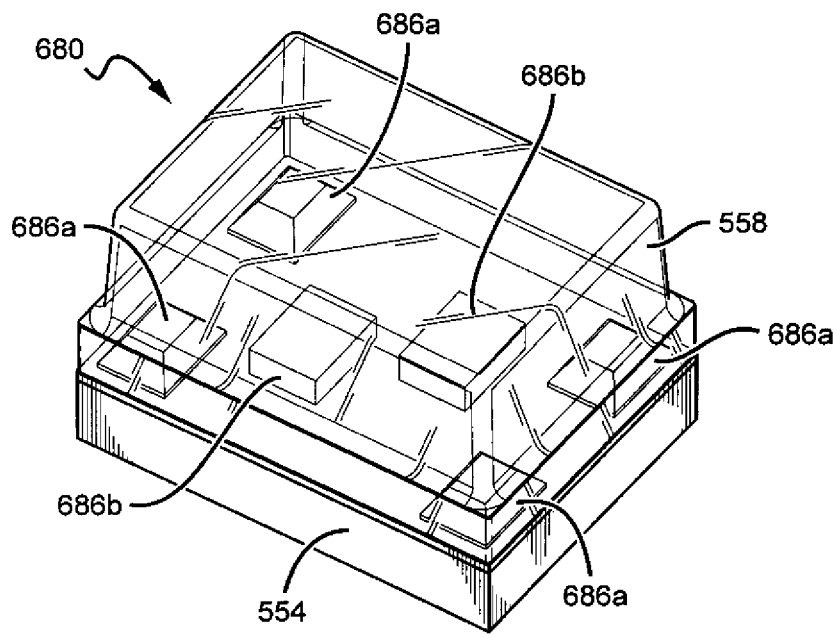
FIG. 83 is a top perspective view of another embodiment of an LED package according to the present invention.
Figure 84:
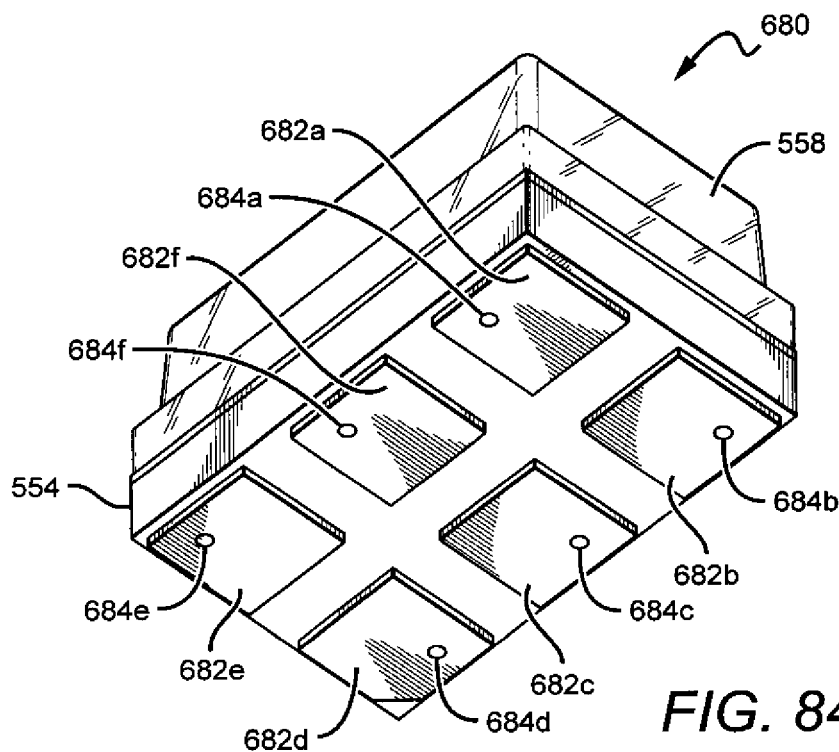
FIG. 84 is a bottom perspective view of the LED package shown in FIG. 83.

The different LED package embodiments can operate from different drive signals as discussed above, with some operating from signals as low as 50 mWatts to several tens of Watts. The LED packages can also operate at different color temperatures as discussed above. The LED packages according to the present invention can also exhibit other performance characteristics. FIG. 73 shows a graph 630 showing the luminous flux for different input currents, and FIG. 74 is a graph 640 showing the efficacy for different embodiments according to the present invention in response to different input currents.

As mentioned above, the LED packages according to the present invention can be arranged with different numbers of LEDs arranged in different ways. FIGS. 75 through 78 show another embodiment of an LED package 650 according to the present invention comprising a submount 554, conversion material layer 556, encapsulant 558, solder pads 560*a-d* and conductive vias 562*a-d*. This embodiment comprises four blue emitting LEDs 652*a*, and two red emitting LEDs 652*b* mounted to die attach pads on the submount 554. The LEDs 652*a*, 652*b* can comprise many different commercially available LEDs mentioned above, with the blue emitting LEDs 652*a* preferably comprising LEDs from the DA family commercially available from Cree, Inc. In this embodiment, each of the blue emitting LEDs 652*a* can be arranged at respective one of the corners of the submount 554, with the red emitting LED 652*b* mounted between the blue emitting LEDs 652 along opposing edges of the submount 554. As with the embodiment above, a conversion material layer 556 is included on the blue LEDs 652*a*, and the exposed surfaces of the submount 554 and attach pads around the blue LEDs. The red LEDs are not covered by the conversion material layer. This conversion material layer is arranged similar to the same conversion material layer described above, and provides the recycling of TIR light as described above. It is noted that in LED package 650, as well as the other embodiments described herein, the red LED chips may not be covered by the conversion material layer.

The die attach pads (not shown) can be in many different locations, can be made of the same materials as described above and can be deposited using the same methods. As with the embodiment above, during operation electrical signals can be applied to the solder pads 560*a-d* that are transmitted to the attach pads through the vias 562*a-d*. The signal is then transmitted to the LEDs 652*a*, 652*b* causing them to emit light. The LED package operates in much the same way as LED package 550, and can have the same sizes and ratios described above, In the embodiment shown, the LEDs 652*a*, 652*b* are arranged the perimeter, but in other embodiments some of the LEDs can be arranged off the perimeter with some closer to the center of the submount.

The LED packages described herein can have LEDs that are interconnected in many serial and parallel combinations. In the embodiments shown the blue LEDs can be coupled in series, or parallel, or combinations thereof, and for embodiments having multiple red LEDs they can be similarly interconnected. The blue and red LEDs can be separately controlled, with each of the LED types being controlled by a respective electrical signal applied to two of the four solder pads 560 on the backside of the submount 554. That is, different electrical signals can be applied to the solder pads to vary the emission intensity of the blue and red LEDs, to vary the overall emission color of the LED packages according to the present invention. This can allow for changing the LED package emission under different conditions. For example, the human eye may be more sensitive to blue light at nighttime, while it may be more sensitive to green light during the daytime. Independent control allows for the emission of the LED packages to be tuned during the course of the day to meet the varying sensitivity of the human eye. This is only one example of the many different circumstances that may exist that call for varying the emission of the LED packages.

FIGS. 79 through 82 show another embodiment of an LED package 660 according to the present invention comprising a submount 554, conversion material layer 556, encapsulant 558, solder pads 560*a-d* and conductive vias 562*a-d*. This embodiment comprises three LEDs and includes two blue emitting LEDs 662*a*, and one red emitting LED 662*b* with each of the LEDs mounted to attach pads. The LEDs can be mounted in many different locations with this embodiment having the blue emitting LEDs 662*a* mounted at opposing corners of the submount 554, and the red LED 662*b* mounted near the center of the submount 554 between the blue emitting LEDs 662*a*. As with the embodiments above, the conversion material layer can cover the blue LEDs 662*a* and the top surface of the submount 554, but not the red LED 662*b*. The LED package 660 operates in much the same way as the LED packages described above, and can have the same size and dimension ratios.

It is understood that different LED package embodiments according to the present invention can have many different shapes with some having fewer or more side surfaces. FIGS. 83 through 86 show an LED package 680 having a rectangular shape, with a submount and encapsulant footprint with two sides that are longer than the remaining two. The LED package can have many different dimensions, with the LED package 680 being otherwise similar to the embodiments above, and can comprise a submount 554, conversion material layer 556, encapsulant 558. In this embodiment, the bottom surface of the submount 554 comprises six solder pads 682*a-f* and conductive vias 684*a-f*. This embodiment further comprises four blue emitting LEDs 686*a*, and two red emitting LED 686*b* mounted to die attach pads on the submount 554. In this embodiment, each of the blue emitting LEDs 686*a* arranged at a respective one of the corners of the submount 554, with the red LEDs 686*b* being mounted such that they are diagonal across between two of the blue emitting LEDs 686*a*. This is only one of the many different ways that the LEDs 686*a*, 686*b* can be mounted in different packages according to the present invention.

The solder pads are arranged in much the same way as the embodiments above, with electric signals applied to the solder pads 682*a-f* being conducted to the LEDs 686*a*, 686*b* through the vias 684*a-f* and the attach pads. In this embodiment, however, three different electrical signals can be applied to provide additional control over the emission of the LEDs 686*a*, 686*b*. In some embodiments, subsets of the blue or red LEDs 686*a*, 686*b* can be controlled by different signals to separately vary the emission of the subsets.

As mentioned above, in multiple LED package embodiments it may be advantageous to place the LEDs as close as possible to the edge of the submount, such as the blue emitting LEDs. This may be particularly true when using the LED packages in a linear arrangement. For example, for the three LED embodiments described herein, it may be advantageous to place the blue LEDs at opposing corners on the submount, while LED packages having four LEDs can have an LED at each of the corners of the submount.

As mentioned above, the encapsulant can be formed in the LED packages according to the present invention using different methods, with some embodiments using different molding processes. One such molding process is referred to as compression molding wherein a mold is provided having a plurality of cavities each of which has an inverted shape of the lens as described above and shown in FIG. 42. The same molding process can be used for LED packages having multiple LEDs. Referring again to the embodiments described above, and by way of example the LED package 550 shown in FIGS. 65 to 69, a small encapsulant connection section 569 can be included at the base of the encapsulant 58. This is a byproduct of the molding process as discussed above.

It is understood that other fabrication processes can be used with one such process comprising covering of a submount panel and its LEDs with a layer of encapsulant material and that the individual LED packages can then be separated by different methods such as dicing or cutting through the encapsulant and submount. The resulting packages can have encapsulant side surfaces that are approximately vertical and aligned with the edges of the submount. FIGS. 87 through 90 show another embodiment of an LED package 720 according to the present invention comprising a LEDs 552. submount 554, conversion material layer 556, solder pads 560*a-d* and conductive vias 562*a-d*. In this embodiment, the sidewalls of the encapsulant do not have the connection section, and are essentially aligned with the outer edge of the submount 554 and are vertical. This arrangement can be the result of coating and dicing fabrication process, with the side surfaces being smooth to promote TIR within the encapsulant. In still other embodiments, the encapsulants can be separately molded and then attached to the submount over phosphor conversion material layer. It is understood that the surfaces of the encapsulants can be smoothed or further shaped using different methods, such a cutting, grinding, sanding or etching.

Like the embodiments above, the surfaces of the encapsulant can be smooth enough such that the LED is clearly visible through the encapsulant, and there is little or no roughness on the surface of the encapsulant to obscure or redirect the light rays passing through the encapsulant. In some embodiments where there is some texturing, roughness or imperfections the surface features should have sizes having a root mean square (RMS) close to or greater than the wavelength of light encountering the surface.

FIG. 91 shows another embodiment of a LED package 750 according to the present invention having six LEDs 752, a submount 754, and an encapsulant 756, and vias 757*a-d*. FIG. 92 shows the die attach pads 758 for the package 750, and FIG. 93 shows the solder pads 760*a-d* for the package 750. The encapsulant 756 can be made of the same materials and arranged in the same ways as the encapsulants described above. Referring to FIG. 91, the LEDs 752 can comprise four blue emitting LEDs 752*a*, and two red emitting LEDs 752*b*, which can be commercially available LEDs such as those described above. Two of the blue emitting LEDs 752*a* can be arranged along one edge of the submount 754, and the other two along the opposing submount edge. The two red emitting LEDs 752*b* are arranged between the two sets of blue emitting LEDs 752*a*. The LED package can comprise a conversion material layer as described above that covers the blue LEDs 752*a*, and the exposed surfaces of the submount 754 and the attach pads 758, but not the red LEDs 752*b*. The conversion material is not shown in this embodiment to allow for ease of description of the die attach pads 758.

The vias 757*a-d* are electrically conductive paths between the attach pads 758 and the solder pads 760, through the submount 754. Referring to FIGS. 91, 92 and 93, a first set of attach pads 758*a* are arranged to interconnect the blue LEDs 752*a* in series and to apply a signal from third and fourth solder pads 760*c*, 760*d* to the blue LEDs 752*a*, with the signal passing though third and fourth vias 757*c*, 757*d* to the attach pads 758*b*. Each of the blue LEDs 752*a* spans a space between adjacent portions of the attach pads 758*a* with the electrical signal passing through each of the blue LEDs 752*a*. A second set of attach pads 758*b* is arranged to apply an electrical signal from first and second solder pads 760*a*, 760*b* to the red LEDs 752*b*. The signal can be conducted through the first and second vias 757*a*, 757*b* to the red LED 752*b* that are serially interconnected with the attach pads 758*b* and wire bonds 762. It is noted that in the embodiment shown, the red LEDs 752*b* can have insulating substrates, such that an electrical signal applied to the red LEDs 752*b* does not pass into the portion of the attach pads 758*b* below the LEDs, and a electrical signal on these attach pads 758*b* does not pass into the red LED chips 752*b*, except through the wire bonds 762.

The LED package 750 can also comprise a polarity indicator as described above, with different embodiments having the indicator in different locations. Referring now to FIG. 93, polarity indicators can be included in the form of notches 764*a*, 764*b* in the corners of the second and third solder pads 760*b*, 760*c*. These notches 764*a*, 764*b* that can be detected with up-looking cameras on automated pick-and-place equipment during manufacturing. In the embodiment shown, the notches 764*a*, 764*b* can be on the inner corners of the pads so that they are near the center of the submount 754. Referring now to FIG. 16 above, showing a conventional carrier tape 80, one or both of the notches 764*a*, 764*b* in the area of the submount 554 near the center can be visible through hole 82 in the carrier tape 80. This allows for the notch (and the corresponding LED package polarity) to be visible and verified carrier tape hole 82 without removing the LED package from the carrier tape 80.

The notches 764*a*, 764*b* can have many different shapes as described above and can be included in many different locations. The LED package 750 can also comprise a polarity indicator on the top of the submount that can comprise many of the different shapes described above. In the embodiment shown, the top polarity indicator an comprise a plus sign 766 is the die attach pads 758.

Figure 95:
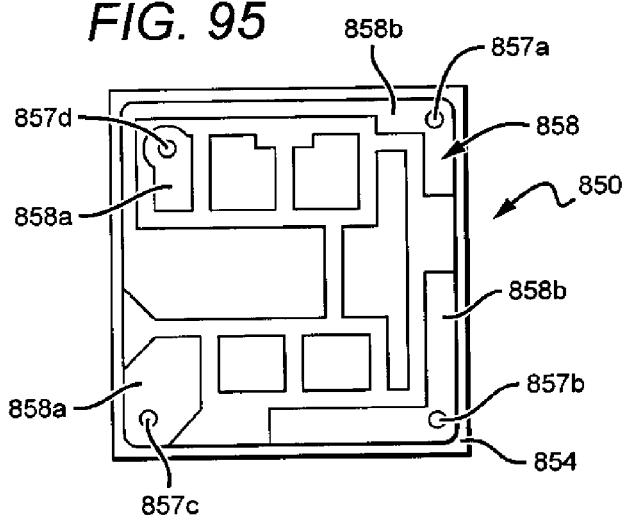
FIG. 95 is a top view of die attach pads in the LED package shown in FIG. 94.

FIG. 94 shows still another embodiment of an LED package 850 according to the present invention that is similar to the LED package 750 described above. This embodiment comprises nine LEDs 852, a submount 854, an encapsulant 856, and vias 857*a-d*. FIG. 95 shows the die attach pads 858 for this embodiment, with the solder pads being the similar to one or more of the embodiments described above. The LEDs 852 shown in FIG. 94 can comprise six blue emitting LEDs 852*a*, and three red emitting LEDs 852*b*. Three of the blue LEDs 852*a* are along one edge of the submount 854, with the remaining three along the opposite edge. The three red LEDs 852*b* are arranged between the two sets of blue LEDs 852*a*. Referring now to FIGS. 94 and 95 in combination, like above the blue LEDs are mounted to the mounted to the first set of die attach pads 858*a* and are serially interconnected. A signal applied to solder pads conducts to the blue LEDs 852*a* causing them to emit light. The red LEDs are also connected in serial between the second set of die attach pads 858*b* and through wire bonds 862. A signal applied to the solder pads is conducted to the attach pads 858*b* and is conducted through the red LEDs 852*b* along wire bonds 862. It is noted that a portion of the first die attach pads 858*a* passes under one of the red LEDs 852*b*, but in this embodiment the bottom of the red LEDs 852*b* is electrically insulating so that electrical signals will not pass between the red LED 852*b* and the portion of the attach pads 858*a*.

Figure 96:
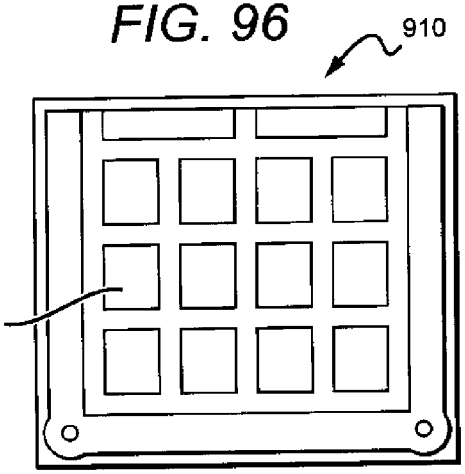
FIG. 96 is a top view of another submount according to the present invention.
Figure 97:
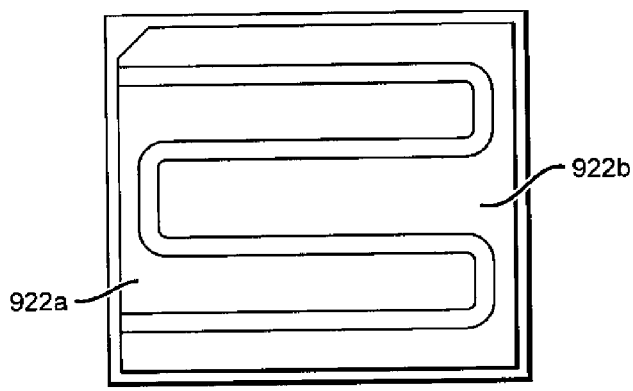
FIG. 97 is a top view of another submount according to the present invention.

Other embodiments can be arranged to hold even more LEDs. FIG. 96 shows still another embodiment of a submount 910 having a die attach pattern 912 that can be used to connect up to sixteen LEDs (not shown) in series, with each of the LEDs being mounted across the space between adjacent elements of the pattern. The pattern can be used for mounting different LEDs emitting different colors of light. In embodiments utilizing 3 volt LEDs, a 48 volt drive signal can be used. Like above, this driver signal can be higher or lower, depending on the voltage and number of LEDs mounted to the submount. FIG. 97 shows still another embodiment of a submount 920 comprising a first U-shaped attach pad 922*a*, interdigitated with a second W-shaped attach pad 922*b* such that up to 16 LEDs can be connected in parallel. As with the embodiment above, each of the LEDs can be mounted across the space between the first and second attach pads 922*a*, 922*b*. Using 3 volt devices, this package can utilize a 3 volt drive signal, with this signal being higher or lower as discussed above.

The embodiments above have been described with reference to certain embodiments arranged in different ways, but it is understood that different features described above can be utilized in different packages arranged in different ways. For example, the features above can be used in packages similar to those commercially available from Cree, Inc., including but not limited to the XLampCX, XLampM and XLampX family of LED packages.

The LED packages described above can be used in many different lighting applications or luminaries using a single LED package or multiple LED packages. In lighting applications using multiple conventional LED packages, a mixing chamber can be needed to mix the light from the LED packages, particularly in those embodiments utilizing LED packages emitting different colors of light that are then mixed to provide the desired color of light. In some of these conventional lighting applications, the minimum depth of the mixing chamber can be approximately the same as the distance between LED packages emitting the same color of light. The use of mixing chambers adds to both the cost and complexity of conventional luminaires.

Figure 98:
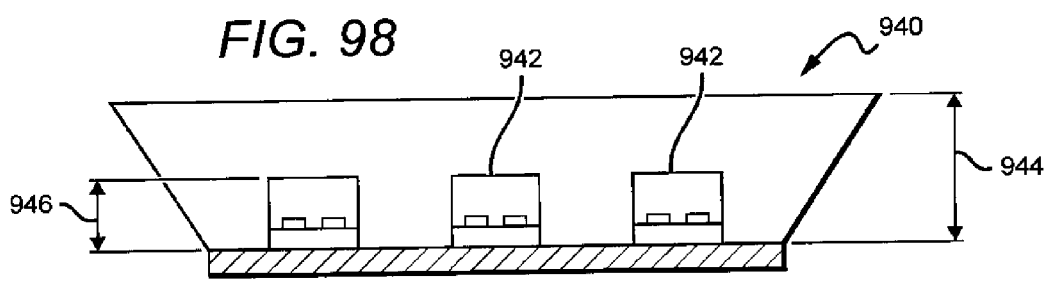
FIG. 98 is a sectional view of one embodiment of a mixing chamber according to the present invention.

In luminaires using LED packages according to the present invention, much of the mixing takes place within the LED packages. As a result, for some of these applications the mixing chamber can be eliminated, but in other embodiments, the mixing chamber may be included for aesthetic reasons and to assist in mixing the colors. In these arrangements, the depth of the mixing chamber can be greatly reduced. FIG. 98 shows one embodiment of a luminaire mixing chamber 940 having LED packages 942 arranged according to the present invention. The mixing chamber 940 can have a height 944 and the LED packages can have a height 946, and in some embodiments the mixing chamber height 944 can be less than four times the height of the LED packages 942. In other embodiments it can be less than three times the height of the LED packages. In other embodiments it can be less than 1.5 times the height of the LED packages. Providing luminaires without mixing chambers or with mixing chambers having a reduced depth can result in lower cost, less complex, thinner and/or smaller luminaires.

Figure 99:
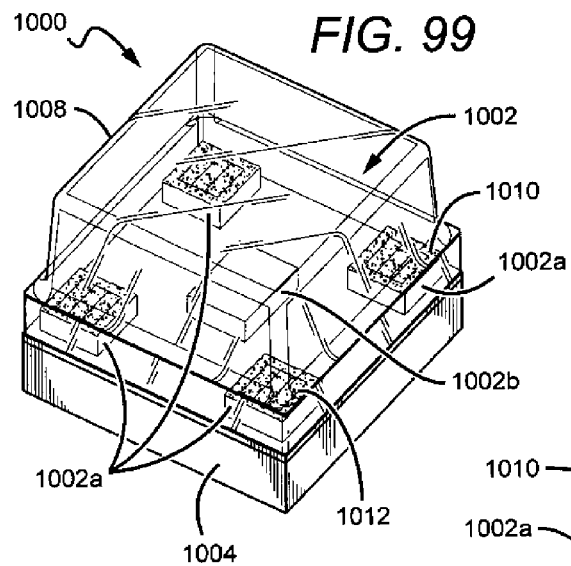
FIG. 99 is top perspective view of another embodiment of an LED package according to the present invention.
Figure 100:
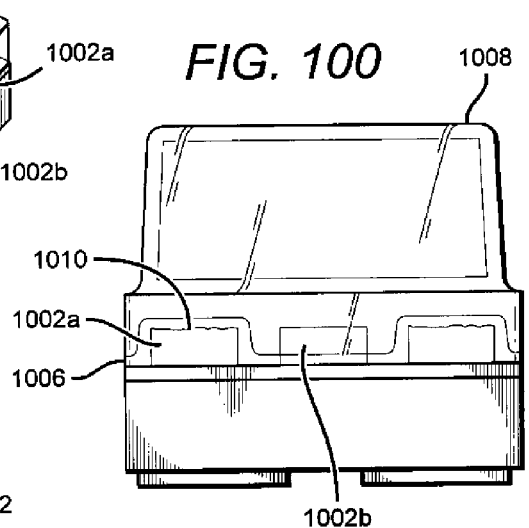
FIG. 100 is a side elevation view of the LED package shown in FIG. 99.

As discussed above, the LED packages according to the present invention can comprise one or more LEDs that can have many different shapes and sizes, and can have many different features. FIGS. 99 and 100 show another embodiment of an LED package 1000 according to the present invention comprising LEDs 1002, mounted on a submount 1004, with a conversion material layer 1006 and an encapsulant 1008. These elements are similar to corresponding elements described above and can comprise the same materials arranged as described above. In this embodiment, however, the LEDs 1002 can comprise first LEDs 1002*a* and a different type of second LEDs 1002*b*, and in some embodiments the first LEDs 1002*a* can emit blue light and the second LEDs 1002*b* can emit red light as described above. In this embodiment, however, the first LEDs 1002*a* have a textured top surface 1010 that can be arranged to enhance light extraction from the LEDs 1002*a*. Each of LEDs 1002*a* can also comprise a current spreading structure 1012 to spread current into the top surface of the LED. In some embodiments, wire bonds (not shown) can be included for conducting an electrical signal from the die attach pads or conductive traces on the submount, to the current spreading structure 1012.

Many different LEDs can be used for the first LEDs 1002*a*, with some embodiments utilizing commercially available LEDS such as those in the EZ family of LEDs from Cree, Inc., mentioned above. These LEDs 1002*a* provide a textured top surface that is generally parallel to the top surface of the encapsulant 1008, and side surfaces that are generally parallel to the side surface of the encapsulant 1008, although in other embodiments these surfaces can be oblique to their corresponding surfaces. It is understood that other surfaces of the LEDs 1002*a* can be textured and that for all surfaces different features can be included that enhance light extraction. The LEDs 1002*a* can be included in many different LED packages arranged in different ways.

Figure 101:
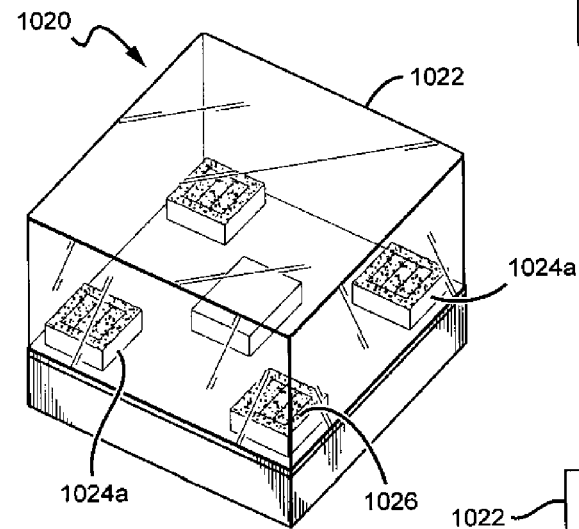
FIG. 101 is top perspective view of another embodiment of an LED package according to the present invention.
Figure 102:
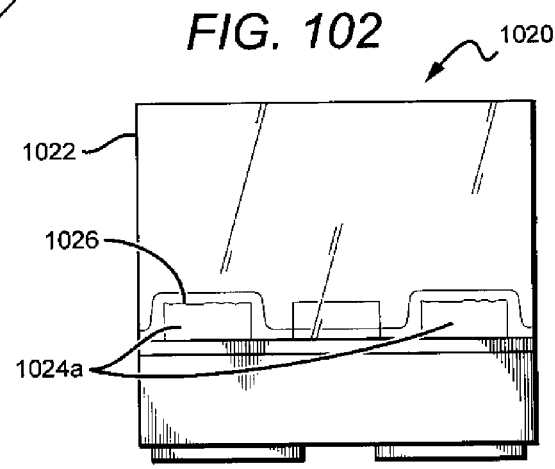
FIG. 102 is a side elevation view of the LED package shown in FIG. 101.

It is understood that the LED package 1000, as well as all other LED package embodiments described herein, can have many different elements arranged in different ways. FIGS. 101 and 102 show another embodiment of an LED package 1020 that is similar to the LED package 1000, but has an encapsulant 1022 with planar side surfaces. Each of the first LEDs 1024*a* has a textured top surface 1026 as well as top and side surfaces that are generally parallel to the top and side surfaces of the encapsulant 1022.

Figure 103:
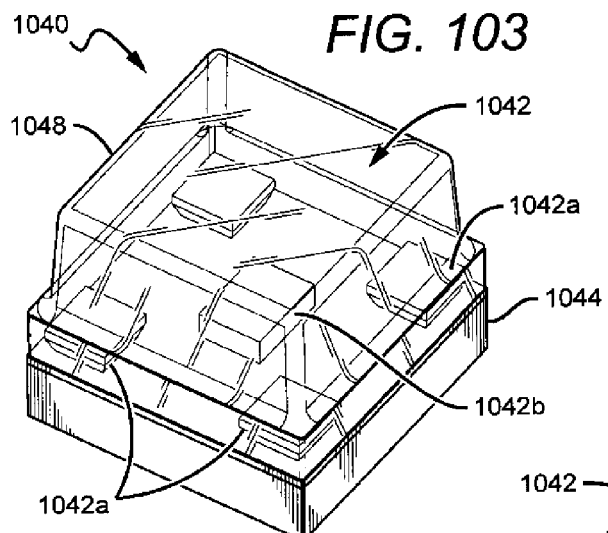
FIG. 103 is top perspective view of another embodiment of an LED package according to the present invention.
Figure 104:
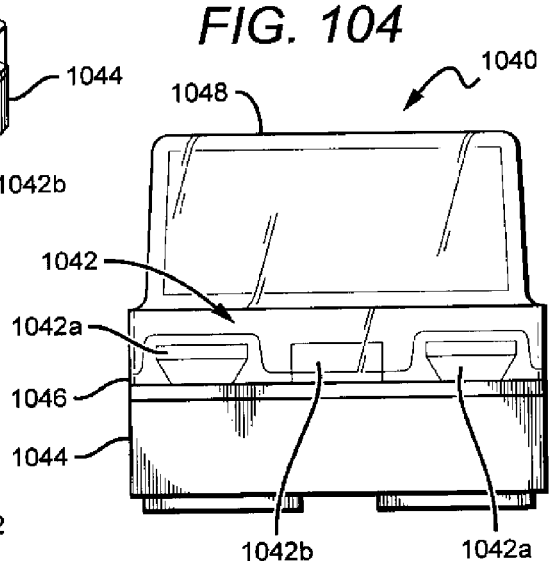
FIG. 104 is a side elevation view of the LED package shown in FIG. 103.
Figure 105:
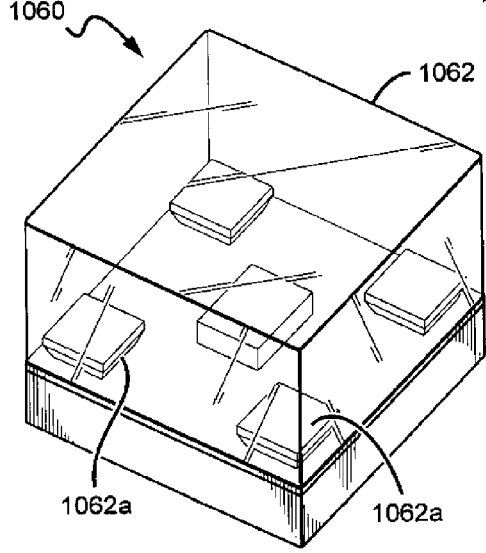
FIG. 105 is top perspective view of another embodiment of an LED package according to the present invention.
Figure 106:
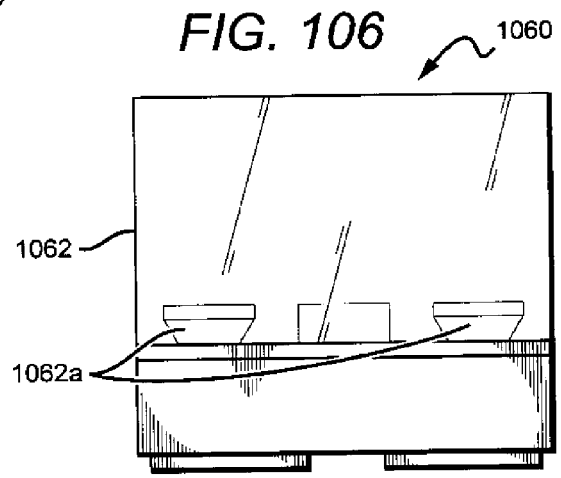
FIG. 106 is a side elevation view of the LED package shown in FIG. 105.

FIGS. 103 and 104 show another embodiment of an LED package 1040 according to the present invention comprising LEDs 1042 mounted on a submount 1044, with a conversion material layer 1046 and an encapsulant 1048. In this embodiment, the LEDs comprise first LEDs 1042a and second LEDs 1042b that can emit different colors of light. In this embodiment, the first LEDs 1042a have side surfaces that are at least partially angled such that the at least part of the side surfaces are oblique to the side surface of the encapsulant. In this embodiment the LED side surfaces are angled such that the lower portion of the LEDs 1042a is smaller than the upper portion. This results in the distance from the side surface of the encapsulant 1048 increasing moving down the side surface of the LEDs 1042a. Many different LEDs can be used for the LEDs 1042a, such as those commercially available from Cree, Inc., under its Ultra Thin family of LED chips. These LEDs 1042a can be used in many different LED packages shapes and arranged as described above. FIGS. 105 and 106 show an LED package 1060 that is similar to the LED package 1040, but has an encapsulant 1062 with planar surfaces. The LED package 1060 further comprises first LEDs 1062a each of which has angled side surfaces that are oblique to the side surfaces of the encapsulant 1062.

Figure 107:
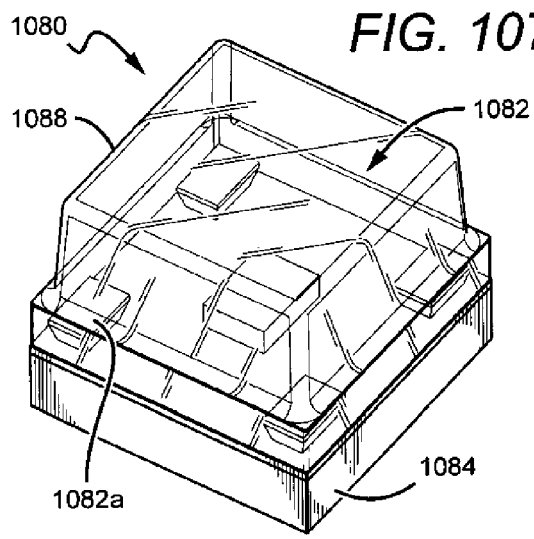
FIG. 107 is top perspective view of another embodiment of an LED package according to the present invention.
Figure 108:
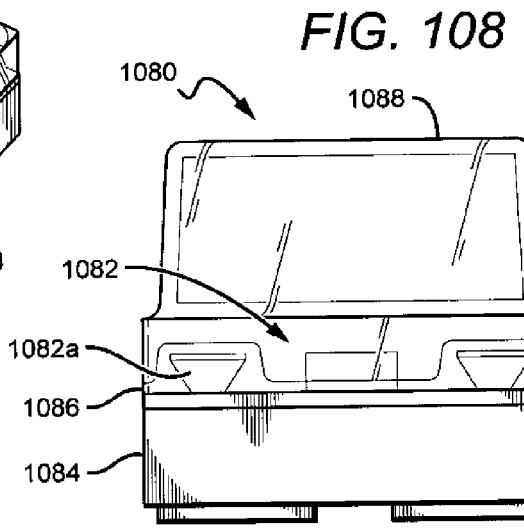
FIG. 108 is a side elevation view of the LED package shown in FIG. 107.
Figure 109:
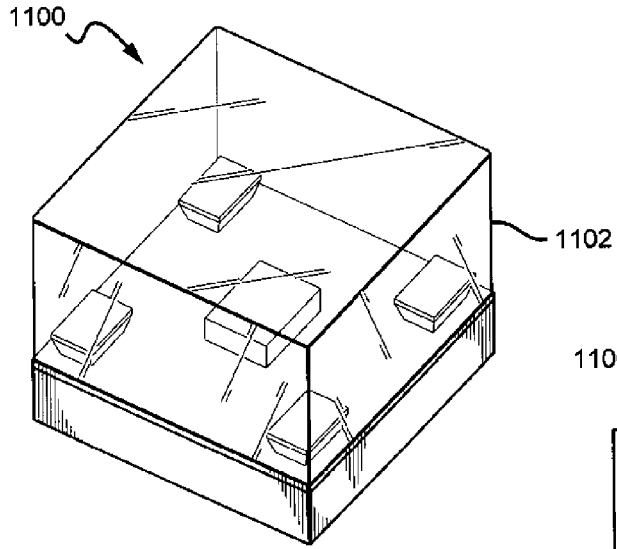
FIG. 109 is top perspective view of another embodiment of an LED package according to the present invention.
Figure 110:
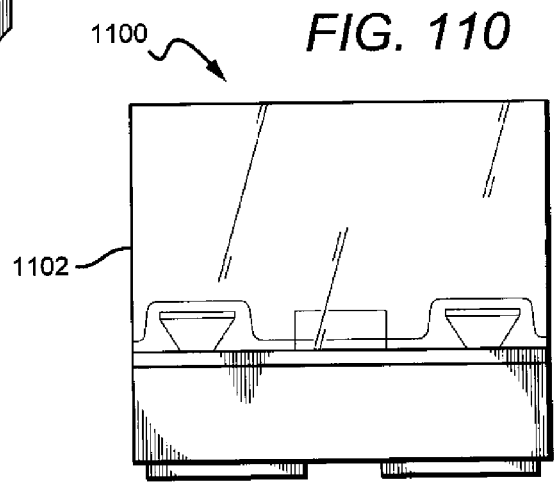
FIG. 110 is a side elevation view of the LED package shown in FIG. 109.

The LED packages 1000, 1020, 1040 and 1060 have been shown and described with LEDs having generally square footprints. It is understood that different LED packages can have LEDs with different footprint shapes. FIGS. 107 and 108 show another embodiment of an LED package 1080 according to the present invention comprising LEDs 1082, mounted on a submount 1084, with a conversion material layer 1086 and an encapsulant 1088. In this embodiment, the LEDs comprise first LEDs 1082a having angled side surfaces oblique to the side surfaces of the encapsulant 1088. Instead of a square footprint, the first LEDs 1082a have a rectangular footprint. Many different LEDs can be used with a rectangular footprint, such as those commercially available from Cree, Inc., under its TR family of LEDs mentioned above. These LEDs can also be used in different types of LED packages, with FIGS. 109 and 110 showing another embodiment of an LED package 1100 according to the present invention that is similar to the LED package 1080, but has an encapsulant 1102 with planar side surfaces.

Figure 111:
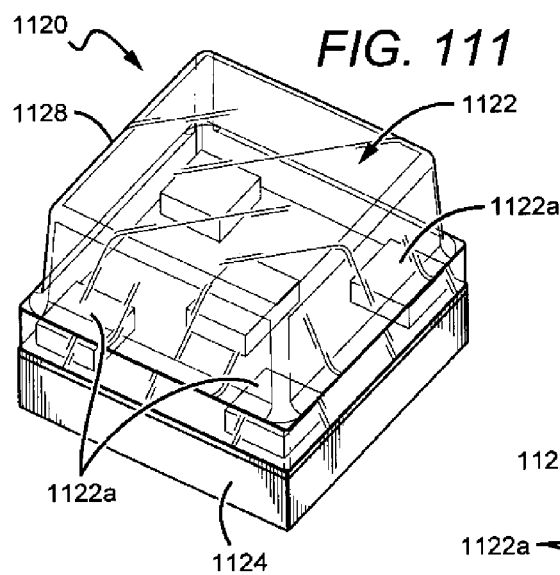
FIG. 111 is top perspective view of another embodiment of an LED package according to the present invention.
Figure 112:
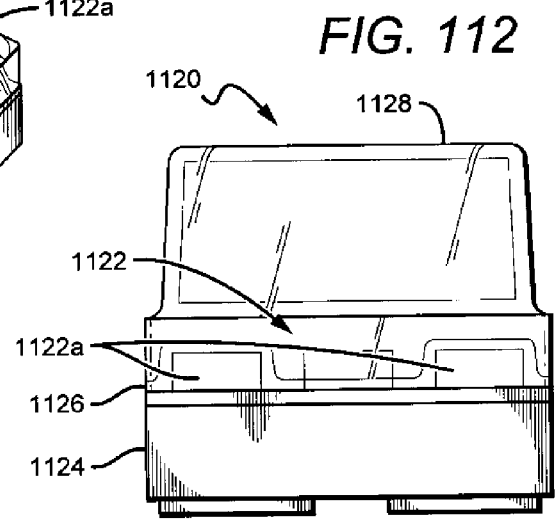
FIG. 112 is a side elevation view of the LED package shown in FIG. 111.
Figure 113:
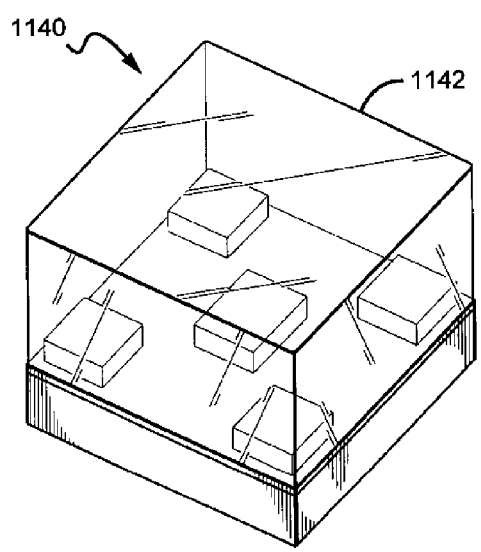
FIG. 113 is top perspective view of another embodiment of an LED package according to the present invention.
Figure 114:
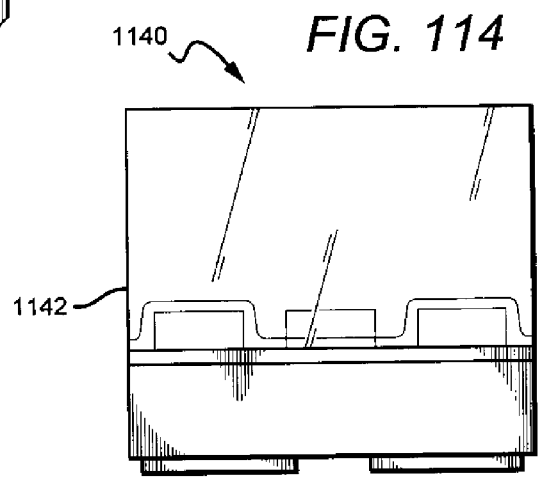
FIG. 114 is a side elevation view of the LED package shown in FIG. 113.

FIGS. 111 and 112 show another embodiment of an LED package 1120 according to the present invention also comprising LEDs 1122, mounted on a submount 1124, with a conversion material layer 1126 and an encapsulant 1128. In this embodiment, the first LEDs 1122a have a generally square footprint and side and top surfaces that are generally parallel to the side and top surface of the encapsulant 1128. Many different types of LEDs can be used with this footprint and shape, such as those having substrates made out of insulating materials such sapphire. The LEDs 1122a can also be comprise other features, such as wire bonds or light extraction features (not shown). These LEDs can also be used in different types of LED packages, with FIGS. 113 and 114 showing another embodiment of an LED package 1140 according to the present invention that is similar to the LED package 1120, but has an encapsulant 1142 with planar side surfaces. The side and top surfaces of the LEDs 1122 are generally parallel to the side and top surfaces of the encapsulant 1142.

Figure 115:
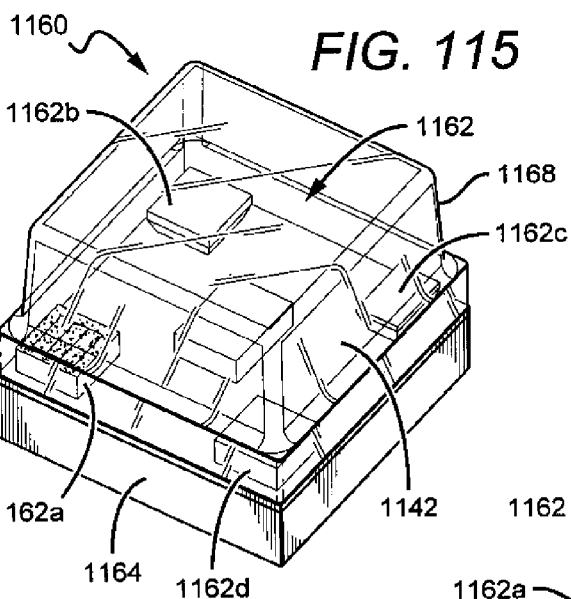
FIG. 115 is top perspective view of another embodiment of an LED package according to the present invention.
Figure 116:
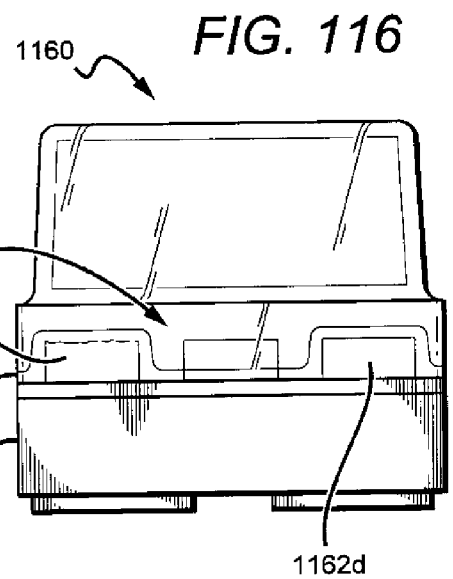
FIG. 116 is a side elevation view of the LED package shown in FIG. 115.
Figure 117:
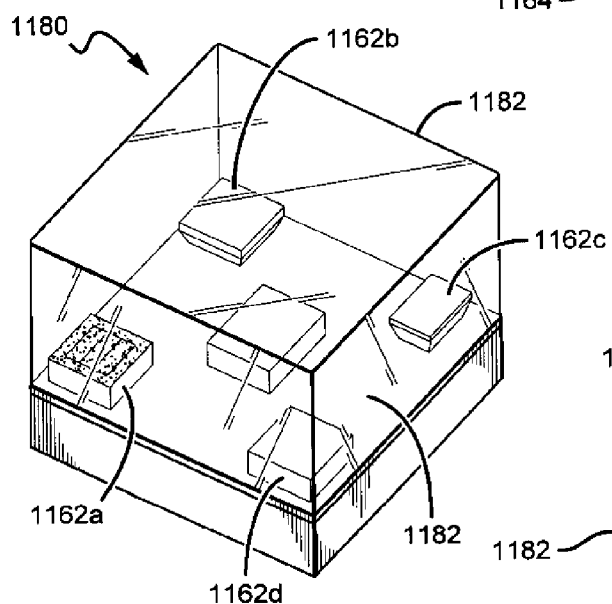
FIG. 117 is top perspective view of another embodiment of an LED package according to the present invention.
Figure 118:
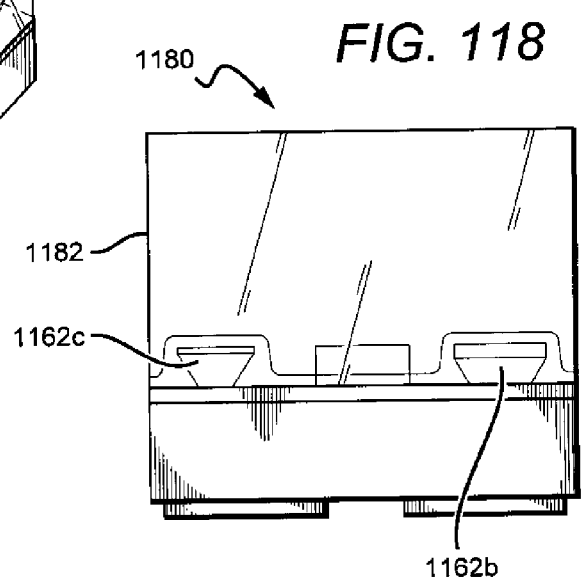
FIG. 118 is a side elevation view of the LED package shown in FIG. 117.
Figure 119:
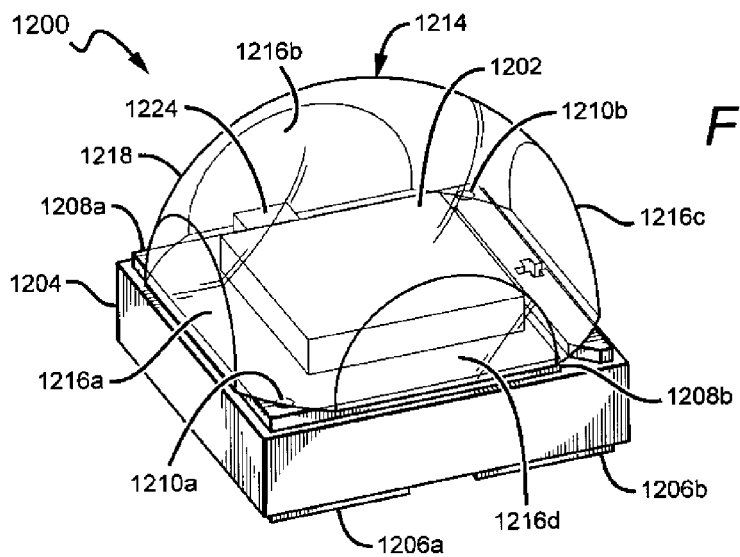
FIG. 119 is a top perspective view of another embodiment of an LED package according to the present invention.

It is understood that different LED package embodiments can have different combinations of the LEDs described above, with some having different combination of LEDs with parallel surfaces, oblique surfaces and/or textured surfaces. FIGS. 115 and 116 show one embodiment of and LED package 1160 according to the present invention having comprising LEDs 1162, mounted on a submount 1164, with a conversion material layer 1166 and an encapsulant 1168. In this embodiment the LEDs 1162 comprise a first LED 1162a having a textured top surface, a second LED 1162b having a square footprint with oblique side surfaces, a third LED 1162c with a rectangular footprint and oblique side surfaces, and a fourth LED 1162d with a square footprint and top and side surfaces generally parallel to those of the encapsulant 1168. Each of the LEDs 1162 can have many different features such as wire bonds, current spreading structures and light extraction features (not shown). This is only one of the many different combinations that can be used according to the present invention. These different combinations can also be used in any of the different types and shapes of LED packages described above. FIGS. 117 and 118 show an LED package 1180 having the same combination of first, second, third and fourth LEDs 1162a, 1162b, 1163c, 1162d, but with an encapsulant 1182 having planar surfaces as described above.

It is understood that the different LEDs described above are only a few of the many different LEDs that can be used in LED packages according to the present invention. It is also understood that LED packages according to the present invention can be provided with a single LED with the shapes and features described above.

As mentioned above, the LED packages according to the present invention can have encapsulants with many different shapes and sizes, and can have different numbers of planar surfaces arranged in different ways. In still other embodiments, the LED packages can be arranged with hybrid encapsulants having both planar and curved surfaces arranged in different ways to achieve the desired package emission profile, emission efficiency and variation in color temperature. In some embodiments, the use of a hybrid encapsulant can result in more narrow emission pattern that is desirable for some applications.

FIGS. 119 to 125 show another embodiment of an LED package 1200 according to the present invention having a generally square footprint. Similar to some of the embodiments above, the LED package 1200 can comprise an LED 1202 mounted on a submount 1204. The LED package 1200 also comprises first and second bottom contact/solder pads 1206a, 1206b on the bottom of the submount 1204. First and second die attach pads 1208a, 1208b can be included on the top surface of the submount 1204 and first and second conductive vias 1210a, 1210b are included that pass through the submount 1204 between the die attach pads 1208a, 1208b and the solder pads 1206a, 1206b. The LED 1202 and submount 1204 can comprise any of the devices and materials described above, and can be arranged in many different ways including those described above. In particular, the LED 1202 can have textured surfaces and/or oblique surfaces, and can comprise a sapphire substrate. The pads and vias can be made of the same materials, can be arranged in the same way, and can be fabricated in much the same way as those described above.

Some embodiments of the LED package can further comprises a conversion material layer 1212 (shown in FIGS. 122-125) covering the LED 1202, and in some embodiments the conversion material layer 1212 can also cover the exposed surfaces of the die attach pads 1208a, 1208b, and exposed portions of the top surface of the submount 1204. An encapsulant 1214 is included over the LED 1202, the attach pads 1208a, 1208b, and the submount 1204. The conversion material layer 1212 can comprise any of the materials described above and can be arranged in the different ways described above. The encapsulant 1214 can also comprise any of the materials described above.

In LED package 1200, the encapsulant 1214 does not comprise only planar surfaces, but comprises a combination of planar and curved surfaces. The embodiment shown comprises four side planar surfaces 1216a-d and one curved surface 1218, with the side planar surfaces being in alignment with the edges of the submount 1204 and the remainder of the outer surface of the encapsulant 1214 comprising the curved surface 1218.

As discussed above, encapsulants with planar surfaces can result in LED package emission profiles that are broader and can exceed 120° FWHM. These types of emission profiles are desirable for certain applications such as lighting fixtures with no secondary optics. In other applications different package emission profiles may be desirable, such as those needing improved far field mixing or those applications utilizing secondary optics. The encapsulants according to the present invention can comprise different curved and planar surfaces that can provide the desired package emission profile.

The encapsulants according to the present invention can have many different dimensions of planar and curved surfaces. LED package 1200 can have an encapsulant 1214 with a curved surface having a radius of curvature that is greater than half the distance along the edge of the submount 1204. Stated differently, the radius of curvature can be greater that either half the length or width of submount 1204. For submounts having a square footprint as shown in FIGS. 119 to 125, the radius of curvature can greater that both the length and width of the submount. With the encapsulant having this radius of curvature in relation to the submount dimensions and utilizing a full hemispheric encapsulant, a portion of the encapsulant would overhang the edge of the submount 1204. However, in the embodiments shown, the edge of the encapsulant 1214 is truncated at the edge of the submount 1204 to remove any overhanging portions and thereby form planar surfaces 1216a-d. In the embodiment shown, the planar surfaces 1216a-c are each generally vertical and each comprise curved edge formed from its intersection with the curved surface 1218. In some embodiments the planar surfaces can take a substantially semicircular shape, and in other embodiments the different planar surfaces can have different shapes and sizes. It is understood that in other embodiments, the encapsulant may not have truncated sections such that the encapsulant overhangs the edge of the submount.

This combination of planar and curved surfaces allows for the LED package 1200 to maintain its relatively small footprint, while also utilizing a encapsulant with a larger radius of curvature. In some embodiments, less light experiences TIR at the curved surface, thereby reducing the amount of light recycling compared to LED packages with cubic encapsulants. Some light may experience TIR at the planar surfaces, but there can be an overall reduction in TIR that can contribute to the LED package emitting more of a focused or narrow emission profile.

The LED package 1200 can have different ratios for the radius of curvature to the half submount length/width, with some embodiments having a ratio larger than 2. That is, the radius of curvature for the curved surfaces is approximately 2 times that of the submount half (length or width) distance. In other embodiments this ratio can be in the range of 1.5 to 2, while in still other embodiments this ratio can be in the range of 1.0 to 2.0. In one embodiment where the submount has a square footprint measuring 1.6 mm by 1.6 mm, the curved surface 1218 can have a radius of curvature in the range of 0.81 mm to 1.2 mm. In other embodiments, the radius of curvature can be 0.81 mm to 1.0 mm, while other embodiments can have a radius of curvature of approximate 0.93 mm. These are only some of the many ratios for the radius of curvature to half the submount length/width that can be used in embodiments according to the present invention. In addition, the same ratios of other features as described in the embodiments above are equally applicable to LED package 1200, including chip to submount area, submount area to chip height, submount to encapsulant height, etc. The LED package can also have a footprint of the same size as described in the embodiments above, with some embodiments being 1.6 mm square.

The overall LED package height can be approximately the same as, or slightly less than, the length of the side of the submount. In some embodiments having a 1.6 mm square submount, the LED package can have an overall height of approximately 1.5 mm. It is understood that in other embodiment the overall height of the LED package can be larger than the side length of the submount. In some embodiments, the lens height can 90% or less of the overall height of the LED package. In other embodiments it can be 70% or less of the overall height, and in others it can be less than 60% of the overall height. In some embodiments having a 1.6 mm square submount, the lens can be 60% or less of the overall LED package height.

Figure 126:
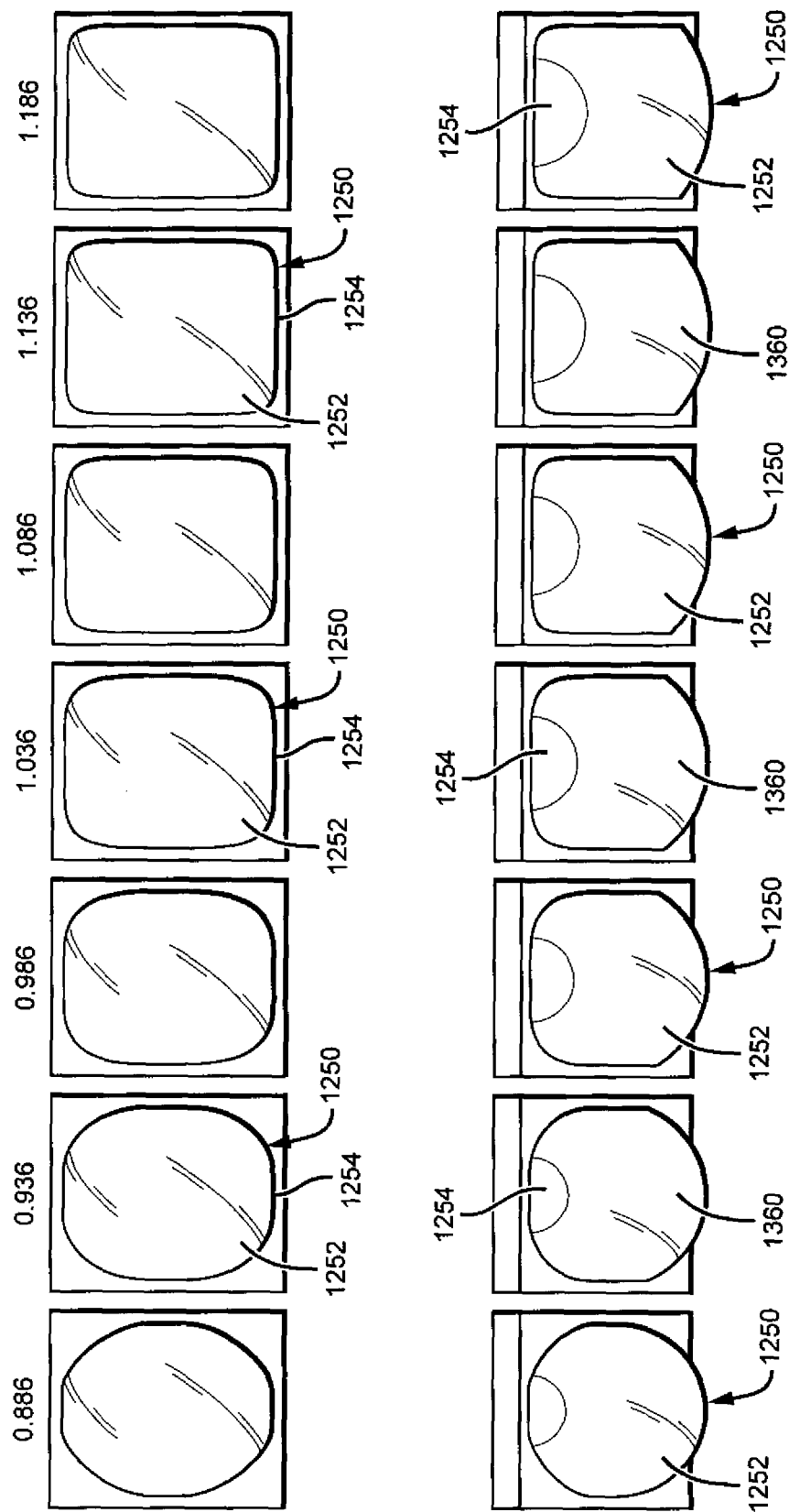
Figure 129:
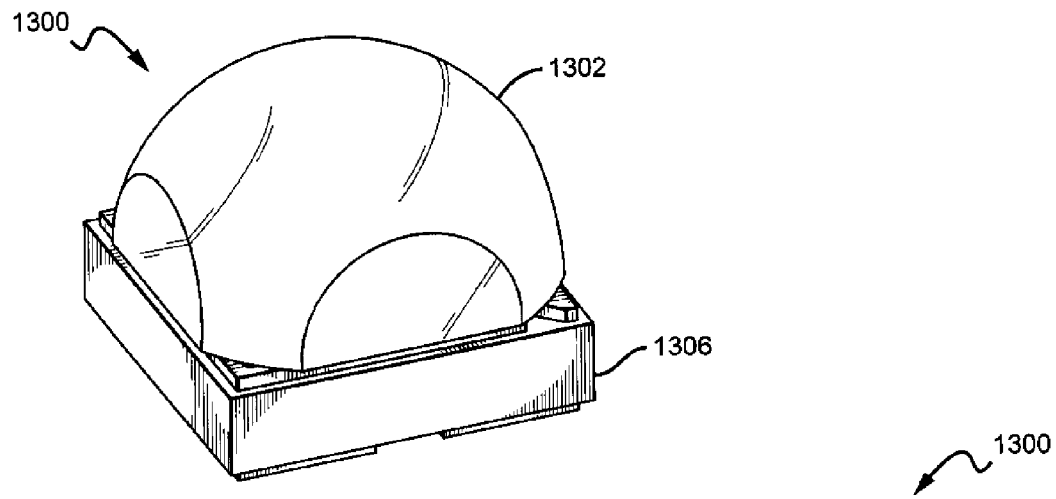
Figure 130:
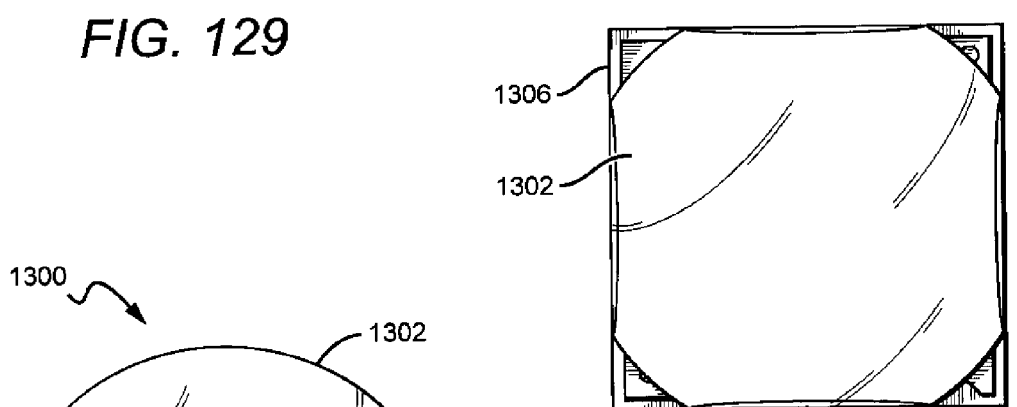
Figure 131:
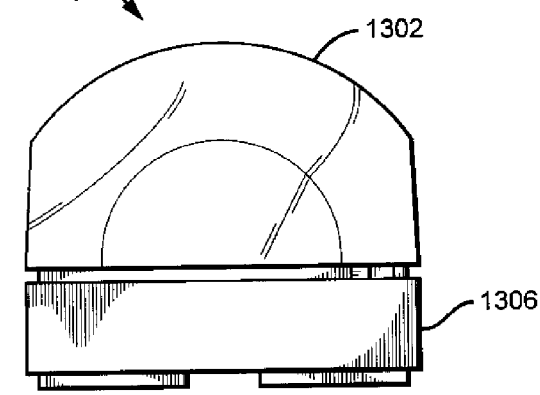
Figure 132:
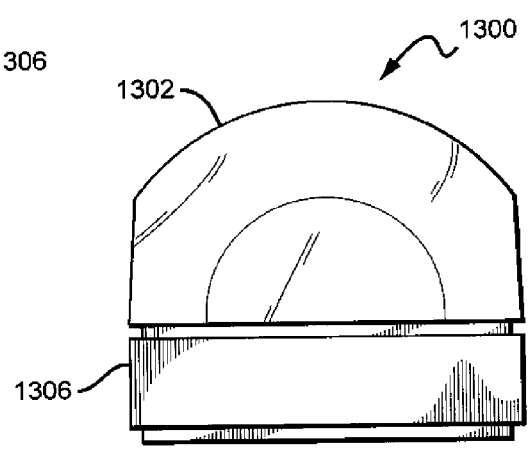

As the radius of curvature increases in the same sized devices with the same encapsulant height, the area of the planar surfaces can increase. FIG. 126 shows a series of different LED packages 1250 according to the present invention, each having an encapsulant 1252 with the same or similar height, and a different radius of curvature. As the radius of curvature increases, the area of each of the planar surfaces 1254 increases. For a package having an encapsulant with a 0.886 mm radius of curvature, the planar surfaces are relatively small. In comparison, at a radius of curvature with 1.186 mm the planar surfaces are relatively large such that the encapsulant approaches a shape having a lower cubic section and an upper curved section.

For packages similar to LED packages 1200 with encapsulant 1214, the combination of planar surfaces 1216a-c and curved surface 1218 can result in a more narrow package emission profile compared to packages with cubic encapsulants such as those described above. Some of these embodiments having a more narrow emission profile of less than 120° FWHM. Other embodiments can provide an emission profile of less than 115° FWHM, while others can provide an emission profile of less than 110° FWHM. Some embodiments provide an emission profile of approximately 110° FWHM. The encapsulant can also provide the desired variation in CCT over a range of viewing angles, with some embodiments providing an emission profile with variations in color temperature of less than −300 to +300 Kelvin at viewing angles of approximately −100 to +100 degrees. Other embodiments can provide an emission profile with variations in color temperature of less than −400 to +400 Kelvin at the same viewing angles. Other embodiments can provide an emission profile of less than −200 to +200 Kelvin and the same viewing angles of approximately, while some embodiments provide an emission profile with variations of approximately 200K at these different viewing angles.

Figure 127:
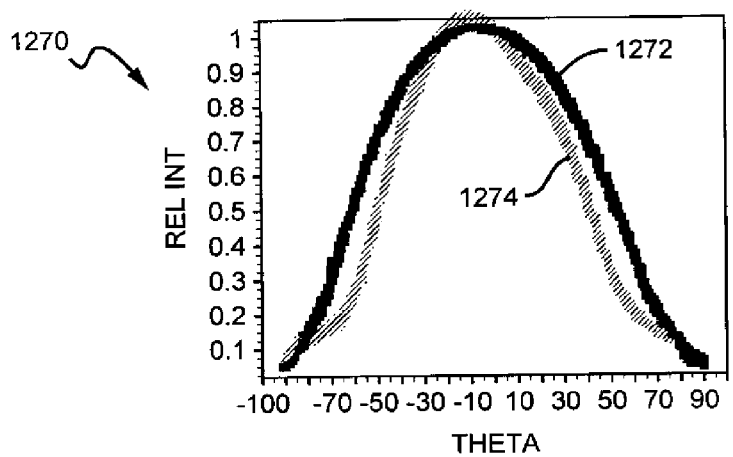
Figure 128:
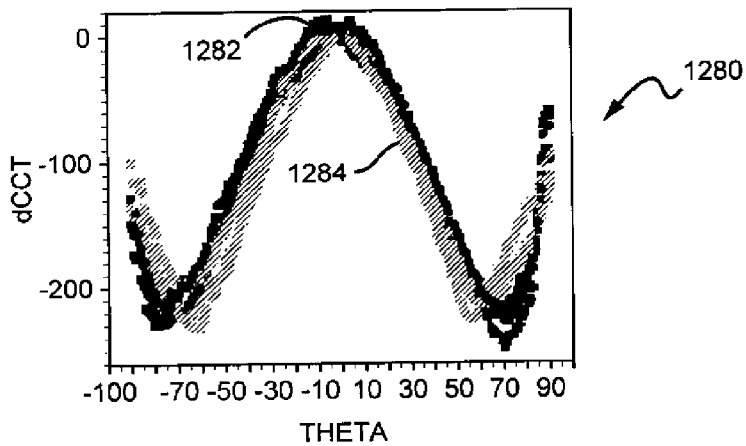

FIGS. 127 and 128 show the emission profiles two of the LED packages shown in FIG. 126. FIG. 127 is a graph 1270 that shows the emission intensity versus viewing angle plot 1272 for the package having an encapsulant with a 0.936 mm radius of curvature, and plot 1274 for a package having an encapsulant with a 1.186 mm radius of curvature. The viewing angle for the plot 1274 (here, FWHM less than) 100° is narrower than the plot 1272, showing that the more truncated dome can have a narrower emission profile. However, the emission efficiency of the package can decrease with encapsulants having larger radius of curvature. Accordingly, the type of encapsulant used can be determined based not only on the desired emission profile but also the desired package emission efficiency.

FIG. 128 is a graph 1280 having a plot 1282 that shows the color temperature variation at different viewing angles for the LED package having an encapsulant with a 0.93 mm radius of curvature, and a plot 1284 with the color temperature variation at different viewing angles for the LED package having an encapsulant with a 1.186 mm radius of curvature. The plots 1282, 1284 show that there are minimal differences in color temperature variations for the two packages, with both having a variations in color temperature of approximately 200 Kelvin. The packages represented in FIG. 128 both have a correlated color temperature of less than 4000K. Results may vary for devices having correlated color temperatures greater than 4000K.

Referring again to FIGS. 119-125, and in particular FIG. 121, the LED package 1200 can comprise one or more a polarity indicators, with the LED package 1200 having a notch polarity indicator 1220 in one of the solder pads 1206a, 1206b. Like the embodiments above, polarity indication 1220 can be the V-shaped and can be formed along the inner edge of the solder pad 1206a. This notch 1220 can be detected with up-looking cameras on automated pick-and-place equipment during manufacturing, and can be visible through carrier tape as described above. Like above, the polarity indicator 1220 can have many different shapes beyond V-shaped, such as U-shaped, I-shaped, W-shaped, square shaped, rectangular shaped, star shaped, plus shaped, minus shaped, etc. The notch can also be included in many different locations on the solder pads 1206a, 1206b, as further described above. In the embodiment shown, the polarity indicator identifies the cathode (−) of the LED package 1200, but in other embodiments it can signify the anode (+).

Figure 120:
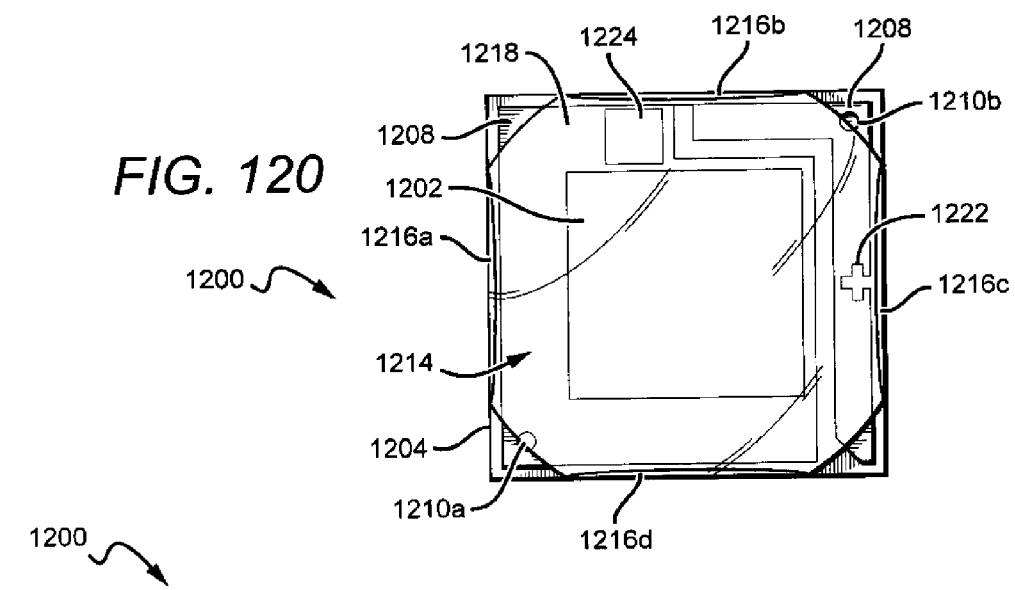
FIG. 120 is a top view of the LED package shown in FIG. 119.
Figure 121:
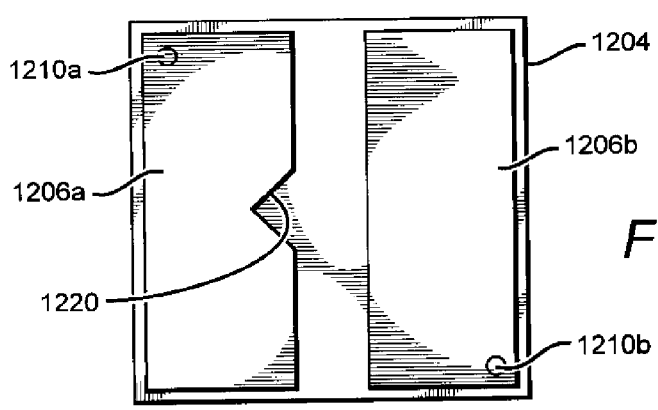
FIG. 121 is a bottom view of the LED package shown in FIG. 119.
Figure 125:
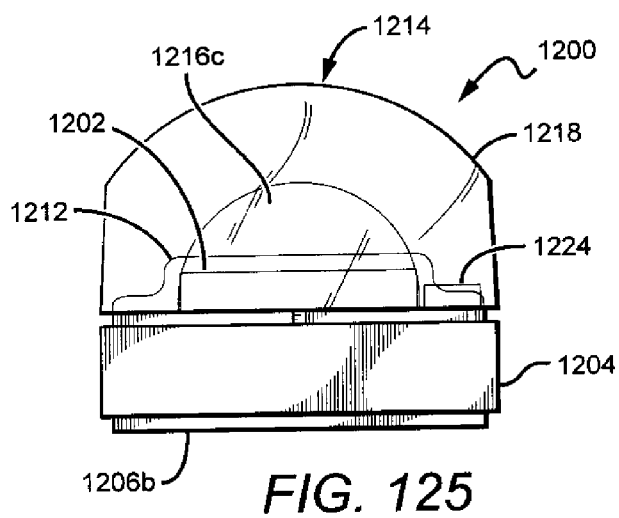
FIG. 125 is the opposite side elevation view of the LED package shown in FIG. 119.

Referring now to FIG. 120, the LED package 1200 can also comprise an upper polarity indicator 1222 similar to those described above. The second attach pad 1208b can have a plus (+) indicator to show polarity when viewing the LED package 50 from the top. These indicators can take many different shapes and sizes such as those described above, and in some embodiments can comprise notches or holes as described above. In the upper polarity indicator signifies the anode for the LED package 1200, but it is understood that in other embodiments it can comprise the cathode.

The LED package 1200 can also comprise a ESD protection chip 1224 arranged on the submount to protect the LED package from damage due to electrostatic discharge. The ESD chip 1224 can be arranged in many different locations, with the embodiment shown being arranged on the surface of the submount 1204, adjacent the LED 1202.

As mentioned above, the packages according to the present invention can have conversion or scattering materials that are fully or partially mixed in the encapsulant material. In some of these embodiments, the encapsulants can appear fully or partially opaque. As described above, the encapsulant can be included on the conversion material layer, and over the LEDs and submount. The conversion material layer is also described as comprising a conversion material in a binder, with the encapsulant provided over the conversion material layer. It is understood that in other embodiments, the conversion material can be included in the encapsulant, with some embodiments having a conversion material that occupies less than all of the encapsulant. Some embodiments can be provided with a conversion material that occupies less than 80% of the encapsulant, 50% of the encapsulant, or 25% of the encapsulant. In still other embodiments the conversion material can occupy less than 10% of the encapsulant.

Like the embodiments above, the conversion material can occupy encapsulant regions of different shapes and sizes and can be in different locations so that at least some light from the package LEDs passes through the conversion material. The conversion material layer can be arranged in many different ways and can have different shapes, thicknesses and concentrations and the conversion material can occupy different areas of the encapsulant. In some encapsulant embodiments the conversion material can be in a lower portion of the encapsulant and the upper portion of the encapsulant may not having a conversion material. In some embodiments, the conversion material can be in the lower three fourths of the encapsulant, the lower half of the encapsulant, or the lower one fourth of the encapsulant. In other embodiments it can be in lower tenth of the encapsulant. The encapsulant can also comprise different scattering materials or elements in or on the encapsulant to help scatter light as it through the encapsulant.

FIGS. 129-132 show another embodiment of an LED package 1300 according to the present invention that is similar to the LED package 1200 described above and shown in FIGS. 119-125. In this embodiment, however, the encapsulant 1302 is fully or partially opaque so that the LED (not shown) and the top surface of the submount 1306 under the encapsulant is not clearly visible. The encapsulant 1302 can be made fully or partially opaque by conversion material mixed fully or partially in the encapsulant 1302, or with a conversion material on the encapsulant 1302. In still other embodiments, the encapsulant 1302 can be made fully or partially opaque by scattering particles or elements mixed in or formed on the encapsulant 1302.

Like the embodiments above, the encapsulant can be formed in the LED packages using different methods, with some embodiments using different molding processes such as the compression molding processes using a mold with a plurality of cavities. A submount panel with LEDs as described above can be provided that can have an area approximately the same or less than as that covered by the cavities. The mold is loaded with an encapsulant material in liquid form filling the cavities, and the submount panel can be moved toward the cavity with the LEDs in contact with or embedded in the liquid encapsulant within one of the respective cavities. The liquid can then be cured using known curing processes and the panel can then be removed from the mold. The individual LED packages can then be separated or singulated from the submount panel, using known techniques.

Similar to some of the cube encapsulant embodiments described above, the embodiments having encapsulants with curved surfaces may also have a small encapsulant connection portion. FIGS. 133-139 show another embodiment of an LED package 1320 that is similar to LED package 1200 described above and comprises an LED 1322 mounted to a submount 1324 having first and second contact pads 1326a, 1326b, first and second die attach pads 1328a, 1328b, and vias 1330a, 1330b. The LED package can also have a conversion material layer 1332 and encapsulant 1334, polarity indicators 1336, 1338 and an ESD chip 1340. Like some of the cubic encapsulant embodiments described above, a small encapsulant connection section 1342 is included at the base of the encapsulant 1334. This is a byproduct of the molding process as described above. The cavities in the molding process may not extend to the top surface of the submount 1324 and the curved shape of the encapsulant may result in corner portions of the submount not covered by its corresponding cavity. This leaves the encapsulant section 1342 at the corners of the LED package between adjacent ones of the LED packages. The singulation process cuts through the connection section 1342 and the submount 1324 when separating the LED packages. The cavities of the molds can overlap so that during the singulation process the planar surfaces are formed in the encapsulants. In still other embodiments, that planar surfaces can be formed in a later truncation process where the overhanging section of the lens can be removed.

It is understood that other fabrication processes can be used with one such process comprising covering of a submount panel and its LEDs with a layer of encapsulant material. The encapsulant material can then be shaped using different methods to form the curved surface, such as cutting, grinding, sanding or etching. The individual LED packages can then be separated by different methods such as dicing or cutting through the encapsulant and submount. In still other embodiments, the encapsulants can be separately molded and then attached to the submount over phosphor conversion material layer. It is understood that the surfaces of the encapsulants can be smoothed or further shaped using different methods, such a cutting, grinding, sanding or etching.

Like the embodiments above, the LED packages with connection sections can also have conversion material or scattering particles fully or partially dispersed in its encapsulant. FIGS. 140-143 show another embodiment of an LED package 1350 according to the present invention having an encapsulant 1352 on a submount 1354. Like the embodiment above, the encapsulant comprises connection sections 1356 at its corners. In this embodiment, however, the encapsulant is fully or partially opaque from the conversion and/or scattering materials or elements partially of fully mixed in the encapsulant 1352.

The embodiments above are described with reference to LED packages with a single LED chip, and many different types of LED chips can be used such as those described above. It is also understood that the LED packages can comprise multiple LEDs as described above, that can be interconnected in different serial and parallel interconnect patters. The LED packages can have different types of LEDs in the same package to achieve the desired emission profile with some having different combinations of LEDs with parallel surfaces, oblique surfaces and/or textured surfaces. The LED chips can have surfaces that are fully or partially oblique to one or more of the encapsulant planar surfaces.

It is understood that different LED packages according to the present invention can be arranged in many different ways beyond those described above. The submounts in the embodiments described above have a square footprint, and the encapsulant extends to the edge of the submount. In other embodiments, the encapsulant may not extend to the edge of the submount, or may extend to only one or less than all of the edges. It is also understood that different submounts can have different polygon shaped foot prints with any number sides such as triangle, pentagon, hexagon, octagon, etc., and the submounts can have shapes with different length and width, such as a rectangle. In other embodiments, the submount can have one or more curved edges and can be circular or oval shaped, with the encapsulant having different shapes such as a bullet shape.

In the embodiments above, the planar surfaces are shown at and in alignment with the edges of the submount and orthogonal to the top surface of the submount, such that the planar surfaces are generally vertical. In other embodiments, the planar surfaces can be angled in different ways, and in other embodiments the planar surfaces can be arranged such that they are in from the edge of the submount. In still other embodiments, there can more or fewer planar surfaces than there are submount edges. Still in other embodiments, there can be more than one curved section, with different ones having different radius of curvature.

The encapsulants can also comprise features such as texturing. Referring again to FIG. 126, the LED packages have texturing features 1360 on the outside surface of the encapsulant 1252. This texturing can be formed in the encapsulant 1252 during the molding process with roughness from the cavity surface transferring to the encapsulant. This texturing may assist in light extraction from the LED package 1250, with some embodiments having texturing features that are less than 5 µm deep. Other embodiments can have features that are less than 2 µm deep, while others can have features that are approximately 1 µm deep.

The packages according to the present invention can serve as the light source for lamps such as those described in U.S. patent application Ser. No. 13/034,501, to Le et al., entitled "High Efficiency Solid State Lamp and Bulb", and U.S. patent application Ser. No. 13/028,946, to Le et al., entitled "Solid State Lamp and Bulb", both incorporated by reference as if set forth fully herein.

The LED packages can also be used in troffer type lamp fixtures such as those described in U.S. patent application Ser. No. 13/368,217 to Pickard et al., entitled "Multiple Panel Troffer-Style Fixture", and U.S. patent application Ser. No. 12/873,303 to Edmond et al., entitled "Troffer-Style Fixture", both incorporated by reference as if set forth fully herein.

The LED packages can also be used in many other lighting applications such as LED displays, LED street lighting, residential LED downlighting, etc. Some LED package embodiments of the present invention are particularly applicable to fluorescent tube replacement LED lighting with the emission pattern of the LED packages being desirable for linear arrays such as those used in fluorescent tube replacements.

The LED packages can be arranged with many different features beyond those described above. Some embodiments can comprise different electrostatic discharge (ESD) protection elements or devices. Others of the LED packages can be arranged with secondary optics to further disperse, spread or columnate the package beam profile. In still other embodiments, different ones of the LEDs within the package can be mounted higher than others of the LEDs to provide the desired LED package emission pattern.

Although the embodiments above are described herein with reference to LED packages with conversion material layers, it is understood that other embodiments can be provided without a conversion material layer. Some of these embodiments can comprise an encapsulant with one or more planar surfaces along with a blue, red or green LED chip by itself to provide LED packages emitting blue, red or green light. Other embodiments can also comprise multiple LED chips emitting different colors of light such as red, green or blue emitting LEDs, or red green, blue and white emitting LEDs. These are only some of the combinations that are possible in different embodiments according to the present invention. The LED packages can be arranged with many additional features, such as adaptors to allow for handling and mounting of these relatively small packages.

The LED packages can be arranged with many additional features, such as adaptors or connectors to allow for handing and mounting of these relatively small packages. The different LED package embodiments can comprise different markings or other features to assist in alignment, or the mounting area can have marks or features to assist in alignment and mounting of the LED packages.

Although the present invention has been described in detail with reference to certain preferred configurations thereof, other versions are possible. The invention can be used in any light fixtures where a uniform light or a near uniform light source is required. In other embodiments, the light intensity distribution of the LED module can be tailored to the particular fixture to produce the desired fixture emission pattern. Therefore, the spirit and scope of the invention should not be limited to the versions described above.

We claim:

1. An emitter package, comprising:
   one or more solid state light sources on a submount, said submount comprising a plurality of edges such that said submount comprises a length and width;
   an encapsulant over said solid state light sources and said submount, said encapsulant comprising a plurality of substantially planar side surfaces, one of said substantially planar side surfaces along each edge of said submount, and a convex curved surface between each pair of adjacent substantially planar side surfaces, said convex curved surface comprising a radius of curvature greater than half of said submount length and/or width.

2. The emitter package of claim 1, wherein each of said substantially planar side surfaces is aligned with an edge of said submount.

3. The emitter package of claim 1, wherein said substantially planar side surfaces are vertical.

4. The emitter package of claim 1, wherein said substantially planar side surfaces are orthogonal to the top surface of said submount.

5. The emitter package of claim 1, wherein said encapsulant comprises a conversion material occupying less than all of said encapsulant.

6. The emitter package of claim 5, wherein said conversion material occupies less than 80 percent of said encapsulant.

7. The emitter package of claim 5, wherein said conversion material occupies less than 50 percent of said encapsulant.

8. The emitter package of claim 5, wherein said conversion material occupies less than 25 percent of said encapsulant.

9. The emitter package of claim 1, wherein said conversion material occupies less than 10 percent of said encapsulant.

10. The emitter package of claim 1, wherein said conversion material is in a lower portion of said encapsulant.

11. The emitter package of claim 10, wherein said encapsulant comprises an upper portion without conversion material.

12. The emitter package of claim 10, wherein said conversion material is in the lower half of said encapsulant.

13. The emitter package of claim 10, wherein said conversion material is in the lower one fourth of said encapsulant.

14. The emitter package of claim 1, wherein said solid state light sources comprise one light emitting diode.

15. The emitter package of claim 1, wherein said solid state light sources comprise a plurality of light emitting diodes (LEDs), at least some of which are emitting different colors of light.

16. The emitter package of claim 15, wherein at least one of said LEDs has a geometry with entirely or partially oblique facets on one or more surfaces.

17. The emitter package of claim 15, wherein said light sources emit a white light combination of light.

18. The emitter package of claim 1, wherein said substantially planar side surfaces cause TIR of at least some light from said solid state light sources.

19. The emitter package of claim 1, comprising an emission pattern less than 120° full width at half maximum (FWHM).

20. The emitter package of claim 1, comprising a submount footprint area of less than 12 mm square.

21. The emitter package of claim 1, wherein said submount has a footprint ratio of approximately 1 by 1, with said package comprising a corresponding height ratio in the range of approximately 0.5 to 5.

22. An emitter package, comprising:
    one or more light emitting diodes (LEDs) on a submount;
    a conversion material layer over said LEDs; and
    an encapsulant on said LEDs and said conversion material layer, said encapsulant comprising one or more vertical planar side surfaces and a hemispheric upper surface, a convex curved surface between each pair of adjacent vertical planar side surfaces and over said LEDs, wherein said vertical planar side surfaces at least partially truncate said convex curved surface.

23. The emitter package of claim 22, wherein at least one of said vertical planar side surfaces has a curved edge.

24. The emitter package of claim 22, wherein at least one of said vertical planar surfaces has a semi-circular shape.

25. The emitter package of claim 22, further comprising a submount, said one or more LEDs and said encapsulant on said submount.

26. The emitter package of claim 25, wherein at least one of said vertical planar side surfaces is aligned with an edge of said submount.

27. The emitter package of claim 25, wherein said vertical planar side surfaces are orthogonal to the top surface of said submount.

28. The emitter package of claim 22, wherein at least one of said LEDs has a side surface that is at least partially oblique to at least one of said vertical planar side surfaces.

29. The emitter package of claim 22, wherein at least one of said LEDs comprises a textured surface.

30. The emitter package of claim 22, wherein at least one of said LEDs comprises a sapphire substrate.

31. The emitter package of claim 22, wherein said emission profile less than 120 degrees full width at half maximum (FWHM).

32. The emitter package of claim 22, comprising an emission profile has a color temperature that varies less than 300K over a range of viewing angles.

33. The emitter package of claim 22, emitting light with variations in color temperature of less than −300 to +300 Kelvin at viewing angles of approximately −100 to +100 degrees.

34. The emitter package of claim 22, emitting light with variations in color temperature of less than approximately −200 to +200 Kelvin at viewing angles of approximately −100 to +100 degrees.

35. The emitter package of claim 25, wherein said submount has a square footprint.

36. The emitter package of claim 35, wherein said submount has a footprint area of less than 12 mm square.

37. The emitter package of claim 35, wherein said submount has a footprint area in the range of 1 to 4 mm square.

38. An emitter package, comprising:
one or more LEDs on a submount, said submount comprising a plurality of edges;
an encapsulant on said submount, wherein said encapsulant comprises a plurality of substantially planar side surfaces, one of said substantially planar side surfaces along each edge of said submount and a convex curved surface between each pair of adjacent substantially planar side surfaces and between opposing substantially planar side surfaces and over said one or more LEDs, wherein said substantially planar side surfaces at least partially truncate said convex curved surface.

39. The emitter package of claim 38, wherein each of said substantially planar side surfaces are aligned with an edge of said submount.

40. The emitter package of claim 38, wherein at least one of said substantially planar side surfaces is vertical.

41. The emitter package of claim 38, wherein at least one of said substantially planar side surfaces is orthogonal to the top surface of said submount.

42. The emitter package of claim 38, wherein said convex curved surface comprises a radius of curvature greater than half of said submount length and/or width.

43. An encapsulant, comprising:
a body shaped to fit within a rectangular footprint, said body comprising a plurality of substantially planar side surfaces and a convex curved surface between each pair of adjacent substantially planar side surfaces and between opposing substantially planar side surfaces;
wherein said substantially planar side surfaces at least partially truncate said convex curved surface and wherein said convex curved surface comprises a continuous curved surface.

* * * * *